(12) United States Patent
Moslehi et al.

(10) Patent No.: US 8,637,340 B2
(45) Date of Patent: Jan. 28, 2014

(54) PATTERNING OF SILICON OXIDE LAYERS USING PULSED LASER ABLATION

(75) Inventors: Mehrdad M. Moslehi, Los Altos, CA (US); Virendra V. Rana, Los Gatos, CA (US); Pranav Anbalagan, San Jose, CA (US); Vivek Saraswat, Saratoga, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

(21) Appl. No.: 13/340,877

(22) Filed: Dec. 30, 2011

(65) Prior Publication Data
US 2012/0171804 A1    Jul. 5, 2012

Related U.S. Application Data

(63) Continuation-in-part of application No. 13/118,295, filed on May 27, 2011, now Pat. No. 8,399,331, and a continuation-in-part of application No. 13/271,212, filed on Oct. 11, 2011, and a continuation-in-part of application No. 11/868,488, filed on Oct. 6, 2007, now Pat. No. 8,129,822, and a continuation-in-part of application No. 11/868,492, filed on Oct. 6, 2007, now abandoned, and a continuation-in-part of application No. 12/774,713, filed on May 5, 2010, now Pat. No. 8,420,435, and a continuation-in-part of application No. 13/057,104, filed on Aug. 13, 2012, and a continuation-in-part of application No. 13/303,488, filed on Nov. 23, 2011.

(60) Provisional application No. 61/417,181, filed on Nov. 24, 2010, provisional application No. 61/428,600, filed on Dec. 30, 2010, provisional application No. 61/428,953, filed on Dec. 31, 2010, provisional application No. 61/428,957, filed on Dec. 31, 2010.

(51) Int. Cl.
*H01L 21/00* (2006.01)
*H01L 31/00* (2006.01)

(52) U.S. Cl.
USPC ............................................. 438/57; 136/252

(58) Field of Classification Search
CPC ..... Y02E 10/50; Y02E 10/52; H01L 27/1423; H01L 21/268; H01L 27/14693; B23L 26/367; B23K 26/409; B23K 26/073
USPC ..................... 438/57, 71, 496, 758, 778, 940; 136/243, 252, 258
See application file for complete search history.

(56) References Cited

U.S. PATENT DOCUMENTS

| 4,533,428 A | 8/1985 | Grabmaier et al. |
| 5,348,589 A | 9/1994 | Aria et al. |

(Continued)

FOREIGN PATENT DOCUMENTS

| KR | 10-2009-0025998 | 3/2009 |
| KR | 10-2010-0085736 | 7/2010 |

(Continued)

*Primary Examiner* — Nikolay Yushin

(57) ABSTRACT

Various laser processing schemes are disclosed for producing various types of hetero-junction and homo-junction solar cells. The methods include base and emitter contact opening, selective doping, metal ablation, annealing to improve passivation, and selective emitter doping via laser heating of aluminum. Also, laser processing schemes are disclosed that are suitable for selective amorphous silicon ablation and selective doping for hetero-junction solar cells. Laser ablation techniques are disclosed that leave the underlying silicon substantially undamaged. These laser processing techniques may be applied to semiconductor substrates, including crystalline silicon substrates, and further including crystalline silicon substrates which are manufactured either through wire saw wafering methods or via epitaxial deposition processes, or other cleavage techniques such as ion implantation and heating, that are either planar or textured/three-dimensional. These techniques are highly suited to thin crystalline semiconductor, including thin crystalline silicon films.

23 Claims, 55 Drawing Sheets

(56) References Cited

U.S. PATENT DOCUMENTS

| | | |
|---|---|---|
| 5,538,564 A | 7/1996 | Kaschmitter |
| 5,903,047 A | 5/1999 | Liao et al. |
| 5,989,977 A * | 11/1999 | Wu .............................. 438/431 |
| 6,429,037 B1 | 8/2002 | Wenham et al. |
| 6,645,833 B2 | 11/2003 | Brendel |
| 7,057,256 B2 | 6/2006 | Carey et al. |
| 7,857,907 B2 | 12/2010 | Cho et al. |
| 8,012,531 B2 | 9/2011 | Kim et al. |
| 8,035,027 B2 | 10/2011 | Moslehi |
| 8,088,675 B2 | 1/2012 | Rana et al. |
| 8,129,822 B2 | 3/2012 | Moslehi |
| 8,168,465 B2 | 5/2012 | Wang et al. |
| 8,288,195 B2 | 10/2012 | Wang et al. |
| 8,294,026 B2 | 10/2012 | Wang et al. |
| 8,399,331 B2 | 3/2013 | Moslehi et al. |
| 8,409,976 B2 | 4/2013 | Hieslmair |
| 2003/0017712 A1 | 1/2003 | Brendel |
| 2004/0042080 A1 | 3/2004 | Caudle et al. |
| 2004/0080050 A1 | 4/2004 | McMillin et al. |
| 2006/0009008 A1 * | 1/2006 | Kaneuchi et al. ............. 438/463 |
| 2006/0021702 A1 | 2/2006 | Kumar et al. |
| 2007/0026547 A1 | 2/2007 | Kumar et al. |
| 2007/0137692 A1 | 6/2007 | Carlson |
| 2007/0256728 A1 * | 11/2007 | Cousins ....................... 136/252 |
| 2009/0139568 A1 | 6/2009 | Weidman et al. |
| 2010/0147383 A1 | 6/2010 | Carey et al. |
| 2010/0224229 A1 | 9/2010 | Pralle et al. |
| 2010/0243040 A1 | 9/2010 | Kim et al. |
| 2011/0180128 A1 | 7/2011 | Hwang et al. |
| 2012/0122272 A1 | 5/2012 | Rana et al. |
| 2013/0164883 A1 | 6/2013 | Moslehi et al. |

FOREIGN PATENT DOCUMENTS

| | | |
|---|---|---|
| KR | 10-2010-0128132 | 12/2010 |
| WO | WO 2010-091466 | 10/2010 |
| WO | WO 2011-072153 | 11/2011 |

* cited by examiner

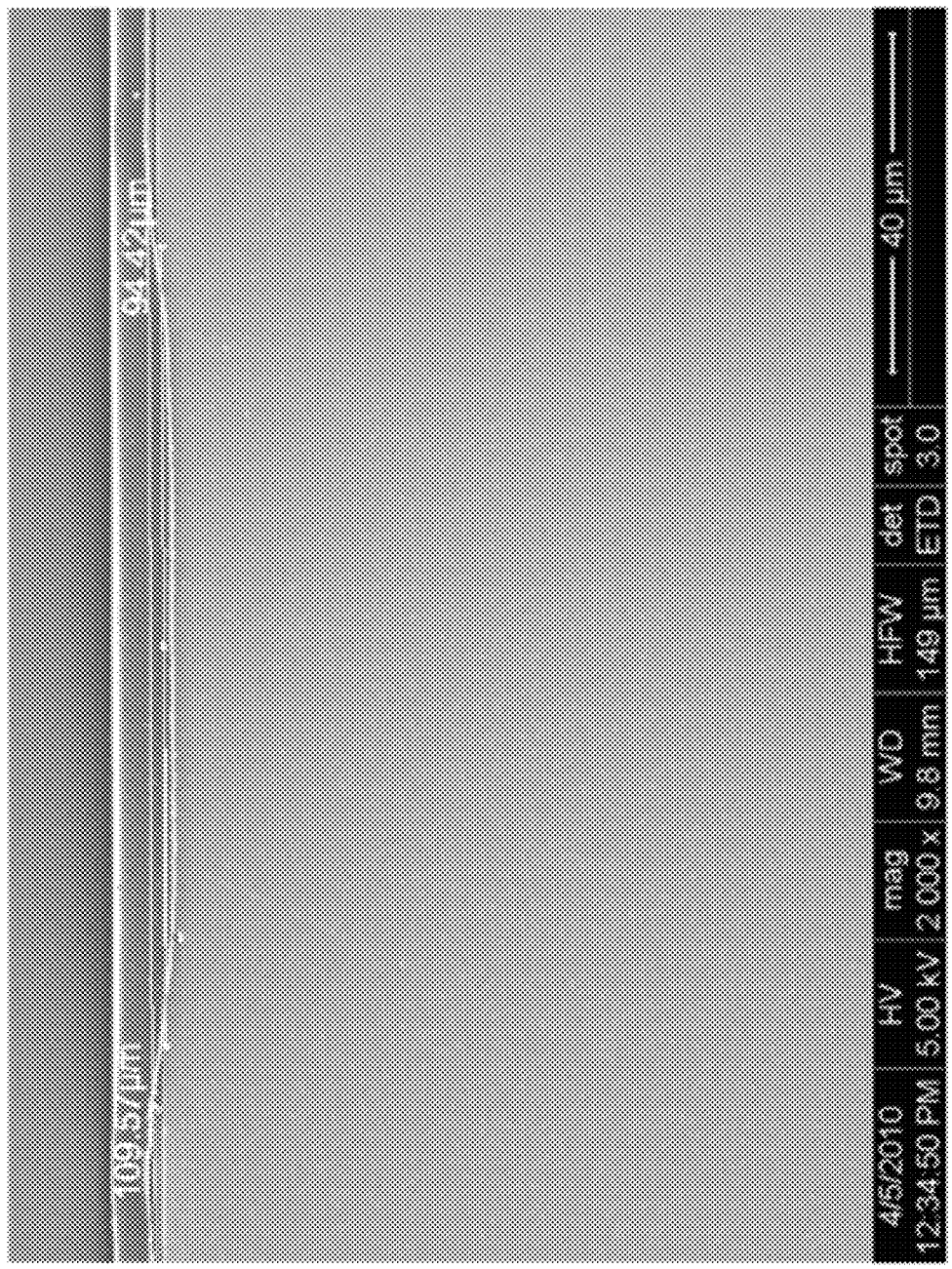
Fig. 1 (photo)

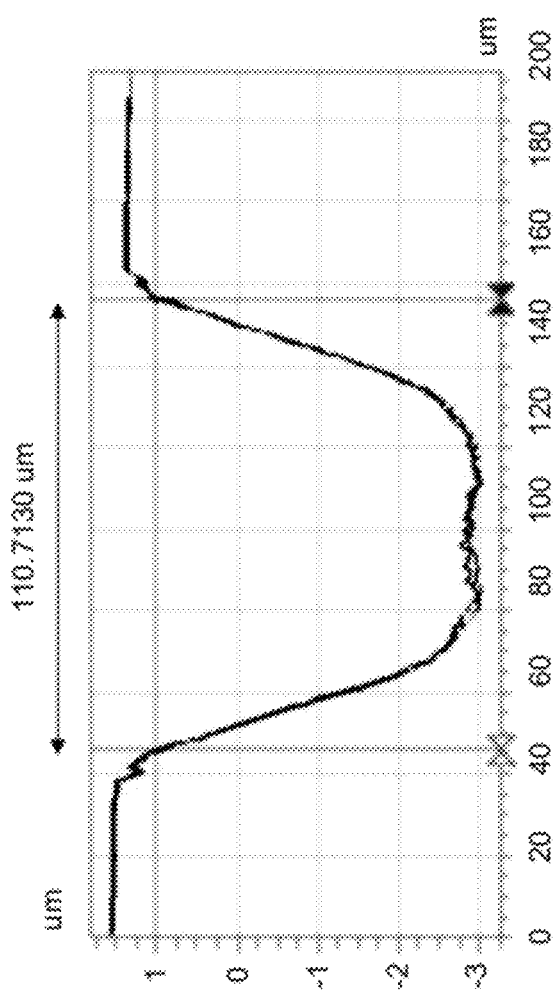
Fig. 2 (screenshot)

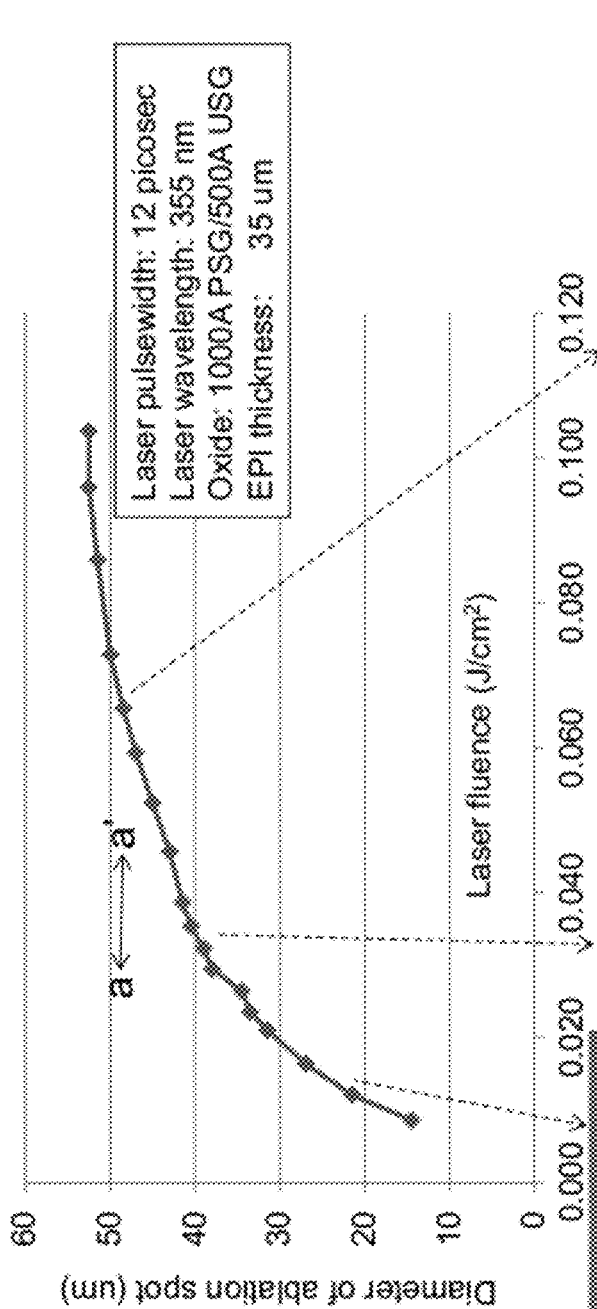
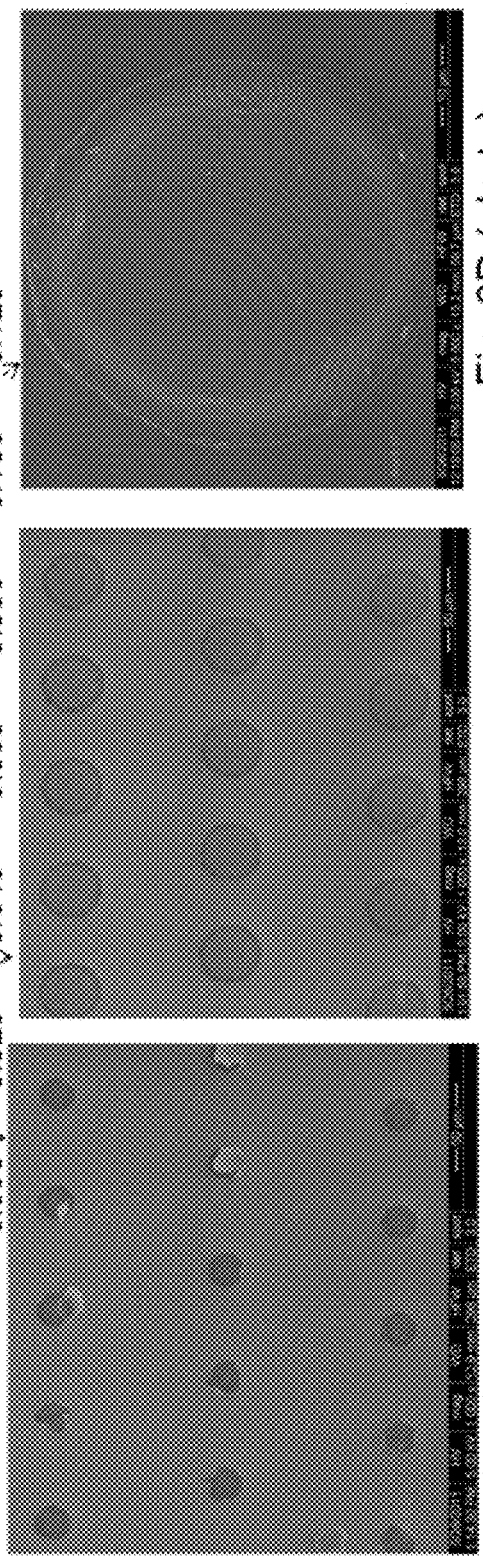
Fig. 3A
Fig. 3B (photo)
Fig. 3C (photo)
Fig. 3D (photo)

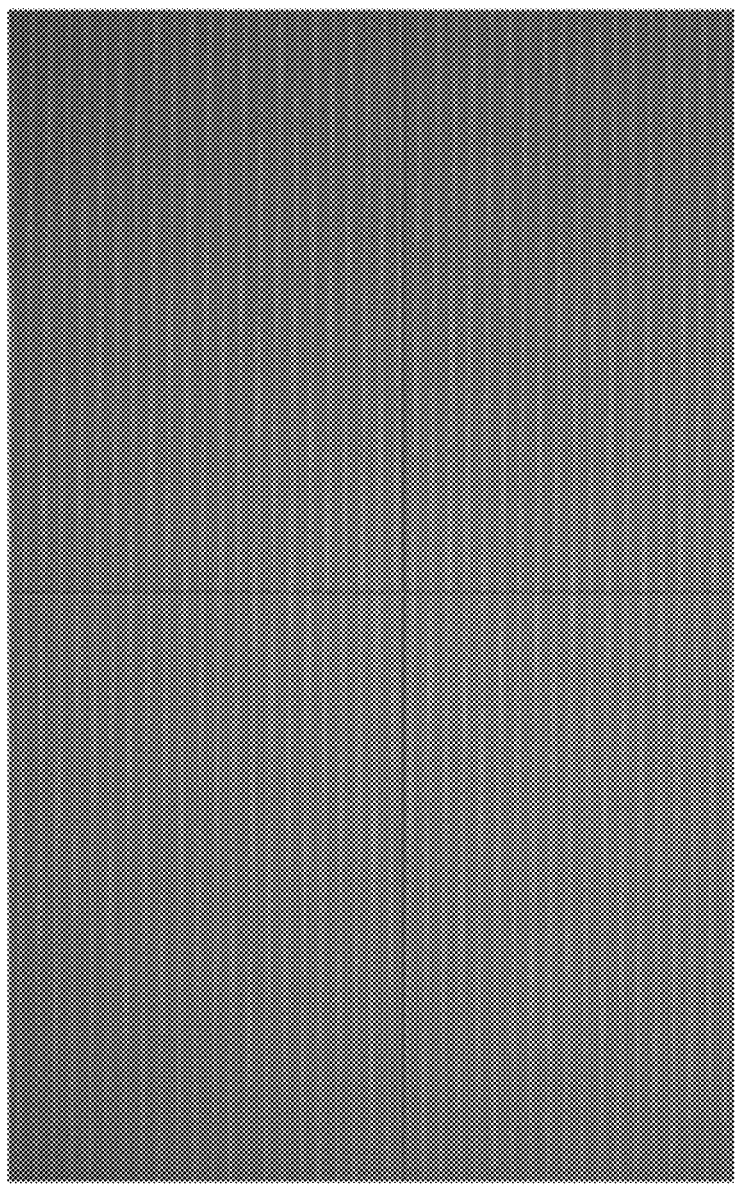
Fig. 4 (photo)

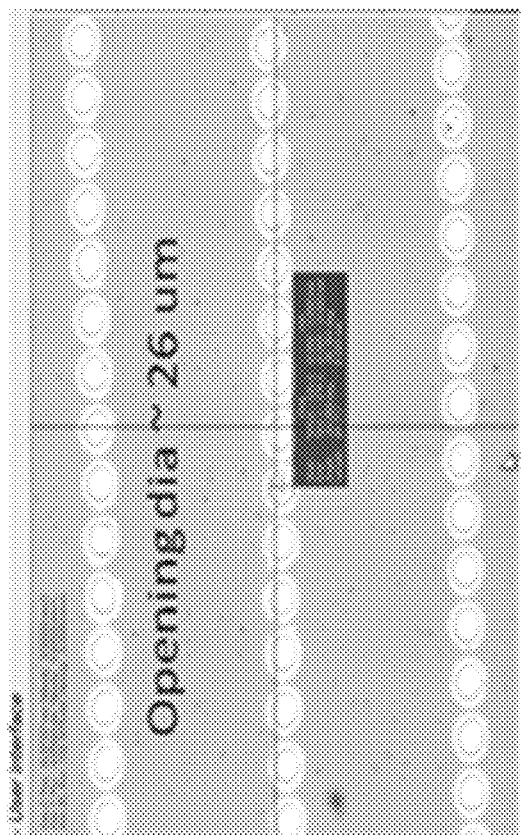
Fig. 5 (screenshot)

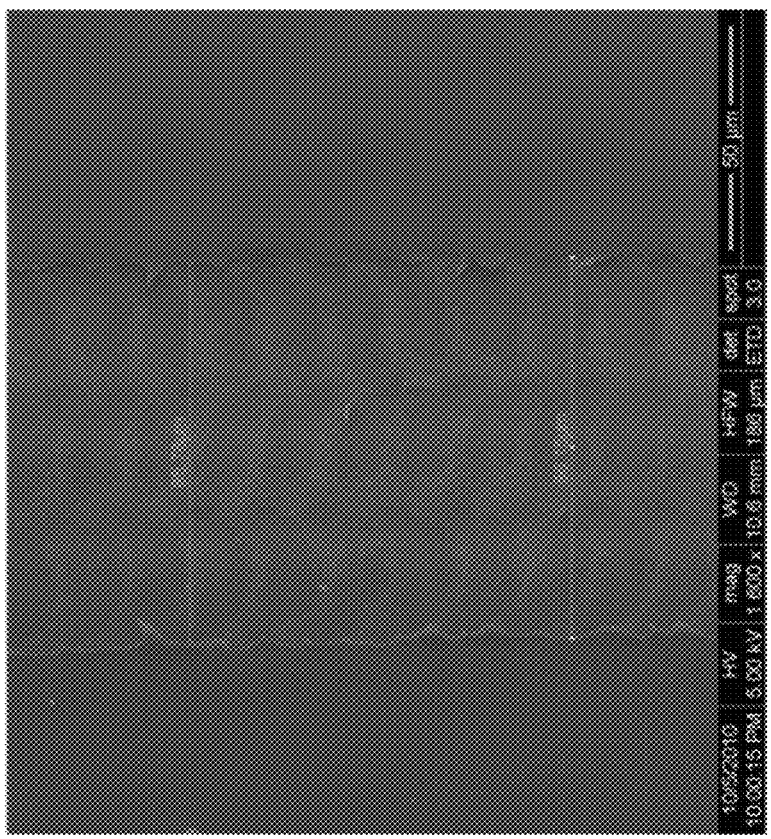
P-Window Ablation
Fig. 6B (photo)
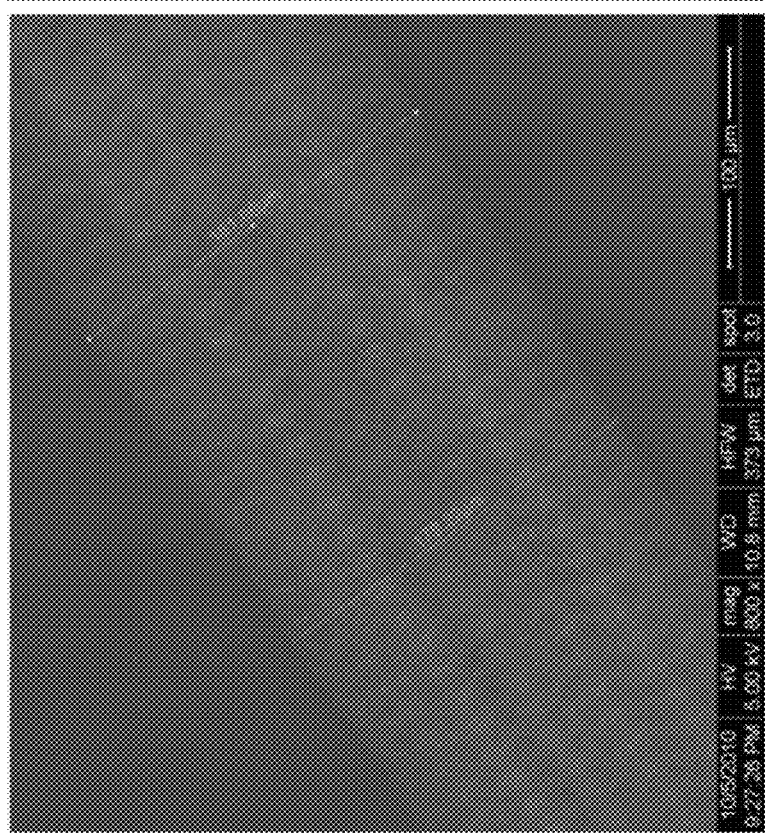
BSG Ablation
Fig. 6A (photo)

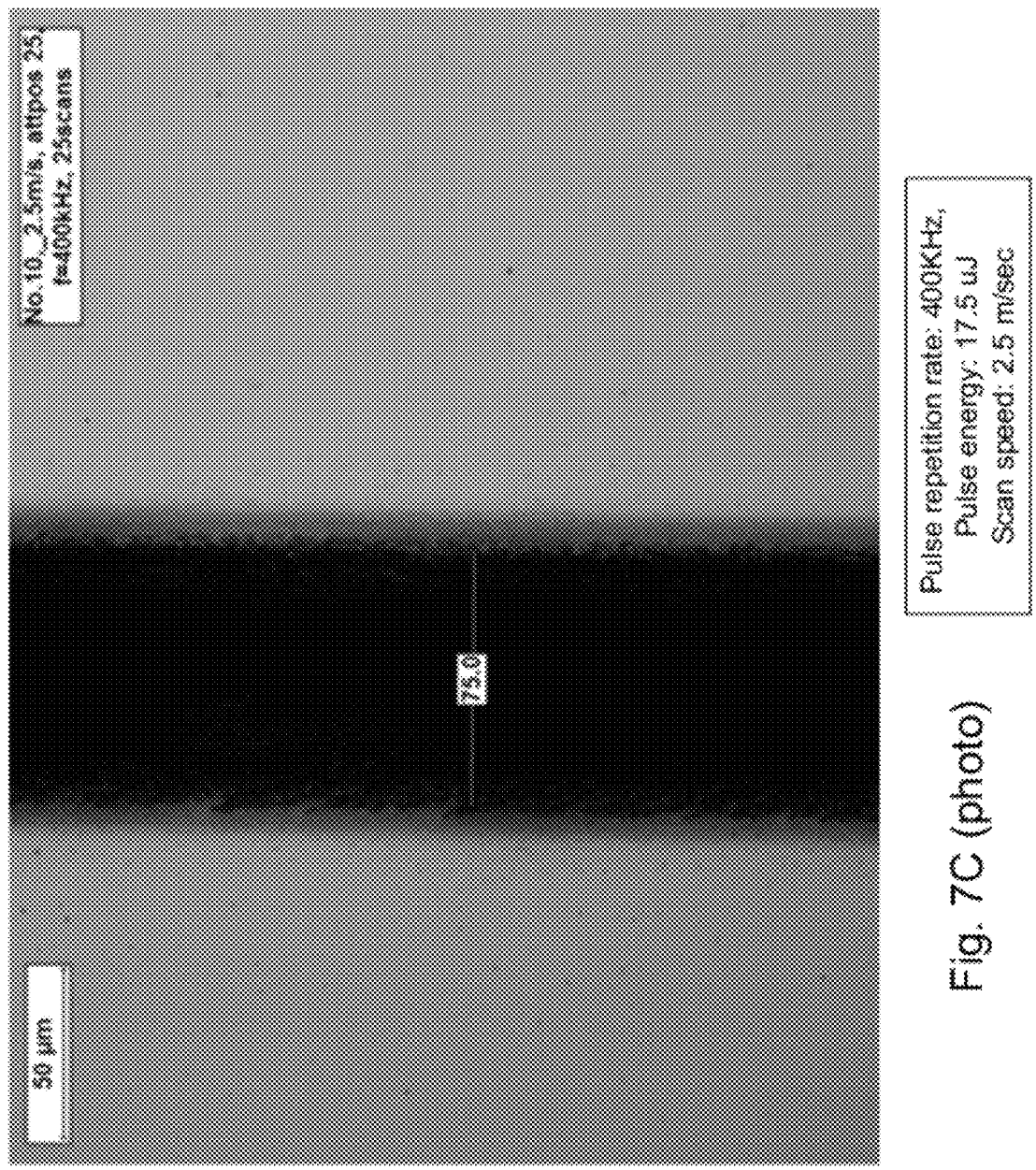
Fig. 7C (photo)

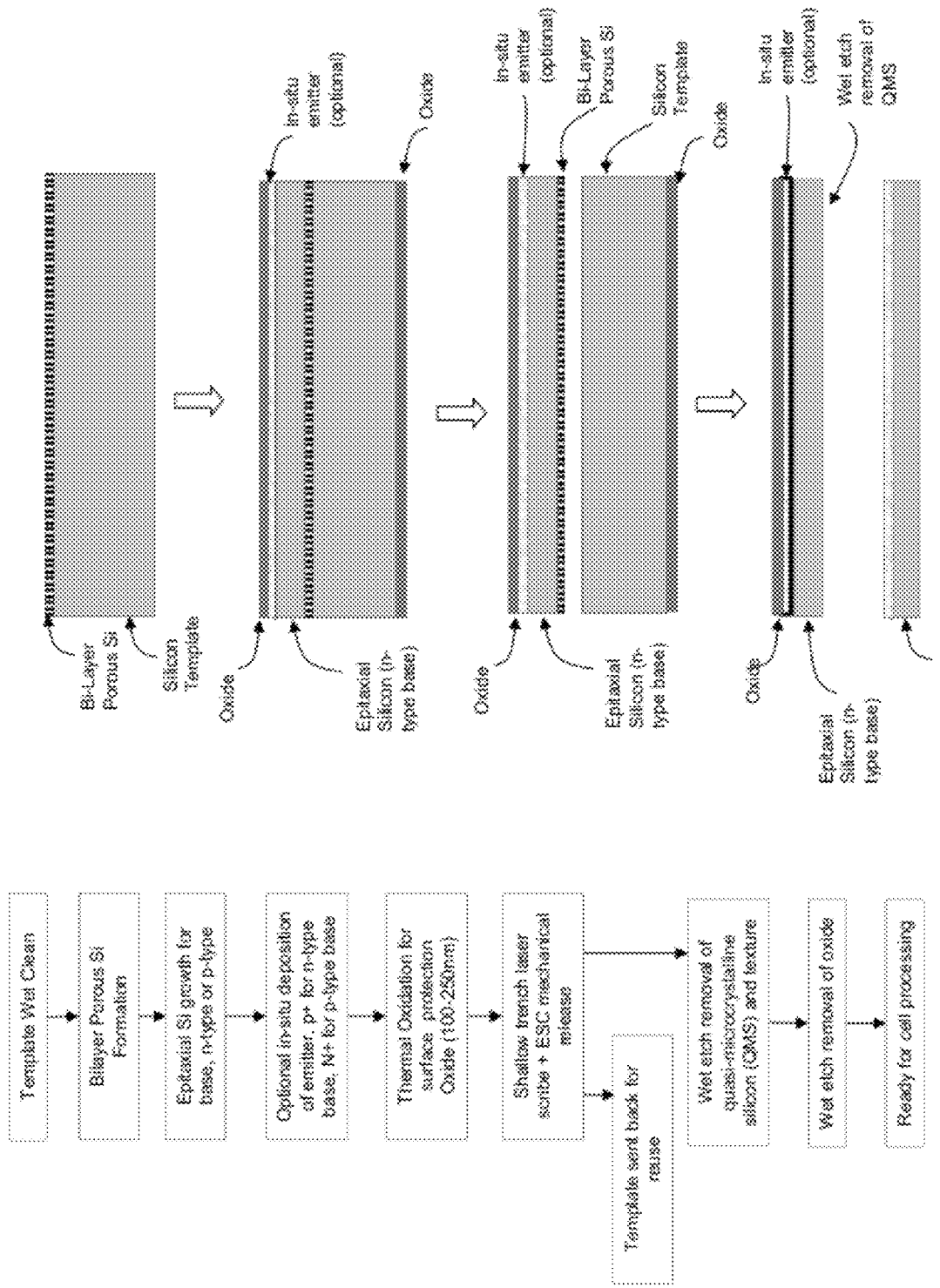

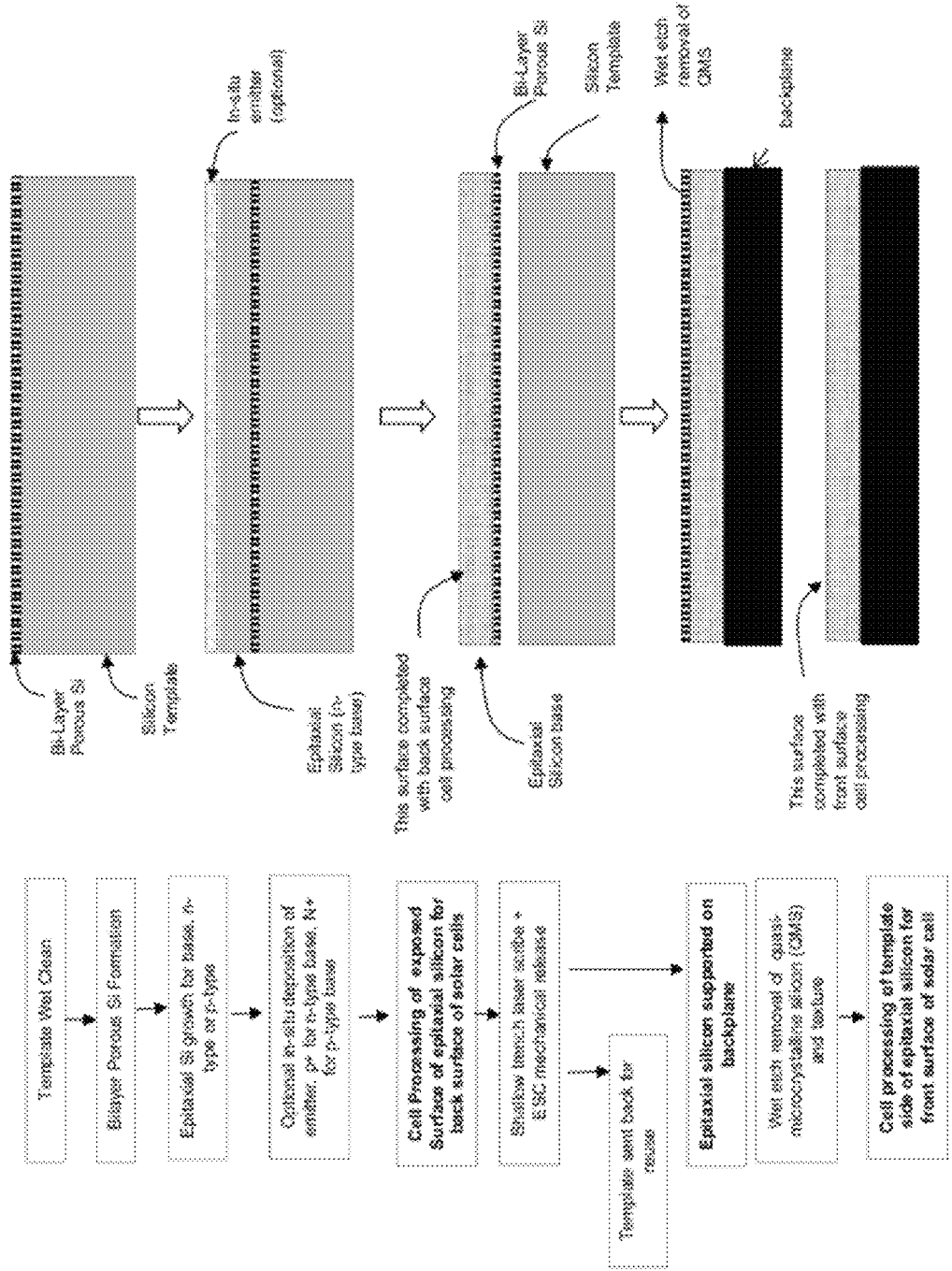

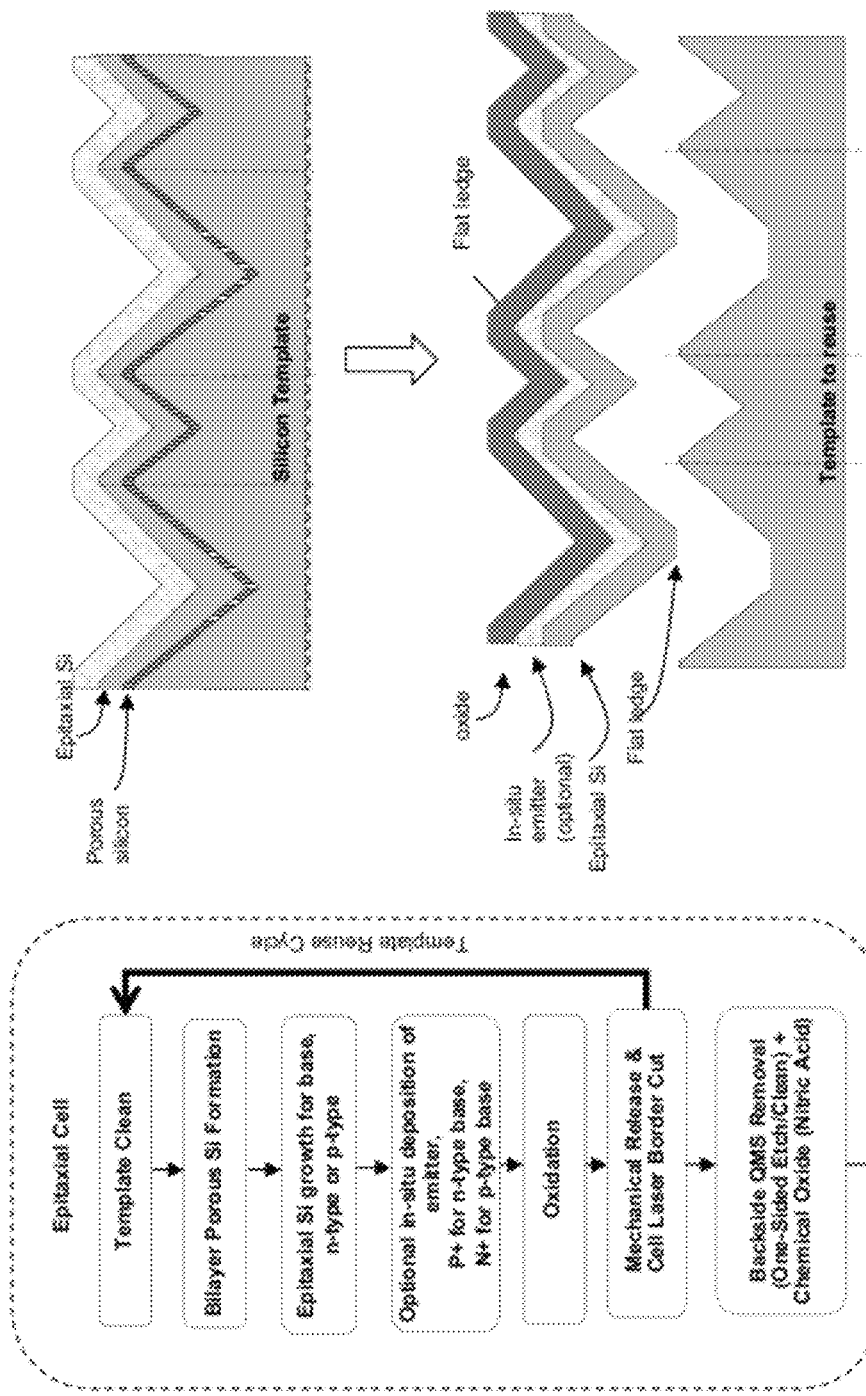

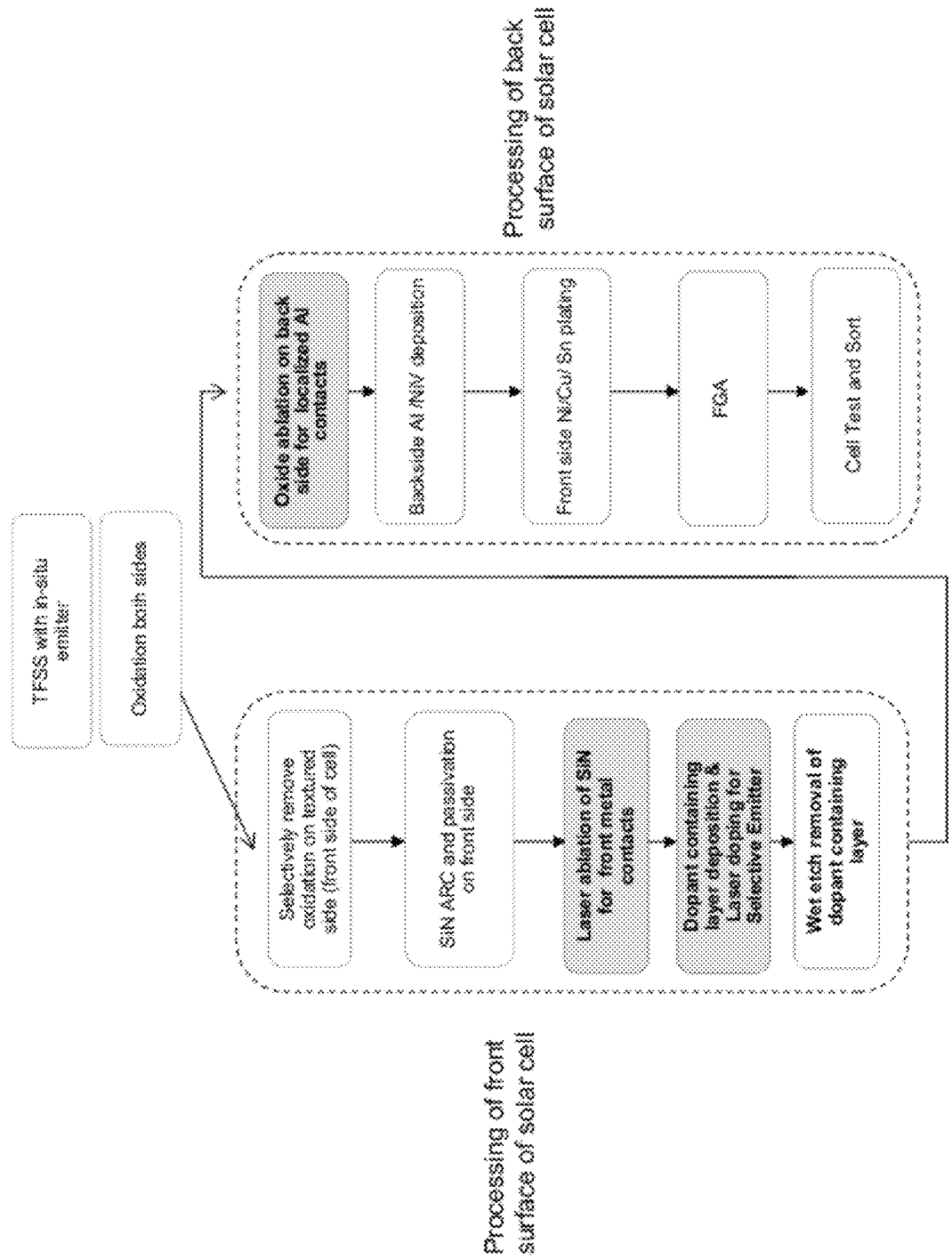

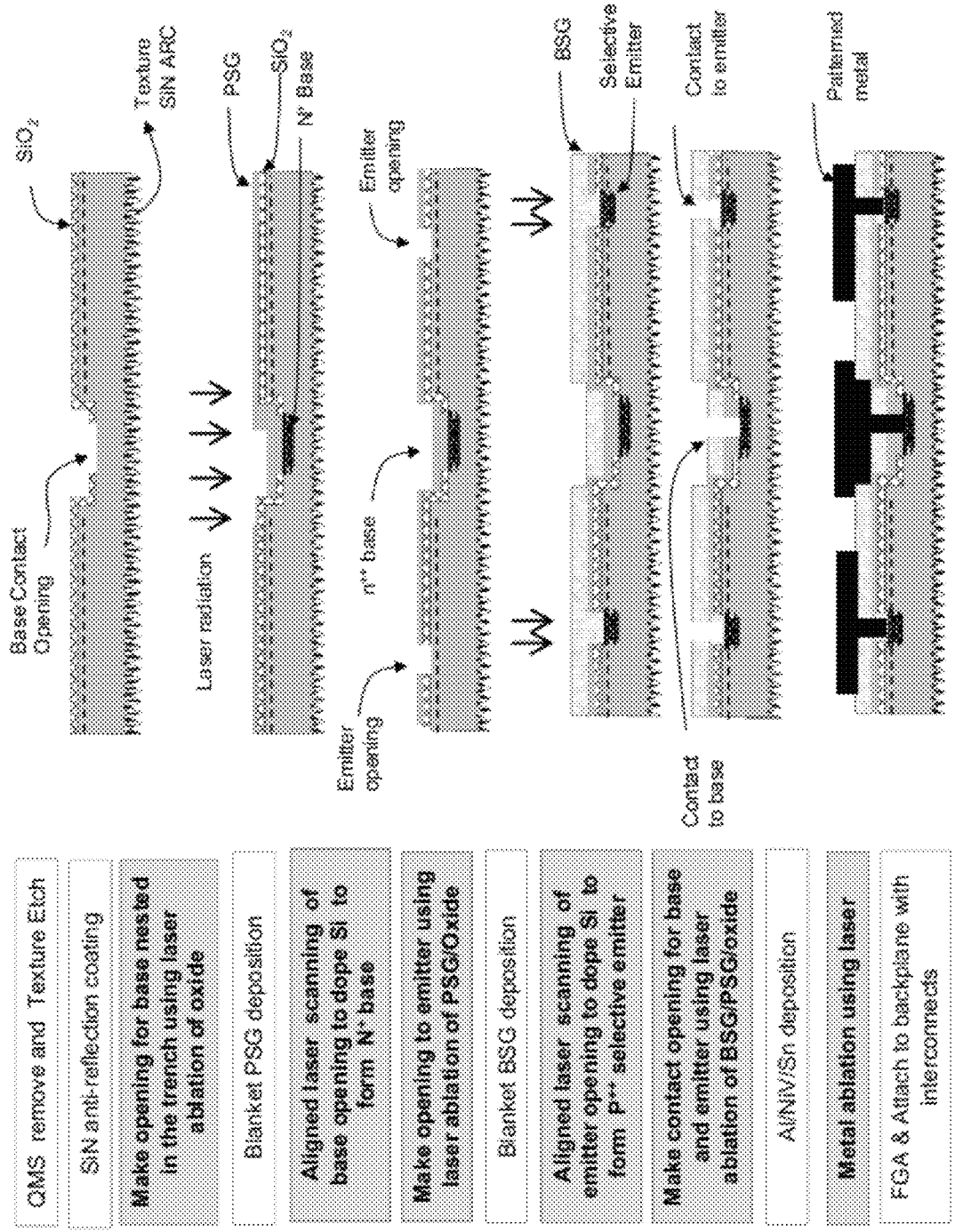

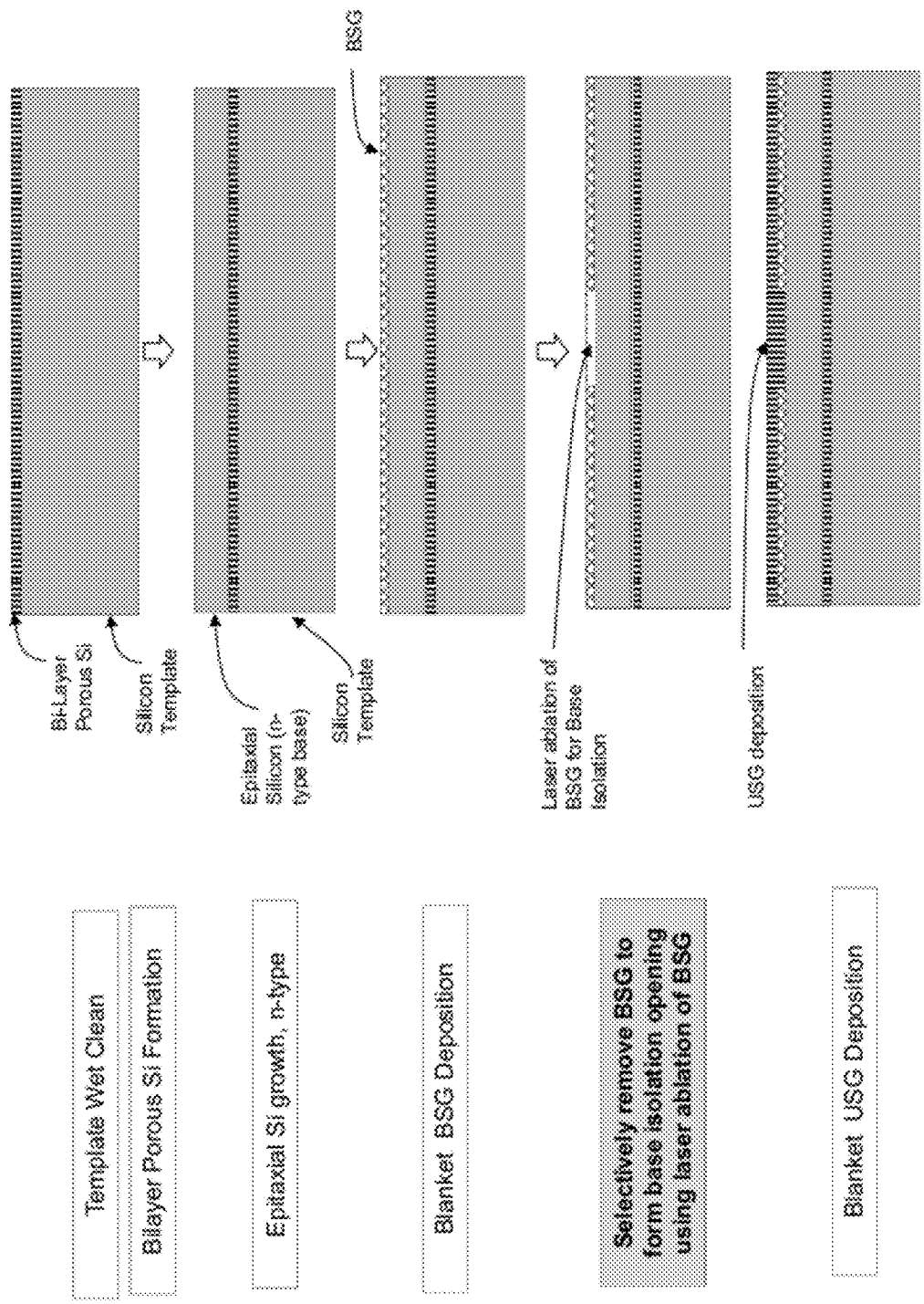

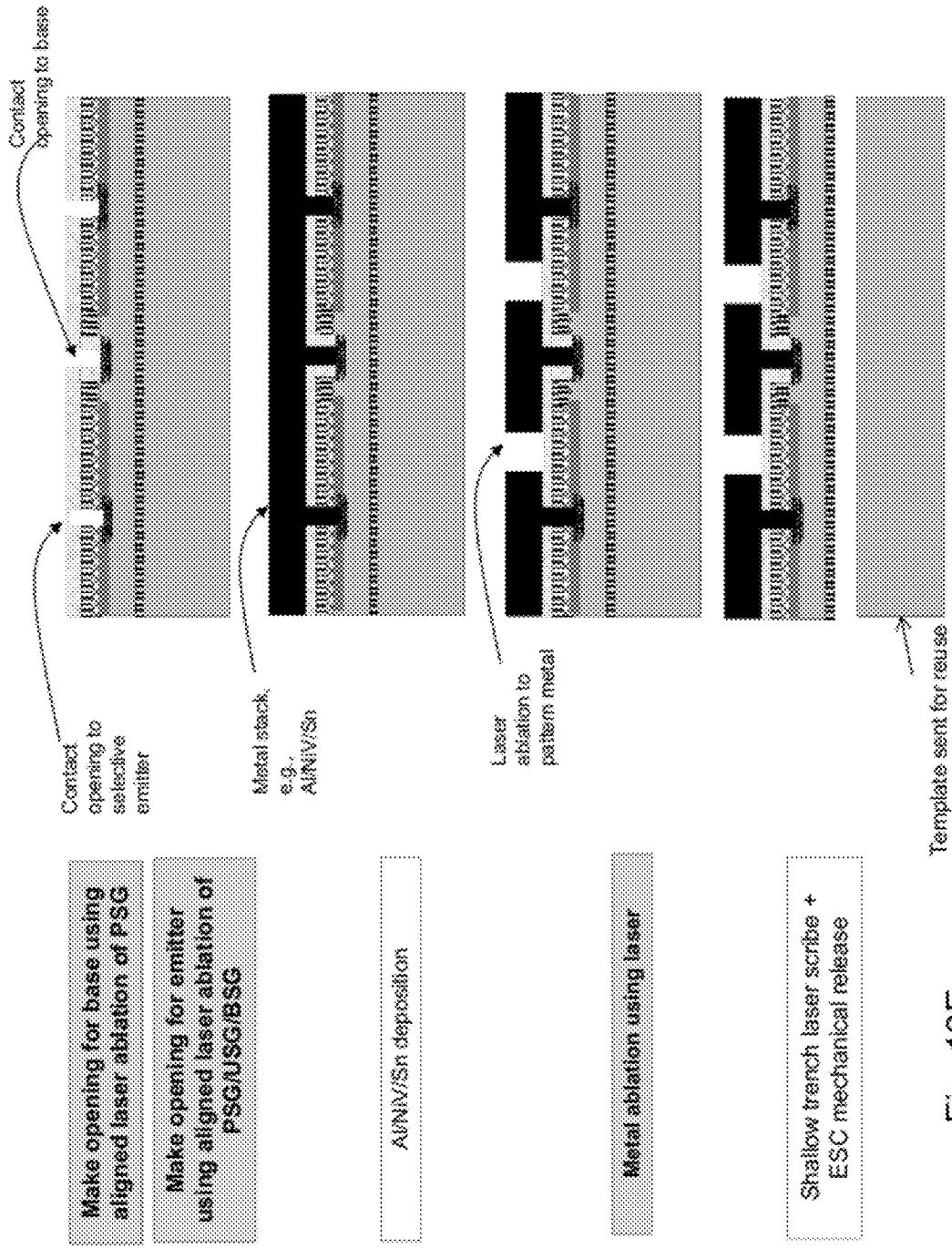

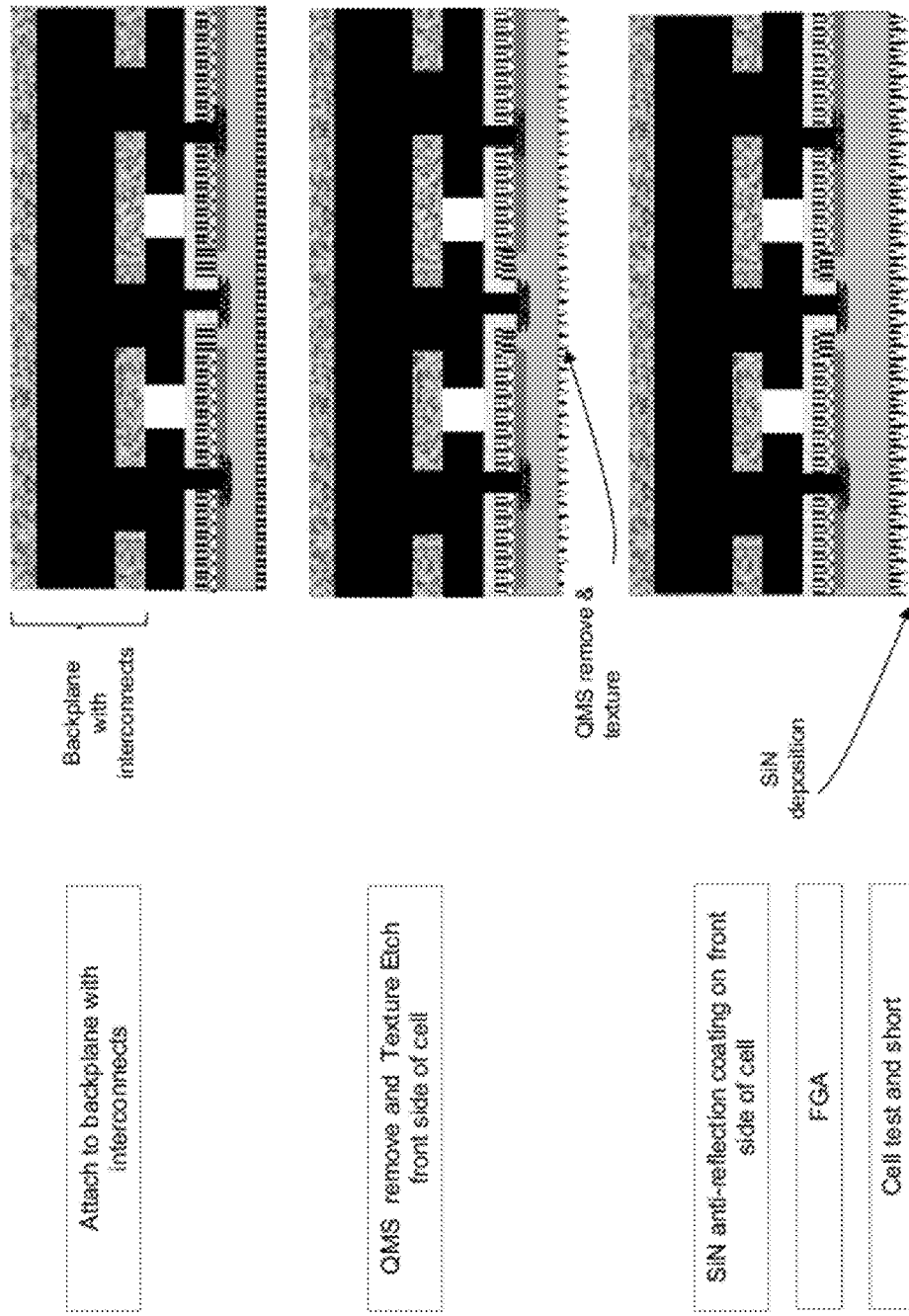

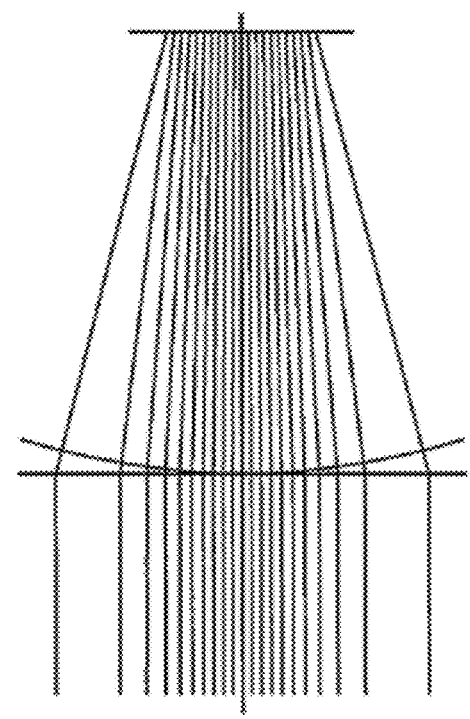
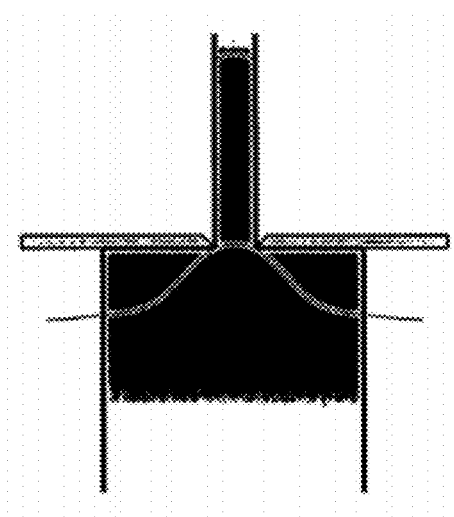
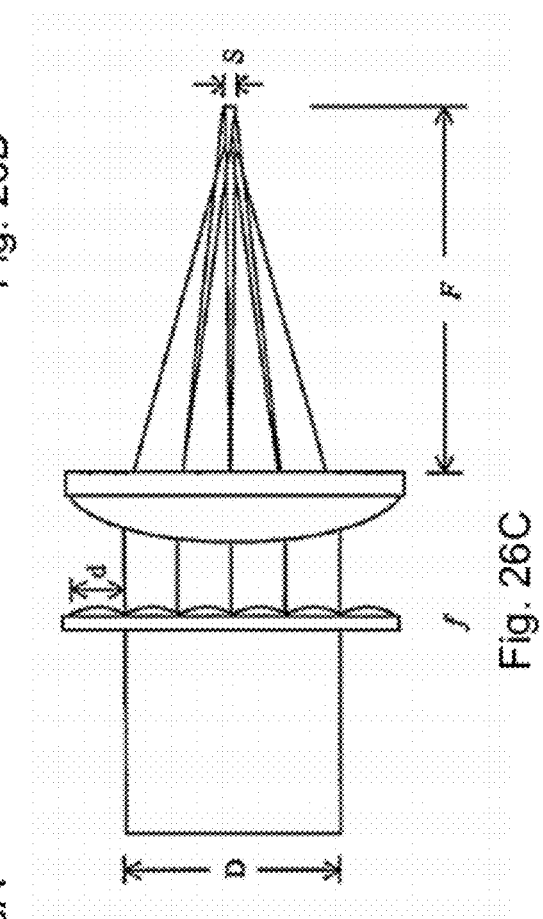
Fig. 26A
Fig. 26B
Fig. 26C

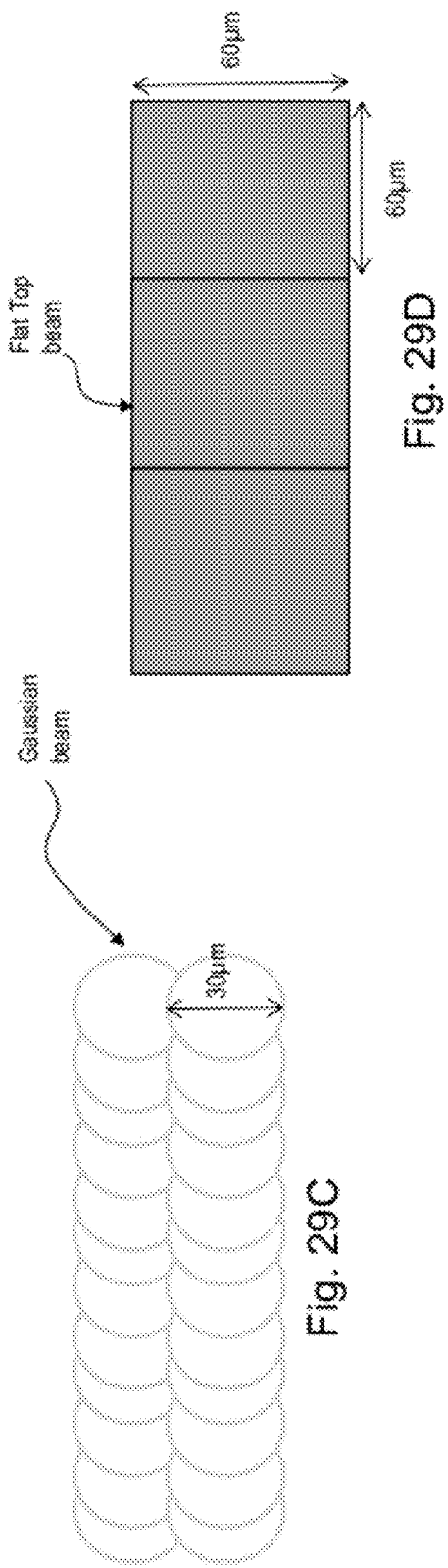
Fig. 29C
Fig. 29D
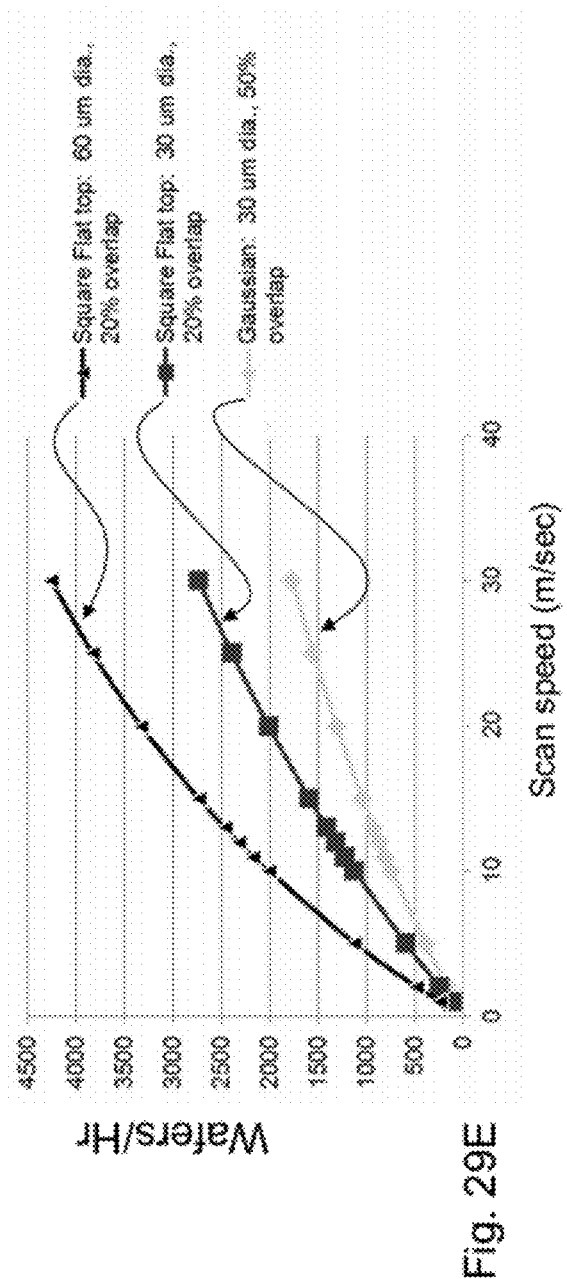
Fig. 29E

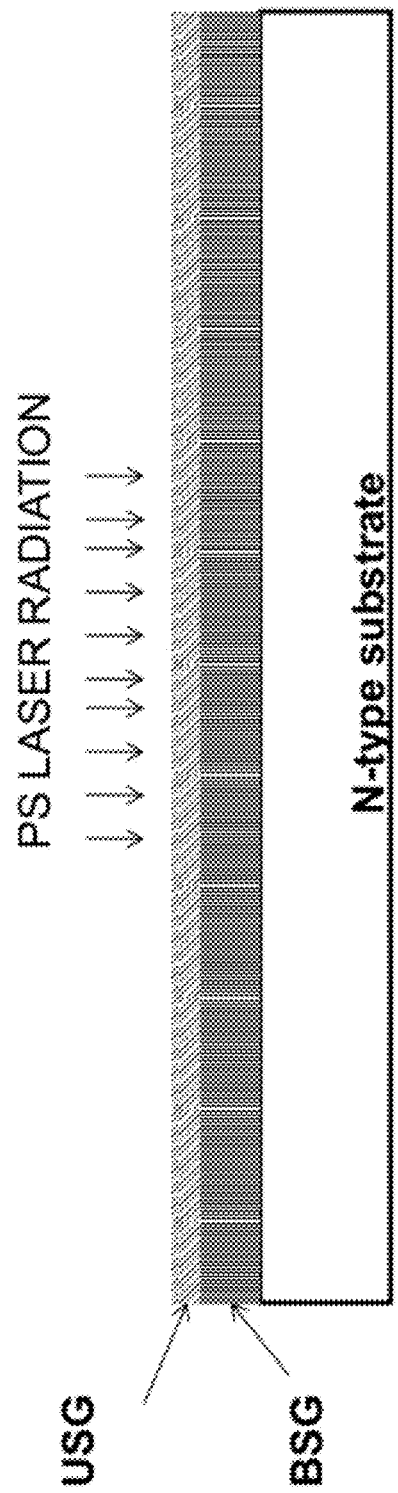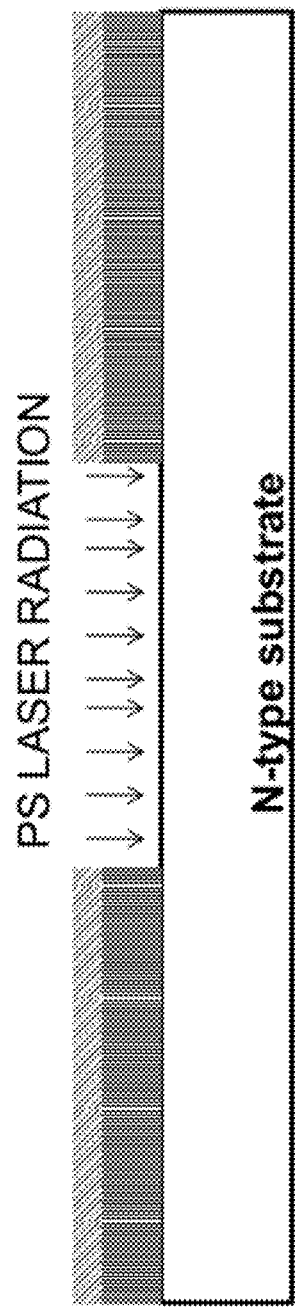
Fig. 34A
Fig. 34B

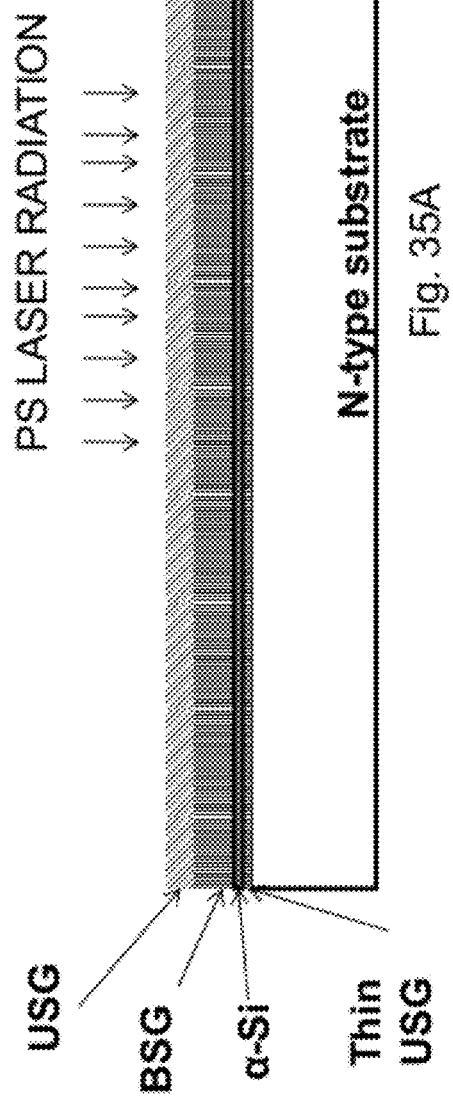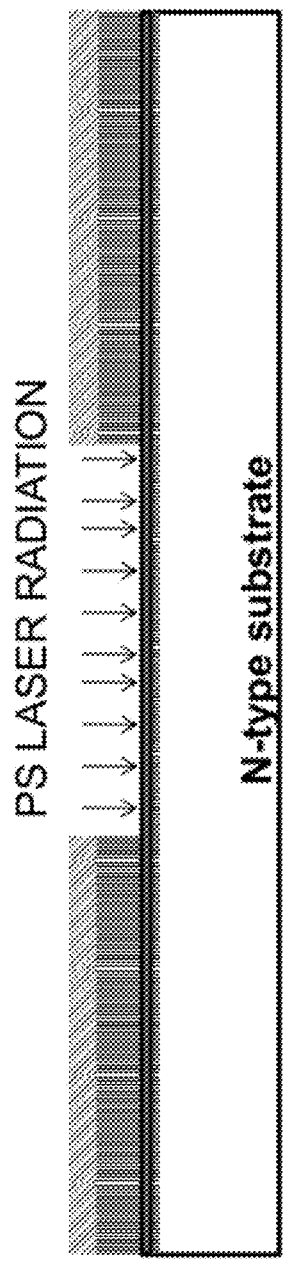
Fig. 35A
Fig. 35B

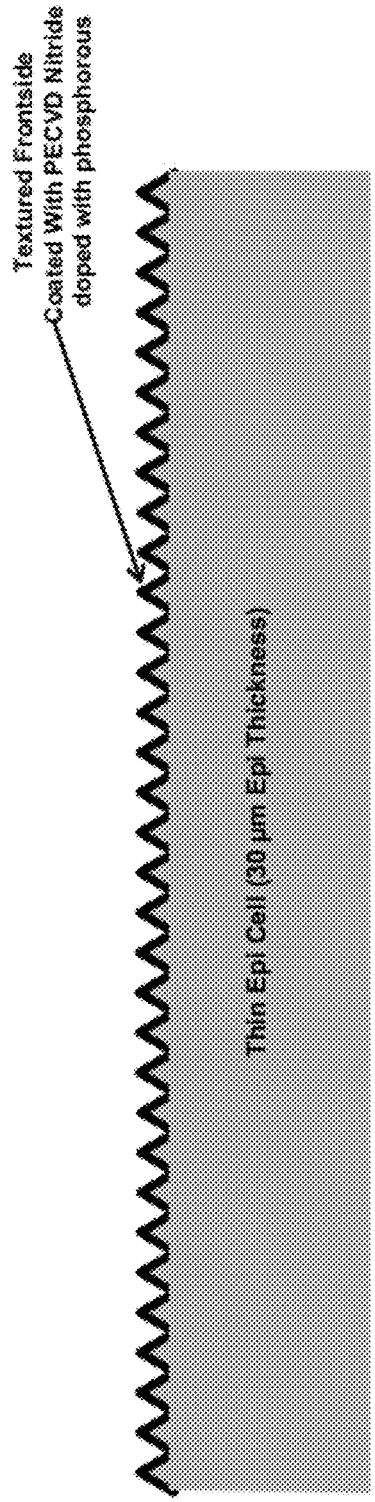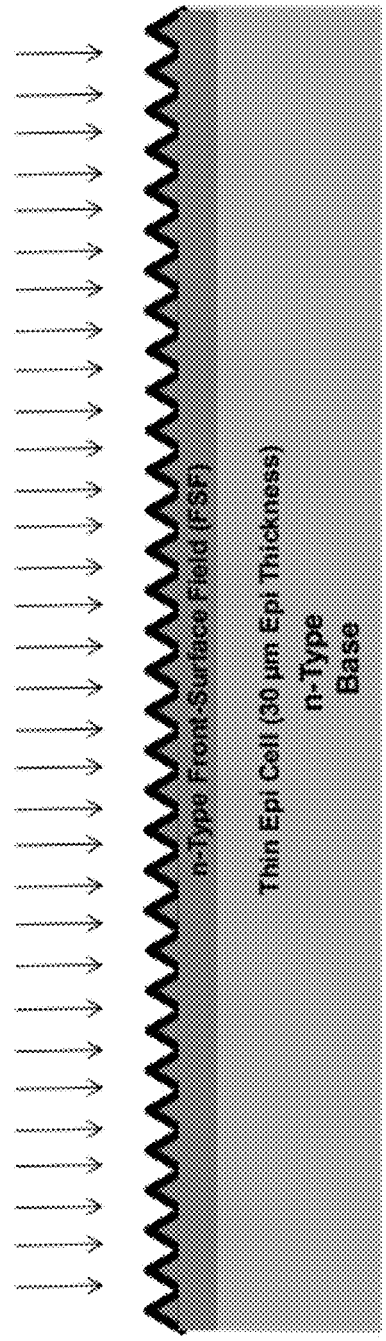
Fig. 36

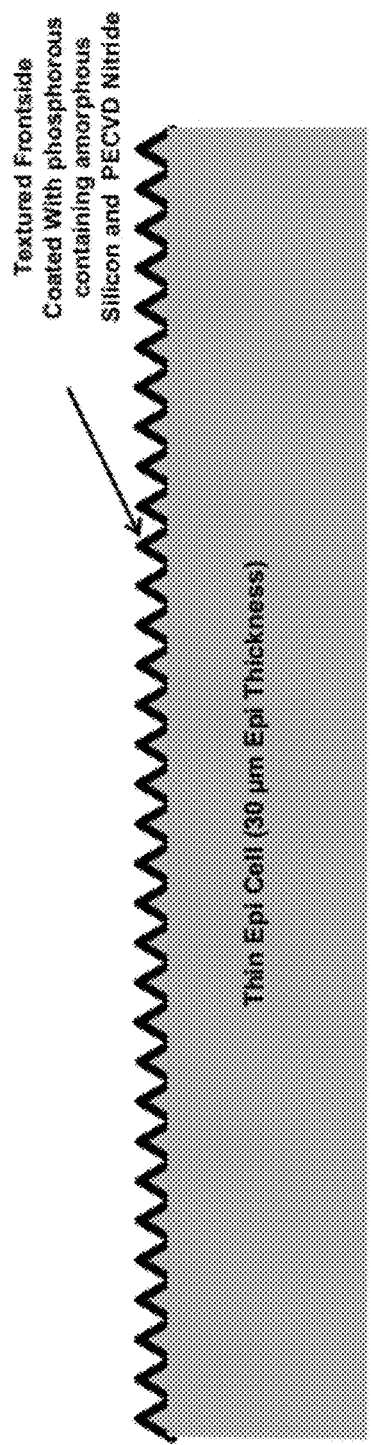
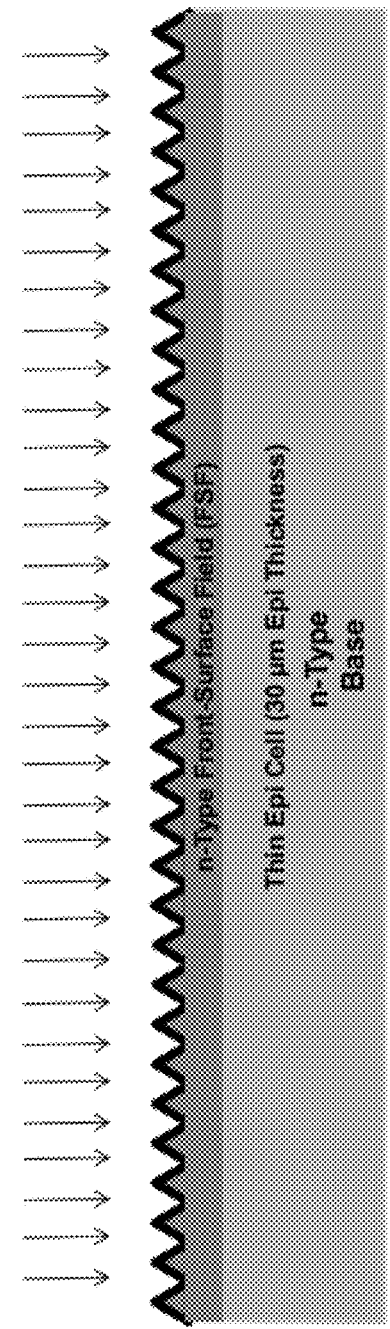
1. Deposit a-Si with phosphorous/ undoped PECVD SiN
2. FSF formation by laser irradiation
Fig. 37

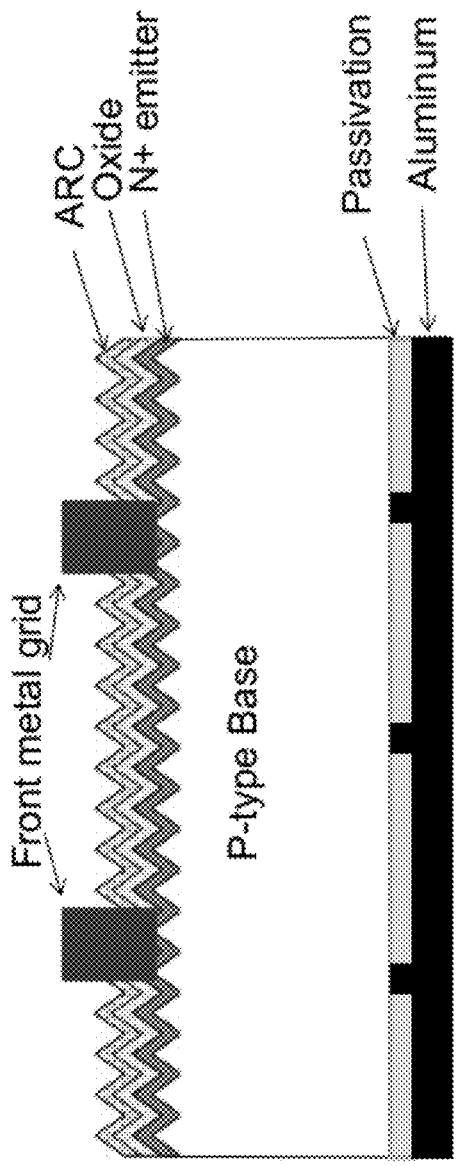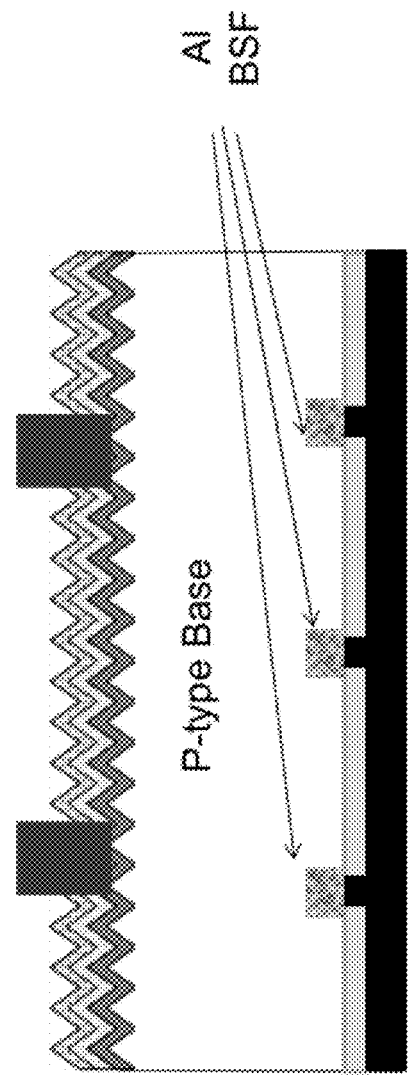
(a) Front contact cells with localized base contacts
(b) Selective emitter after laser scan
Fig. 42

PATTERNING OF SILICON OXIDE LAYERS USING PULSED LASER ABLATION

CROSS-REFERENCE TO RELATED APPLICATIONS

This application claims priority to U.S. Provisional Patent Application Ser. Nos. 61/417,181 filed Nov. 24, 2010, 61/428,600 filed Dec. 30, 2010, 61/428,953 filed Dec. 31, 2010, and 61/428,957 filed Dec. 31, 2010, which are hereby incorporated by reference in their entirety. This application is also a continuation-in-part of U.S. patent application Ser. No. 13/303,488 filed Nov. 23, 2011, U.S. patent application Ser. No. 13/118,295 filed May 27, 2011, U.S. patent application Ser. No. 13/271,212 filed Oct. 11, 2011, U.S. patent application Ser. No. 11/868,488 filed Oct. 6, 2007, U.S. patent application Ser. No. 11/868,492 filed Oct. 6, 2007, U.S. patent application Ser. No. 12/774,713 filed May 5, 2010, and U.S. patent application Ser. No. 13/057,104 filed Feb. 1, 2011 which are also hereby incorporated by reference in their entirety.

FIELD

This disclosure relates in general to the field of solar photovoltaics, and more particularly to laser processing techniques for the production of crystalline semiconductor, including crystalline silicon, and other types of photovoltaic solar cells.

BACKGROUND

Laser processing offers several advantages in terms of efficiency enhancement and manufacturing cost reduction for high-performance, high-efficiency solar cell processing. Firstly, advanced crystalline silicon solar cells may benefit from having the dimensions of the critical features such as electrical contacts be much smaller than the current industrial practice. For front contacted solar cells the contact area of the front metallization to the emitter as well as the contact area of the back metal to the base needs to be low (or the contact area ratios should be fairly small, preferably much below 10%). For an all back-contact, back-junction solar cell, where the emitter and base regions forming the p/n junction and the metallization are on the same side (the cell backside opposite the sunny side), the dimensions of the various features are typically small for high efficiency. In these cells where typically the emitter and base regions form alternate stripes, the width of these regions (in particular the width of the base contact) tends to be small. Also, the dimensions of the metal contacts to these regions tend to be proportionally small. The metallization connecting to the emitter and base regions then needs to be patterned to a correspondingly finer scale. Generally, lithography and laser processing are the technologies that have the relatively fine resolution capability to provide the small dimensions and the control required. Of these techniques, only laser processing offers the low cost advantage required in solar cell making. While lithography requires consumables such as photoresist and subsequent resist developer and stripper (which add to the process cost and complexity), laser processing is a non-contact, dry, direct write method and does not require any material consumables, making it a simpler and lower cost process for solar cell fabrication. Moreover, laser processing is an excellent choice for environmentally benign manufacturing since it is an all-dry process which does not use any consumables such as chemicals.

Further, to reduce the cost of solar cells there is a push to reduce the thickness of the crystalline silicon used and also at the same time increase the cell area for more power per cell and lower manufacturing cost per watt. Laser processing is suitable for these thin wafers and thin-film cell substrates as it is a completely non-contact, dry process and can be easily scaled to larger cell sizes.

Laser processing is also attractive as it is generally a "green" and environmentally benign process, not requiring or using poisonous chemicals or gases. With suitable selection of the laser and the processing system, laser processing presents the possibility of very high productivity with a very low cost of ownership.

Despite these advantages, the use of laser processing in crystalline silicon solar cell making has been limited because laser processes that provide high performance cells have not been developed. Disclosed here are laser processes using schemes that are tailored for each key application to produce solar cells with high efficiency. Specific embodiments are also disclosed for applications of laser processing in manufacturing thin-film crystalline silicon solar cells, such as those manufactured using sub-50-micron silicon substrates formed by epitaxial silicon growth.

SUMMARY

Various laser processing schemes are disclosed herein for producing hetero-junction and homo-junction solar cells. The methods include base and emitter contact opening, front and back surface field formation, selective doping, metal ablation, annealing, and passivation. Also, laser processing schemes are disclosed that are suitable for selective amorphous silicon ablation and selective doping for hetero-junction solar cells. These laser processing techniques may be applied to semiconductor substrates, including crystalline silicon substrates, and further including crystalline silicon substrates which are manufactured either through wire saw wafering methods or via epitaxial deposition processes, that are either planar or textured/three-dimensional. These techniques are highly suited to thin crystalline semiconductor, including thin crystalline silicon films.

Laser processing schemes are disclosed that meet the requirements of base to emitter isolation (including but not limited to shallow trench isolation) for all back-contact homo-junction emitter solar cells (such as high-efficiency back-contact crystalline silicon solar cells), opening for base doping, and base and emitter contact opening (with controlled small contact area ratios, for instance substantially below 10% contact area ratio, for reduced contact recombination losses and increased cell efficiency), selective doping (such as for base and/or emitter contact doping), and metal ablation (formation of patterned metallization layers such as creating the patterned metallization seed layer on a thin-film monocrystalline silicon solar cell prior to subsequent attachment of a backplane to the cell and its release from a reusable host template) for both front-contact and all back-contact/back-junction homo-junction emitter solar cells. Also, laser processing schemes are disclosed that are suitable for selective amorphous silicon ablation and oxide (such as a transparent conductive oxide (TCO)) ablation, and metal ablation for metal patterning for hetero-junction solar cells (such as back-contact solar cells comprising hetero-junction amorphous silicon emitter on monocrystalline silicon base). These laser processing techniques may be applied to semiconductor substrates, including crystalline silicon substrates, and further including crystalline silicon substrates which are manufactured either through wire saw wafering methods or using epitaxial deposition processes, which may be either planar or textured/three-dimensional, where the three-dimensional substrates may be obtained using epitaxial silicon lift-off techniques using porous silicon seed/release layers or other types of sacrificial release layers. These techniques are highly suited to thin crystalline semiconductor, including thin crystalline silicon films obtained using epitaxial silicon deposition on a template comprising a porous silicon release layer or other techniques known in the industry.

An all back-contact homo-junction solar cell may be formed in the crystalline silicon substrate, wherein laser processing is used to perform one or a combination of the following: micromachine or pattern the emitter and base regions including base to emitter isolation as well as openings for base, provide selective doping of emitter and base, make openings to base and emitter for metal contacts, provide metal patterning, provide annealing, and provide passivation. A front contacted homo-junction (emitter) solar cell may be made using laser processing for selective doping of emitter and making openings for metal contacts for both frontside and backside metallization. A hetero-junction all back-contact back-contact solar cell may be made using laser processing for defining the base region and conductive oxide isolation.

BRIEF DESCRIPTION OF THE DRAWINGS

The features, nature, and advantages of the disclosed subject matter will become more apparent from the detailed description set forth below when taken in conjunction with the drawings, in which like reference numerals indicate like features and wherein:

FIG. 1 shows a scanning electron microscope (SEM) image of a shallow trench made in silicon for application in an all back contact back-junction solar cell, in accordance with the present disclosure;

FIG. 2 shows a profile of a shallow trench in silicon for application in all back contact back junction solar cells;

FIGS. 3A-3D show the procedure for selecting the laser fluence to obtain reduced damage silicon dioxide (or oxide) ablation. FIG. 3A shows the dependence of the size of the ablation spot on the laser fluence; FIG. 3B shows irregular delamination of oxide; FIG. 3C shows a damage-free spot; and FIG. 3D shows highly damaged silicon in the spot opening;

FIG. 4 shows substantially parallel rows of contacts opened in oxide using pulsed laser ablation in accordance with the present disclosure;

FIG. 5 shows a screenshot with oxide ablation spots for metal contacts;

FIGS. 6A and 6B show the laser-ablated area formed by making ablation spots that are overlapped in both the x and y-direction; FIG. 6A shows a 180 micron wide strip opened in 1000 A BSG (boron-doped oxide)/500 A USG (undoped oxide) for base isolation region; and FIG. 6B shows a ~90 micron wide stripe opened in 1000 A USG (undoped oxide) for base region;

FIG. 7C shows an optical micrograph of the trench formed in this metal stack;

FIGS. 10A and 10B show a process flow for creation and release of a planar epitaxial thin film silicon solar cell substrate (TFSS);

FIGS. 11A and 11B show a process flow for planar epitaxial thin film silicon solar cell substrate in case the TFSS is too thin to be free standing or self-supporting;

FIGS. 12C and 12D show a process flow for 3-D TFSS creation using the reusable micromold template;

FIG. 13 shows a process flow for making a planar front contacted solar cell where the TFSS is thick enough to be free standing and self-supporting (e.g. thicker than approximately 50 microns for smaller 100 mm×100 mm substrates and thicker than approximately 80 microns for 156 mm×156 mm substrates), in accordance with the present disclosure;

FIGS. 16A-16D show a process flow for making an interdigitated back contact back-junction solar cell where the TFSS is thick enough to be self supporting, in accordance with the present disclosure;

FIGS. 19A-19H show a process flow for making an interdigitated back-contact back-junction solar cell where the TFSS is not thick enough to be self supporting, and where instead of in-situ emitter BSG (boron-doped oxide) deposition and selective laser etchback is used to form the base isolation opening, in accordance with the present disclosure;

FIGS. 22 through 30 are not found in U.S. patent application Ser. No. 13/118,295 "LASER PROCESSING FOR HIGH-EFFICIENCY THIN CRYSTALLINE SILICON SOLAR CELL FABRICATION" by Virendra V. Rana and filed on May 27, 2011;

FIG. 23 is a cross-sectional diagram of a back-contact/back-junction cell;

FIG. 25 is a rear/backside view of the back contact solar cell of FIG. 24A with alternating metal lines contacting the emitter and base regions;

FIGS. 26A-26C are diagrams illustrating three ways a flat-top beam profile may be created;

FIGS. 29C and 29D are diagrams showing a Gaussian beam region profile and a flat top beam region profile, respectively; and FIG. 29E graphically depicts the results of Table 1;

FIG. 30 shows a process flow for an NBLAC cell;

FIGS. 34A and 34B show an oxide ablation process;

FIGS. 35A and 35B show an oxide ablation process using an amorphous silicon layer;

FIG. 36 shows a process for forming FSF and passivation;

FIG. 37 shows a process for forming FSF and passivation with amorphous silicon;

FIG. 42 shows an aluminum BSF.

DETAILED DESCRIPTION

Figure 7A:
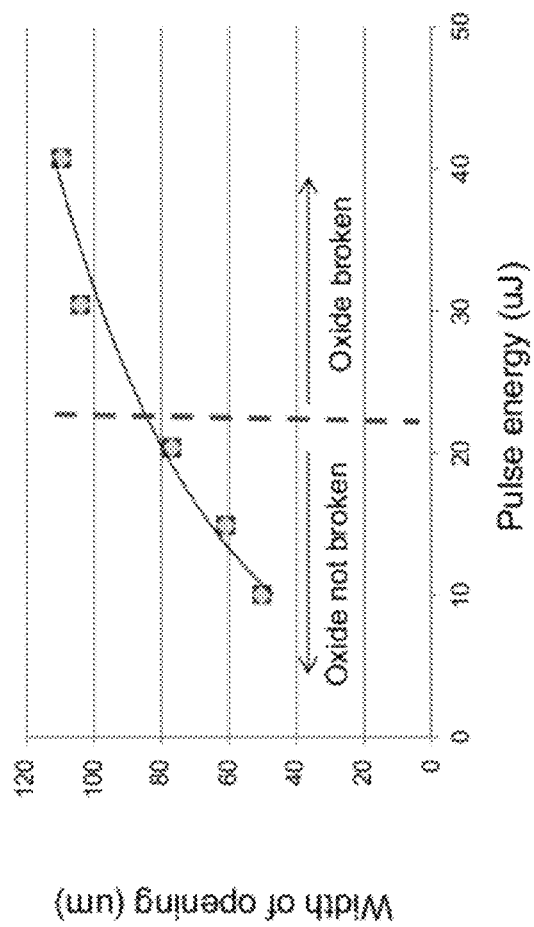
FIG. 7A shows the threshold for oxide damage, below which metal can be removed without metal penetration of the oxide layer.

Although the present disclosure is described with reference to specific embodiments, one skilled in the art could apply the principles discussed herein to other areas and/or embodiments without undue experimentation.

We disclose here laser processing, more specifically pulsed laser processing, schemes that have been developed to address the varying requirements of different processes.

The disclosed methods may be useful in the area of semiconductor device ablation, particularly crystalline silicon ablation. Typically removal of silicon with a laser involves silicon melting and evaporation that leaves undesirable residual damage in the silicon substrate. This damage causes minority carrier lifetime degradation and increased surface recombination velocity (SRV) that reduces the solar cell efficiency. Hence, wet cleaning of the silicon substrate is typically used to remove this damage layer. We present a scheme to reduce this damage to a level acceptable for high efficiency solar cell manufacturing that does not require post-laser-processing wet cleaning, hence simplifying the process flow and reducing the manufacturing cost.

The damage remaining in the silicon substrate upon ablating a certain thickness of it using a laser is related to the amount of laser energy absorbed in the substrate that is not used by the ablated material. If it can be managed that most of the laser energy is used in removing the material then the fraction of the incident energy that seeps into the silicon substrate is minimized, thus minimizing the laser-induced substrate damage and SRV degradation. The penetration of laser energy into silicon depends on the laser pulse length (also called pulse width) and wavelength. The infrared (IR) laser beam, wavelength 1.06 microns, has a long penetration depth in silicon, up to about 1000 microns, while a green laser beam, with a wavelength of 532 nm, penetrates only to a depth of approximately 3 to 4 microns. The penetration of UV laser beam, with a wavelength of 355 nm, is even shorter, only about 10 nm. It is clear that using ultra-short pulses of UV or EUV wavelength limits the penetration of the laser energy into silicon. Additionally, shorter laser pulse length results in shorter diffusion of heat into silicon. While a nanoseconds pulse can lead to heat diffusion in silicon to approximately 3 to 4 microns range, the picoseconds pulse reduces it to about 80 to 100 nm, while a femtoseconds pulse is so short that typically there is no heat diffusion into silicon during the laser ablation process. Hence going to shorter pulses with a shorter wavelength lead to diminishing damage to the laser-ablated substrate. For higher production throughput, green or IR wavelengths can be used depending on the extent of laser damage acceptable. Since even under ideal conditions a certain fraction of the energy would still seep into the substrate, this absorption and its undesirable side effects can be further reduced by reducing the laser power. However, this results in a smaller thickness of silicon being ablated (or a lower silicon ablation rate or lower throughput). It has been found that reducing the pulse energy but causing the silicon removal by increasing the overlap of the laser pulses makes the silicon shallow isolation trench smoother. This is an indication of low silicon surface damage. At very low pulse energies the thickness of silicon removed may be small. The desired depth may then be obtained by using multiple overlapped scans of the pulsed laser beam.

A pulsed laser beam with pulse length in the picoseconds range and a wavelength of approximately 355 nm or below is suitable for silicon ablation with low damage enabling low surface recombination velocity (SRV) for passivated ablated surfaces. FIG. 1 shows a 2.25 micron deep and nearly 100 micron wide trench made in a silicon substrate using a picoseconds UV laser beam of Gaussian profile ($M^2 \leq 1.3$), nearly 110 microns in diameter with 4 microjoule pulse energy, with the laser spots overlapped nearly 15 times. This depth of ablation was obtained using twenty overlapped scans of the laser with each scan removing about 112 nm of silicon. FIG. 2 shows the smooth profile of a 4 micron deep and 110 micron wide trench in silicon obtained using the same picoseconds laser beam with the UV wavelength. The smoothness of the profile should be noted. Such an ablation of silicon is used in all back-contact back-junction solar cells to form regions that isolate base regions from emitter regions. Use of a femtoseconds laser may provide further reduction of laser damage during silicon ablation.

The embodiments of this disclosure are also applicable to the ablation of amorphous silicon. A similar scheme may be used to ablate a desired thickness of amorphous silicon using a pulsed laser beam with femtoseconds pulse length and in some embodiments a UV or green wavelength. Since ablation of amorphous silicon requires much lower energy than crystalline silicon, such a scheme may effectively be used to selectively ablate amorphous silicon films from the crystalline silicon surface for application to hetero-junction solar cells.

This disclosure is also applicable to oxide ablation selective to the underlying substrate, which may be crystalline or amorphous silicon. The oxide film is transparent to laser beams of wavelength down to UV. If a nanoseconds pulse length laser is used to remove the overlying oxide, the removal of oxide takes place by heating and melting of silicon underneath. Because of the pressure from the ablated silicon underneath, the overlying oxide is cracked and removed. This however, creates heavy damage in the silicon substrate so that a wet cleaning treatment is typically used to remove this damaged layer for use in high efficiency cells.

We present here a scheme where the oxide layer is selectively removed from the silicon surface without any appreciable damage to the silicon surface. During the laser ablation, besides heating the material to melt or evaporate it, other effects such as plasma formation take place. Sometimes complex processes can take place at an interface. Using a laser with picoseconds pulse length, the oxide to silicon interface is affected. Using a picoseconds laser with a UV wavelength, the interface effects are enhanced so that separation and delamination of the oxide film takes place from the silicon surface. The silicon surface left behind is virtually free of damage. Picoseconds laser radiation with green or infra-red (IR) wavelength can also be used depending on how much penetration damage of silicon substrate is acceptable. This disclosure will outline the procedure to obtain damage free selective ablation of oxide from the silicon surface.

FIGS. 3A-3D disclose the procedure for obtaining damage-free ablation of oxide. FIG. 3A shows the variation of laser spot opening in a 1000 A PSG (phosphorus-doped oxide)/500 A USG (undoped oxide) stack on a 35 micron thick epitaxial silicon film on a template, using a picoseconds UV laser beam. The oxide layers were deposited using APCVD (atmospheric-pressure CVD) technique. For a given thickness of oxide the spot size depends on the laser fluence ($J/cm^2$). The laser fluence is the laser pulse energy divided by the area of the laser beam. In this case, the laser beam was about 100 microns in diameter with a Gaussian profile ($M^2<1.3$). At very low fluence, the spots are irregular and there is irregular delamination of oxide from the silicon surface as shown in FIG. 3B, while at very high fluence there is extensive damage of silicon as shown in FIG. 3D. The range of fluence shown by line a-a' indicates the optimum range where the damage to the silicon substrate is minimal as seen in FIG. 3C.

FIG. 4 shows rows of cell contact openings that are selectively opened in the oxide for application in all back-contact (and back-junction) solar cells. FIG. 5 is a close-up of these contacts. The laser ablation spots can be overlapped in both x and y direction to open up an area of any desired length and width on the wafer as shown in FIGS. 6A and 6B. FIG. 6A shows a 180 micron wide opening made by selectively removing the BSG (boron-doped oxide) for base isolation region using picoseconds UV laser beam with ablation spots overlapping in both x and y-direction. Similarly, FIG. 6B shows a 90 micron wide area opened up in USG (undoped oxide) for forming the base region.

The selective ablation of oxide from a silicon surface as disclosed here can be used in solar cell making in several ways. In one application, when using in-situ emitter for back-contact cells, this process is used to open tracks in an oxide film to expose the underlying emitter. The emitter so exposed may be removed using wet etching. This region is then used for base to emitter isolation and with base formed inside it.

In another application, this process is used to open regions that are then used for making metal contacts. For front contacted cells, the oxide passivation can be used on the backside of the cells. The scheme described here is then used to open contacts for the metal that is subsequently deposited on these contacts. In this manner, the metal has localized contact that is conducive to high cell efficiency. For back contacted cells, contacts for both base and emitter may be opened using this scheme.

In a solar cell process flow, a doped oxide may need to be removed without causing any doping of the silicon underneath (i.e., without any appreciable heating of the doped oxide and silicon structure). Since, as described above, the oxide is removed by separation at the oxide/silicon substrate interface when using a picoseconds laser beam, the removal of oxide happens with limited pickup of the dopant from the oxide film being ablated.

The selective ablation of silicon nitride ($SiN_x$) is used for front contacted solar cells. Using laser ablation, the contact area to the emitter surface can be reduced thereby minimizing the area where the SiN passivation is removed. This leads to higher $V_{OC}$. Picosecond lasers with either UV or green wavelength are suitable for this application, although nanoseconds UV lasers can also be used.

Selective metal ablation from the oxide surface has historically been difficult using lasers. This is because at the high pulse energies needed to ablate metal, the energy is high enough to damage the oxide underneath and cause penetration of metal into oxide. In fact, this is the basis for the process of "laser fired contacts" (LFC) used in solar cells.

We disclose three schemes for selectively removing metal from the oxide (or another dielectric) surface with no metal penetration of oxide (or other dielectrics such as silicon nitride) and breaking or cracking of oxide. In all these schemes, aluminum is the first metal in contact with base and emitter (aluminum being used as the contact and light trapping rear mirror layer). A laser with picoseconds pulse length is suitable for this application. For high metal removal rate the IR wavelength is quite suitable. According to the first scheme, metal is ablated at a pulse energy that is lower than the threshold for oxide ablation. If the thickness of metal removed in one scan is lower than the desired thickness, multiple overlapping scans are used to remove the full thickness of metal. Since the pulse energy is below the oxide ablation threshold, a clean removal of metal from the oxide surface is obtained. However, the exact recipe used highly depends on the type of metal in the stack, their thickness and surface roughness, etc.

Figure 7B:
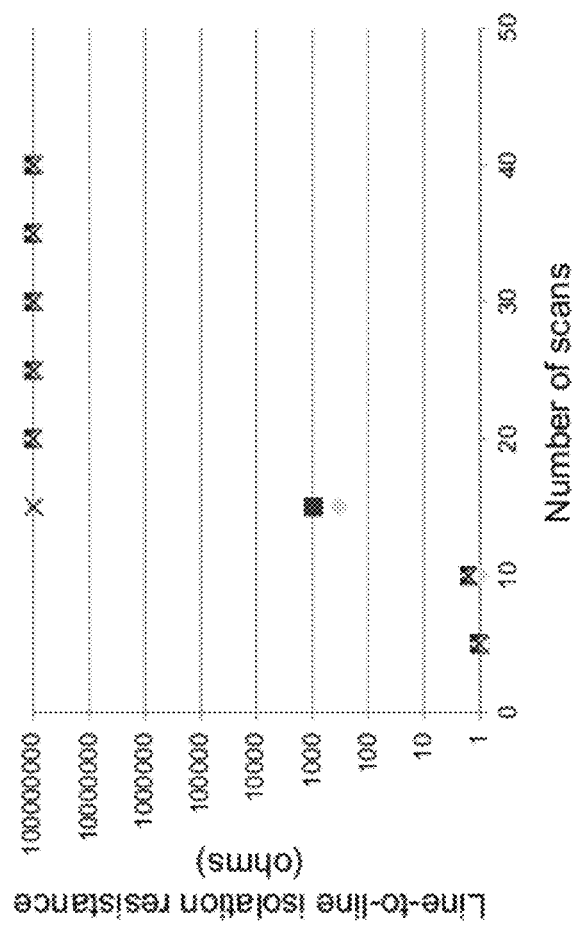
FIG. 7B shows that after 20 scans the metal runners are fully isolated.

FIGS. 7A-7C shows the ablation results when patterning a PVD-deposited bi-layer stack of 2400 A of NiV on 1200 A of Al on oxide. It is desired that the metal be removed completely between the runners without breaking through the oxide layer underneath (to prevent shunts in the cell). FIG. 7A shows the threshold for pulse energy, below which this metal stack can be removed without penetration of oxide. This threshold, besides depending on the metal stack characteristics described above, depends on the laser parameters such as spot overlap obtained using a certain pulse repetition rate of the laser as well as the scan speed. With increasing pulse overlap the threshold pulse energy would decrease, because of the energy accumulation in the metal. FIG. 7B shows that using a pulse energy below the threshold for oxide damage, more than twenty scans provided complete isolation of metal runners as determined by the 100M-ohm resistance between parallel lines. FIG. 7C shows a clean 75 micron trench formed in the 2400 A NiV/1200 Al metal stack.

According to the second, high-throughput scheme higher pulse energies are used, since a substantial part of the incident energy is absorbed as it is being ablated thereby reducing damage to the oxide. This approach makes the laser ablation of metal a very high throughput process. Using this scheme we have ablated 1250 A Al/100-250 A of NiV, with or without a tin (Sn) overlayer up to a thickness of 2500 A successfully using a two step process. In the first step the softer metal is removed using 15 microjoule pulses, followed by 30 microjoule pulses both overlapped fifteen times. For thicker aluminum such as 2000 A the second step can be carried out at 50 microjoules with the same number of overlapping of pulses.

The third scheme of metal ablation is applicable to highly reflective films, for example Al/Ag stack (with Al in contact with the cell and Ag on top of Al), such that most of the incident energy of the picoseconds laser is reflected and ablation is drastically reduced. In that case the surface of the reflective metal (Ag) is first dented using a long pulse length nanoseconds laser, pulse length from 10 to 800 nanoseconds, followed by picoseconds cleanup of the aluminum underneath.

This disclosure is also applicable to the selective doping of a substrate. For successful doping of silicon using an overlying layer of the dopant-containing material, the pulse energy should be high enough to melt the silicon but not high enough to ablate it or the dopant layer above it. As the silicon melts, the dopant is dissolved into it. Upon recrystallization of this silicon layer, a doped layer is obtained. For this application a nanoseconds pulse length laser with green wavelength is quite suitable because of its limited penetration into silicon.

The laser processing techniques described above are applicable to planar and 3-D thin-film crystalline silicon substrates. The laser processes described here are suitable for any thickness of the silicon substrate. These include the current standard wafer thickness of ≥150 microns used for crystalline silicon solar cells. However, they become even more advantageous for thin, fragile wafers or substrates as the process in carried out without any contact with the substrate. These include the wafers thinner than 150 micron obtained from monocrystalline CZ ingots or multi-crystalline bricks using advanced wire sawing techniques or by other techniques such as hydrogen implantation followed by annealing to separate the desired thickness of wafer, or thin-film monocrystalline substrates (such as in the thickness range of from a few microns up to 80 microns) obtained using epitaxial deposition of silicon on a sacrificial separation/release layer such as porous silicon and its subsequent lift off.

Figure 8B:
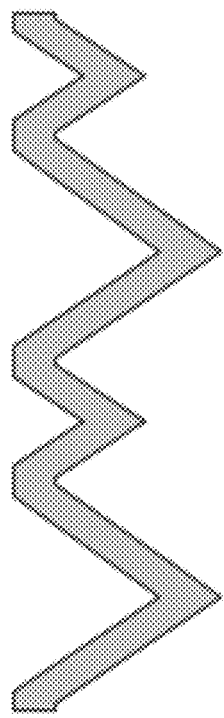
FIGS. 8A and 8B show a top view and a cross-sectional view of a pyramidal TFSC.
Figure 8A:
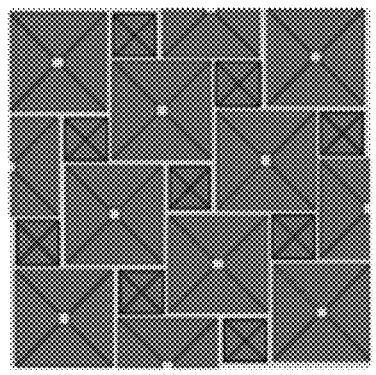
Figure 9B:
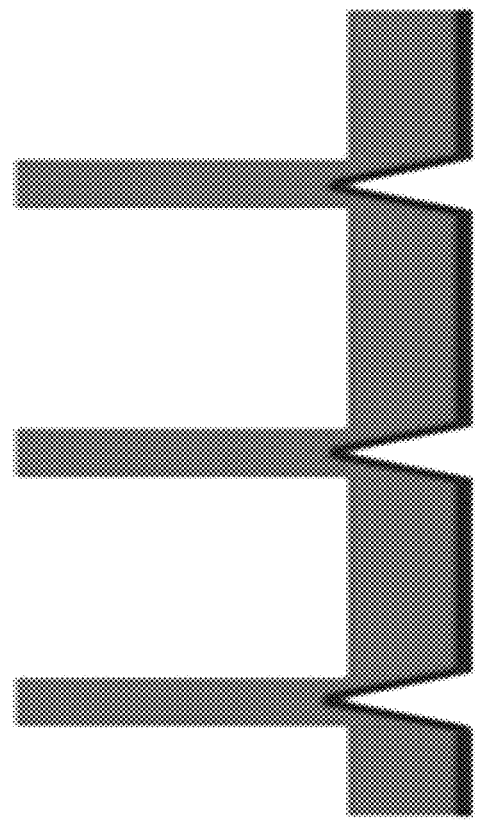
FIGS. 9A and 9B show a top view and a cross-sectional view of a prism TFSC.
Figure 9A:
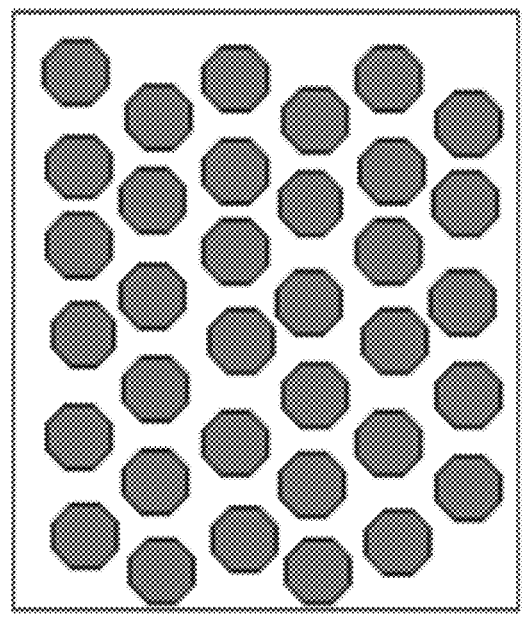
Figure 12B:
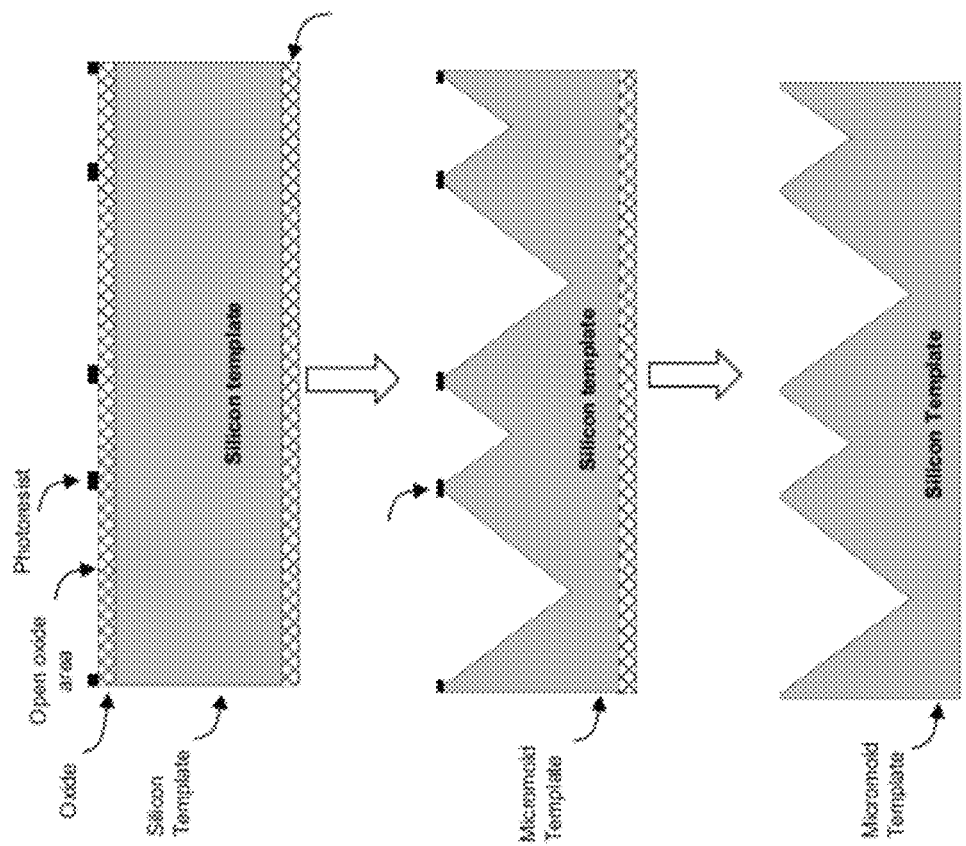
FIGS. 12A and 12B show a process flow for micromold template (or reusable template) creation for making a 3-D TFSS.
Figure 12A:
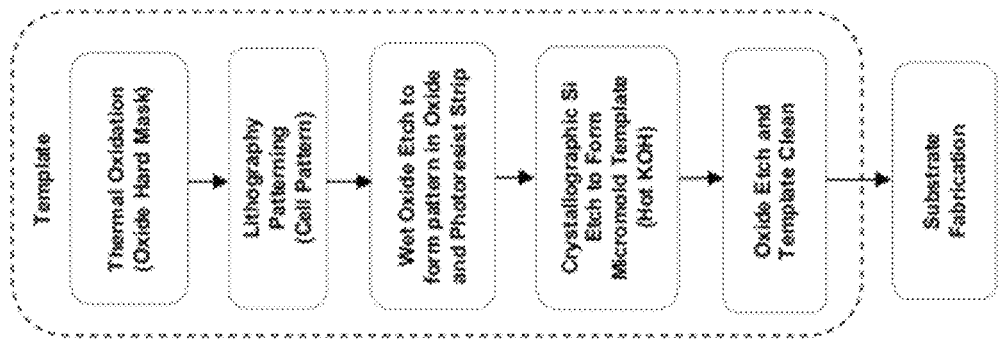

The laser processing is particularly suited to three dimensional substrates obtained using pre-structuring of reusable templates and silicon micromachining techniques. One such method is described in the '713 Application (published as US2010/0304522). FIGS. 8A through 9B show the 3-D thin film silicon substrates obtained using the technique described in that publication. FIG. 8A shows the top view while FIG. 8B shows the cross-section of the TFSS so obtained. For pyramidal substrates, the tips may be flat or may end in a sharp point. FIGS. 9A and 9B show the TFSS with prism structure obtained using a reusable pre-structured 3D template described in the reference above.

Although the laser processes and the process flows described here are applicable to any thickness of the silicon substrate (from less than one micron to over 100 microns), we disclose here their application to solar cells made using thin silicon substrates in the thickness range of from less than 1 micron to about 80 microns, including but not limited to those that are obtained using epitaxial silicon on porous silicon (or other sacrificial layer) surface of a reusable template as described in the '713 Application. To facilitate the understanding of our application, the process flow for obtaining a desired thickness (e.g. from about less than 10 microns up to about 120 microns) of planar monocrystalline TFSSs according to that publication is shown in FIGS. 10A and 10B for planar TFSS that are typically greater than about 50 microns so that they can be handled as self supporting substrates during cell processing, and FIGS. 11A and 11B for planar TFSS that are typically thinner than about 50 microns so that they are not self supporting during cell processing (and hence, are reinforced prior to separation from their host templates). FIGS. 12A-12D show the process flow for obtaining three-dimensional pyramidal silicon substrates. Three-dimensional prism-shaped substrates can be obtained with similar processes, but using a lithography or screen printed pattern that provides for that structure.

The thin planar substrate obtained using the process flow of FIGS. 10A and 10B may be processed according to the process flow of FIG. 13 to obtain high efficiency front contacted solar cells. It should be noted for self-supporting TFSSs it is advantageous to process the template side of the TFSS first before proceeding to the other side. Since the template side of the TFSS is textured during the removal of the quasi-monocrystalline silicon remaining on the TFSS after its separation from the template it is preferably the frontside or sunnyside of the solar cell. The laser processes of selective ablation of silicon oxide and silicon nitride (SiN) are used to advantage in making this front contacted solar cell.

Figure 14:
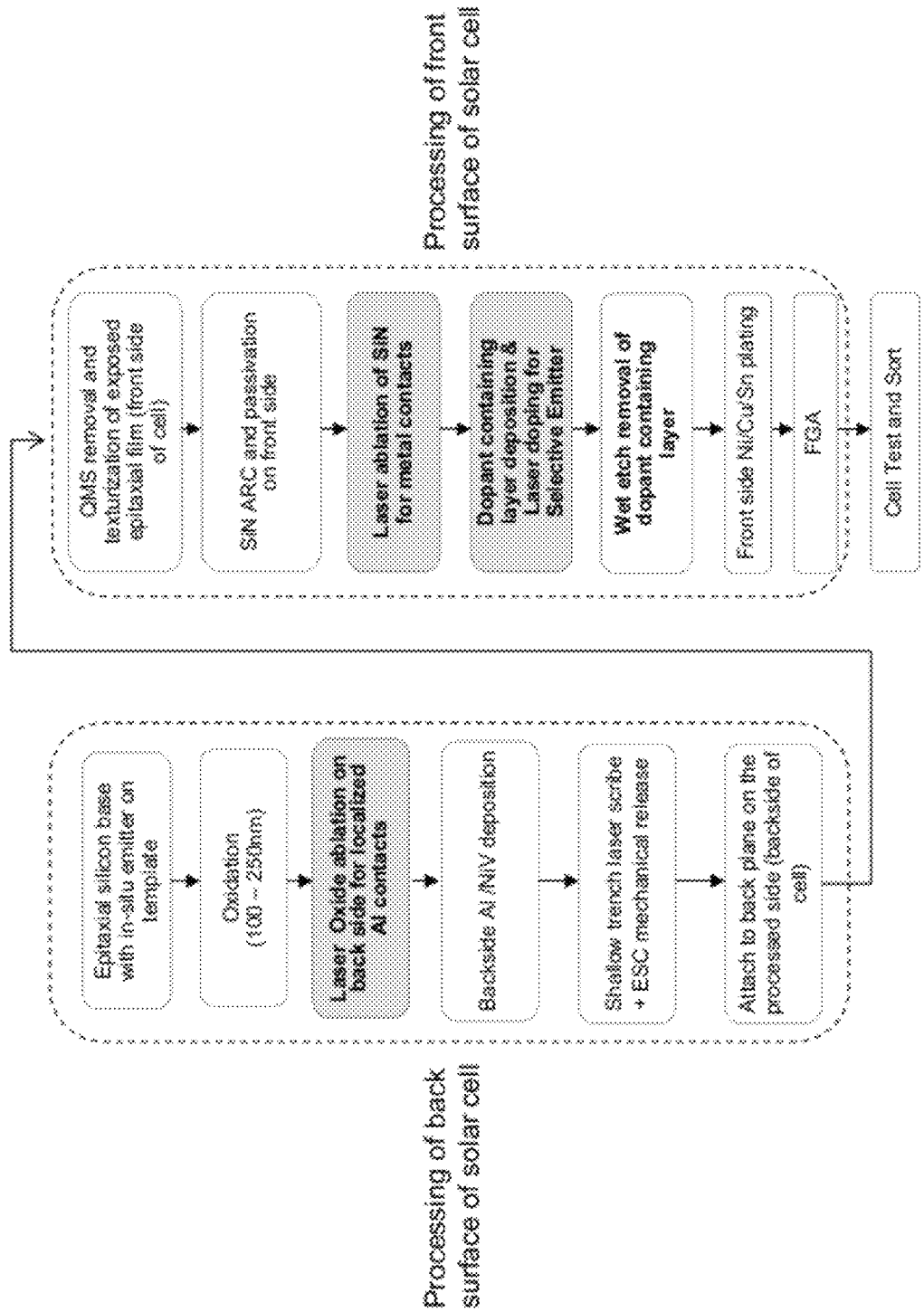
FIG. 14 shows a process flow for making a planar front contact solar cell where the TFSS is too thin to be self supporting, in accordance with the present disclosure.

FIG. 14 shows the application of various laser processes for making high efficiency front contacted solar cells using planar TFSSs where the TFSS is too thin to be free standing or self supporting during cell processing. It should be noted that in this case the non-template side surface is processed first with the TFSS on the template. Once this processing is complete the TFSS is first attached to a reinforcement plate or sheet (also called a backplane) on the exposed processed side and then separated from the template. After separation of the backplane-attached (or backplane-laminated) thin-film crystalline silicon solar cell, removal of residual porous silicon, texture etch, and SiN passivation/ARC deposition, and forming-gas anneal (FGA) operation processes are carried out on the released face of TFSS (which will end up being the front surface of the solar cell).

Figure 15:
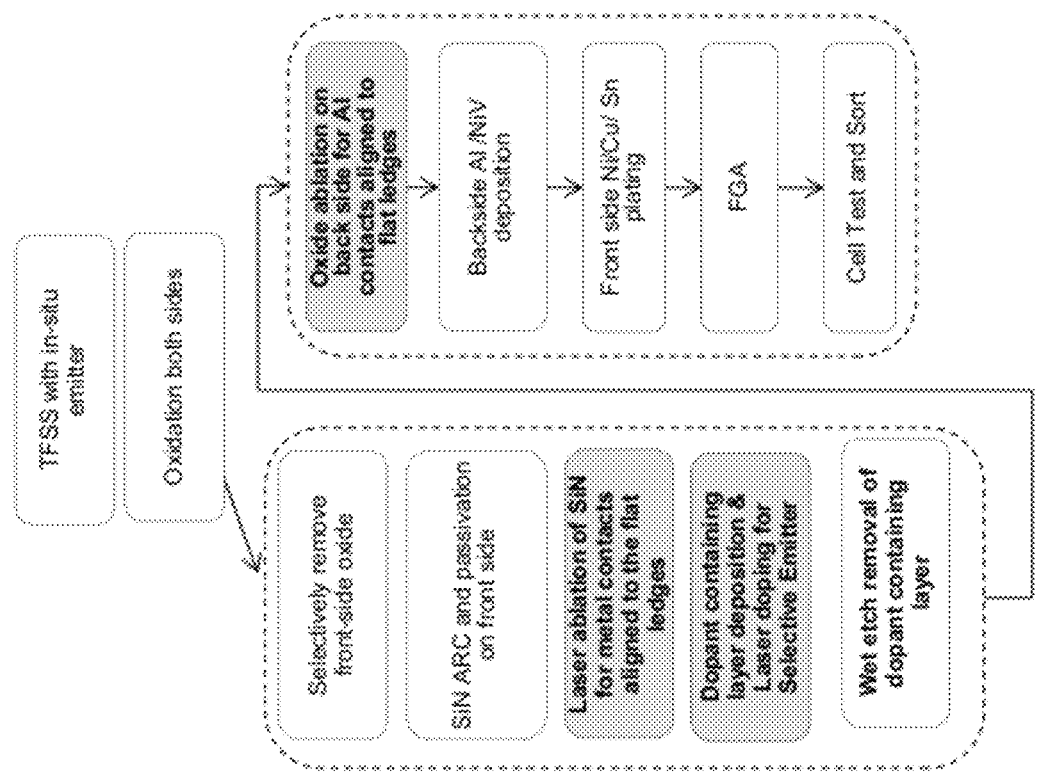
FIG. 15 shows a process flow for making a 3-D front contact solar cell in accordance with the present disclosure.
Figure 16B:
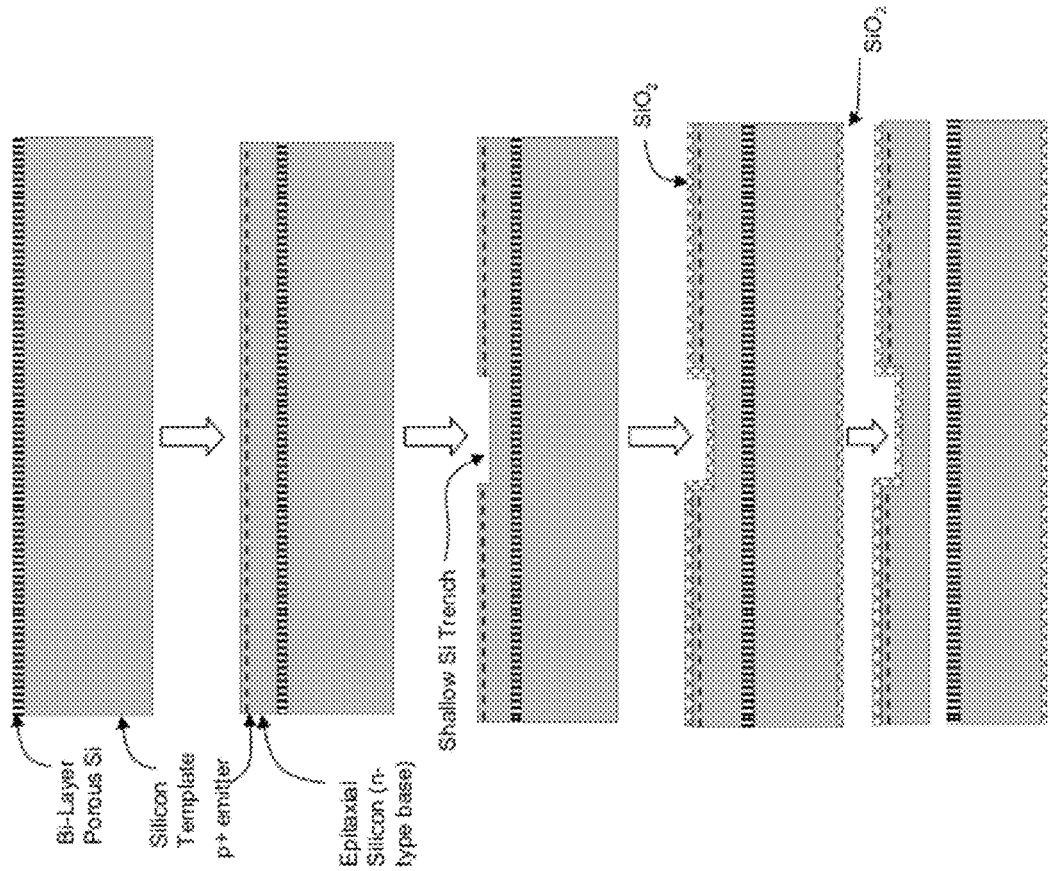
Figure 16A:
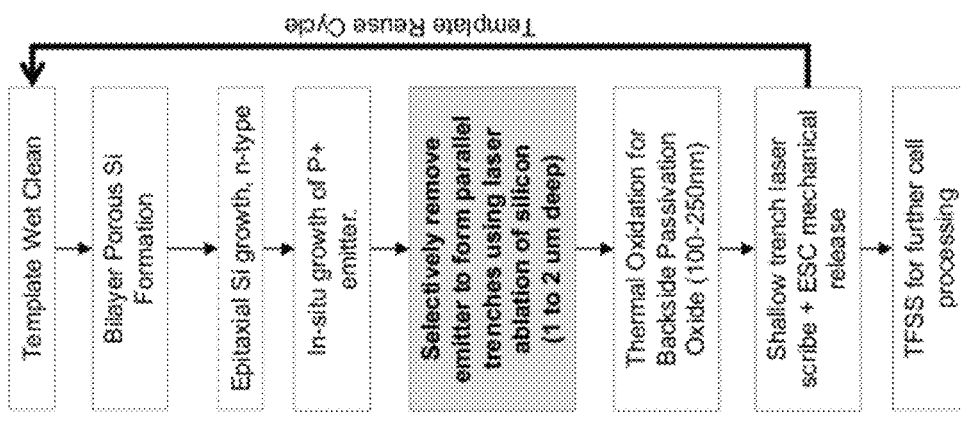

FIG. 15 shows the application of various laser processes for making high efficiency front contacted solar cells using 3-D front TFSS. For this application it is advantageous to have pyramid tips on the template side not be sharp but end in flat ledges.

The processes described here are further uniquely suited to simplifying the all back-contact cell process flow.

Figure 17:
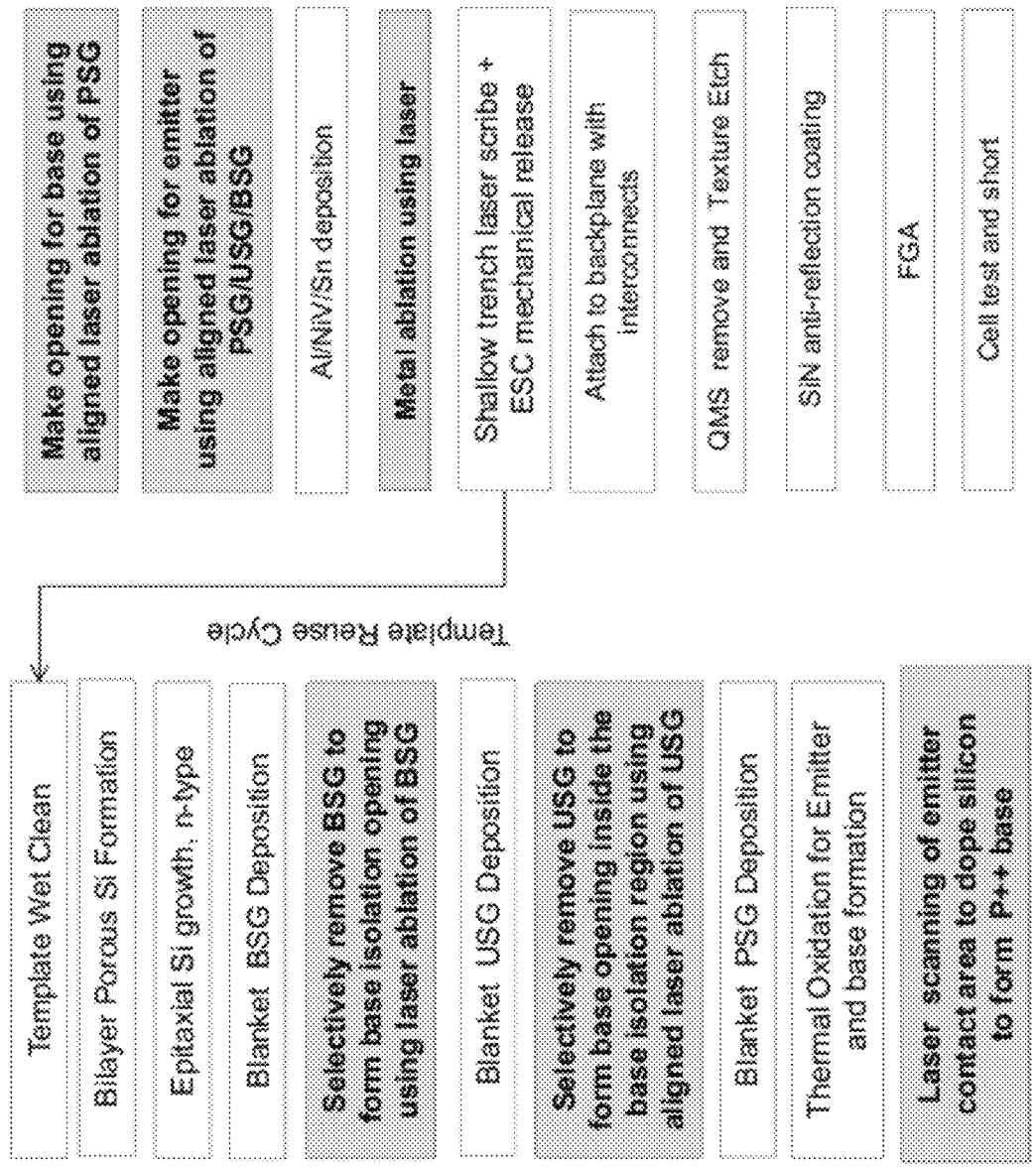
FIG. 17 shows a process flow for making an interdigitated back-contact back-junction solar cell using thick TFSS where the in-situ emitter is not deposited. Instead, a BSG (boron-doped oxide) layer is deposited on the epitaxial silicon film and patterned to open the base isolation region, in accordance with the present disclosure.

FIGS. 16A-16D show the laser processes used on the planar epitaxial substrate to make a back-contact/back-junction solar cell where the TFSS is self supporting (i.e., no backplane attachment to the cell). In this application the epitaxial emitter is deposited in-situ during silicon epitaxy following the deposition of the epitaxial silicon base. The ablation of silicon is then used to remove the emitter from the base isolation regions. At the same time four fiducials are etched into oxide to align subsequent ablation to this pattern. Next, a thermal oxide is grown to passivate the silicon surface that will become the back surface of the back-contact back-junction solar cell. The epitaxial silicon film is then disconnected or released from the template (by mechanical release from the porous silicon interface). Next, the residual porous silicon layer is wet etched and the surface is textured (both can be done using an alkaline etch process). This will become the textured front surface or the sunnyside of the solar cell. Now, the thermal oxide is ablated using a picoseconds UV laser to form base openings inside the base isolation region. The base opening is aligned inside the base isolation region (trench) formed by silicon ablation earlier using the fiducials that were etched in silicon earlier as mentioned above. Next a phosphorous containing oxide layer (PSG) is blanket deposited on the surface. Scanning with a nanosecond green or IR laser aligned to base opening using the fiducials in silicon causes the base to be doped. Also, the region that will have the contact openings to emitter is also doped in a similar manner using the aligned scans of nanosecond green or IR laser. Next, contact opening are made to these doped base and emitter areas using a picoseconds UV laser. Again, the alignment of these contact openings is made using fiducials in silicon. Now, a metal stack layer comprising aluminum as its first layer in contact with the cell (e.g., a stack of 1250 A Al/100-250 A NiV/2250 Sn) is deposited using a suitable method such as a PVD (physical vapor deposition) technique. Next, this layer is patterned using a picoseconds IR laser so that the metal runners are separately connected to the base and emitter regions. After an optional forming gas anneal (FGA), the cell is connected to and reinforced with a backplane with either embedded (Al or Cu) high-conductivity interconnects or no embedded interconnects (in the latter, the final cell metallization can be formed by a copper plating process). The cell is now ready for test and use. FIG. 17 shows the laser processes used on the planar epitaxial substrate to make a back-contact solar cell where epitaxial silicon base is not deposited with an emitter layer. Instead, a boron containing oxide (BSG) layer is deposited and patterned to open the base isolation region. A similar process to that described above is followed except that now the emitter and base are formed simultaneously during a thermal oxidation step according to the process flow outlined in FIG. 17.

Figure 18:
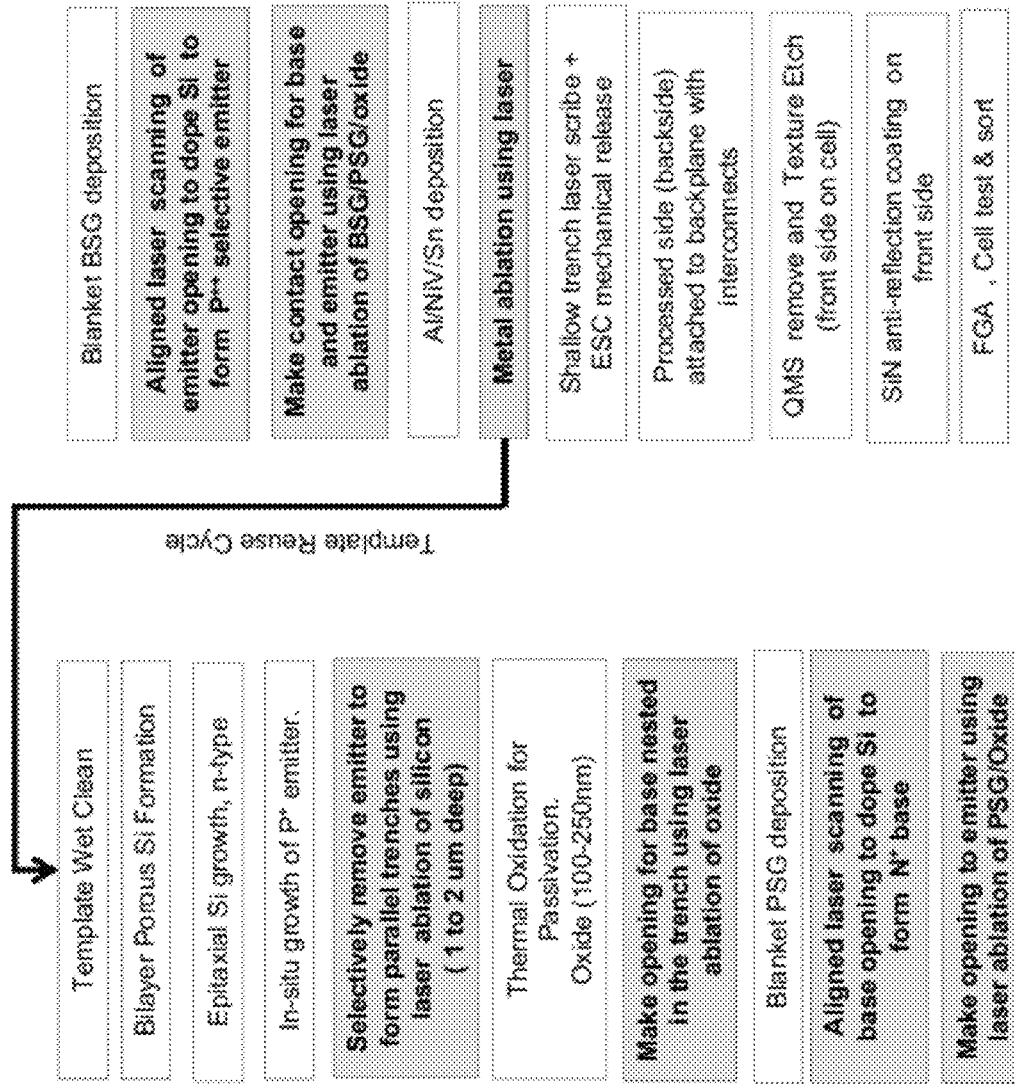
FIG. 18 shows a process flow for making an interdigitated back-contact back-junction solar cell where the TFSS is not thick enough to be self supporting, where in-situ emitter and laser ablation of silicon is used to form the base isolation opening, in accordance with the present disclosure.
Figures 19C, 19D:
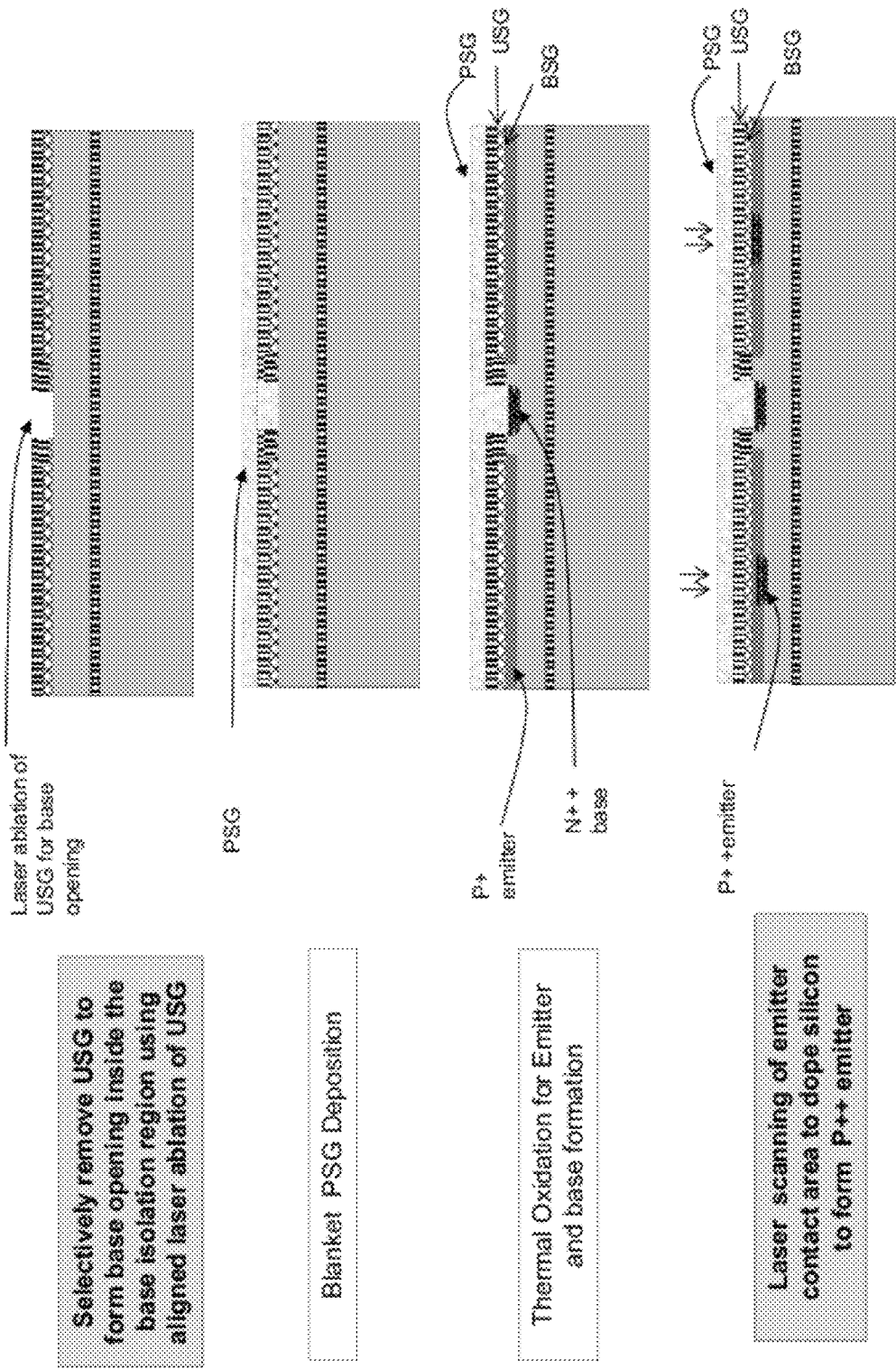

FIG. 18 shows a process flow using laser processes on the epitaxial substrate to make a planar back-contact/back-junction solar cell where the TFSS is not self-supporting (hence, a backplane is used). This flow uses the silicon ablation of in-situ doped emitter to form the base isolation region.

FIG. 19A-19H show a process flow using laser processes on the epitaxial substrate to make a planar back contact solar cell where the TFSS is not self-supporting. In this flow, instead of an in-situ emitter layer, the BSG deposition and selective laser ablation followed by thermal oxidation (or a thermal anneal or a thermal oxidizing anneal) is used to form the emitter as well as the base isolation region.

Figure 20:
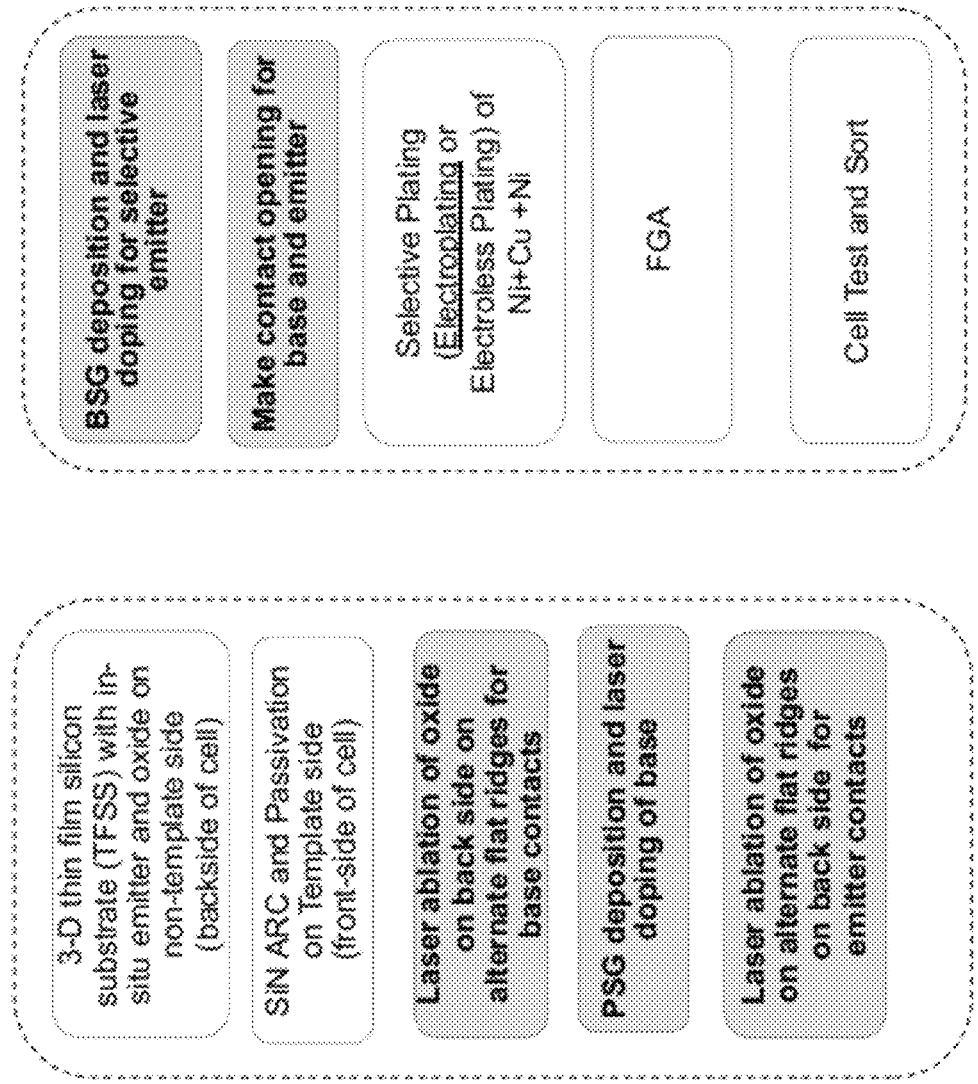
FIG. 20 shows a process flow for making an interdigitated back-contact back-junction solar cell using a 3-D TFSS, in accordance with the present disclosure.

FIG. 20 shows a process flow for making back contacted 3-D solar cells, it is advantageous to have the template side of pyramids end in relatively sharp points. Since the 3-D TFSS can be self-supporting to relatively low thickness (e.g., silicon as thin as about 25 microns), the process flow is similar to that shown in FIG. 16. It should be clear that we again have a choice of using the in-situ emitter followed by laser ablation of silicon, or BSG deposition and selective laser ablation followed by thermal oxidation (or thermal anneal, or thermal oxidizing anneal).

Figure 21:
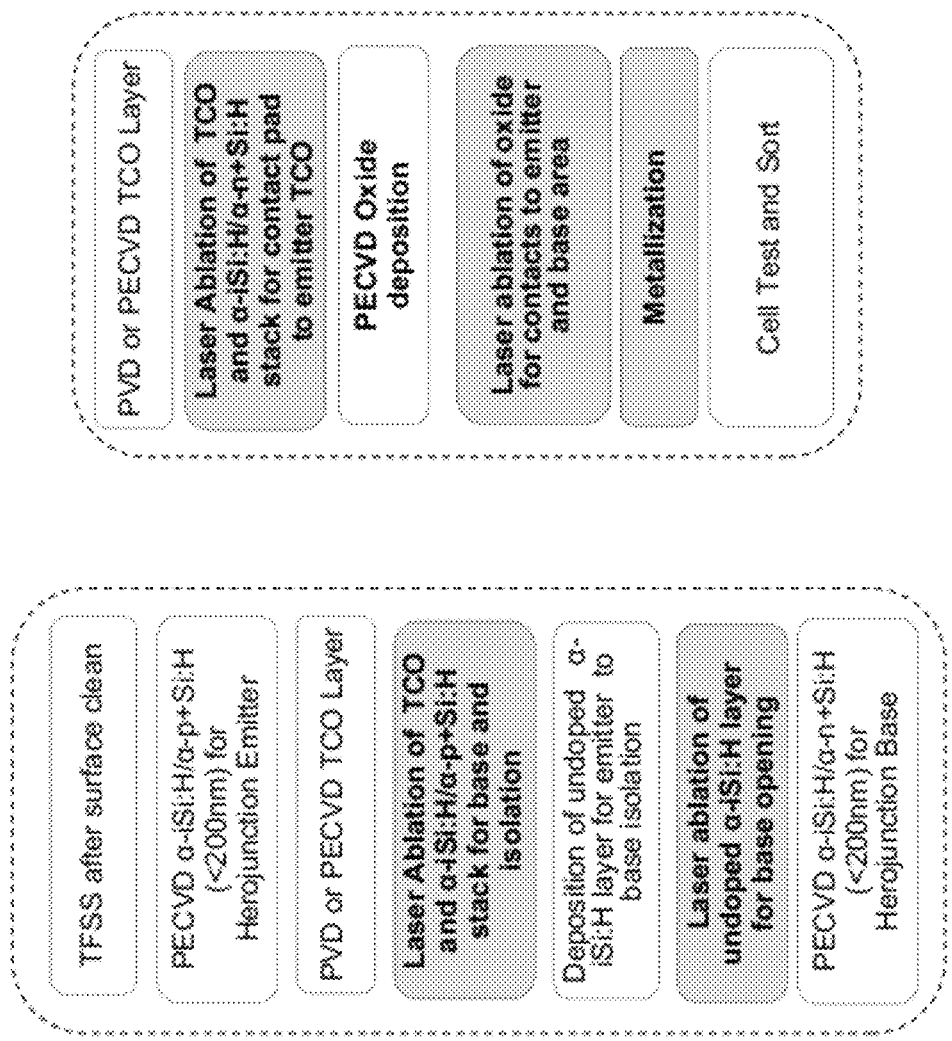
FIG. 21 shows a process flow for making an interdigitated back-contact back-junction hetero-junction solar cell, in accordance with the present disclosure.

For applications in hetero-junction solar cells, a hetero-junction emitter may be formed by a doped amorphous silicon layer in contact with an oppositely doped crystalline silicon base. For interdigitated back contact solar cells we pattern the amorphous silicon layer and the transparent conducting oxide (TCO) using laser ablation that is selective to the crystalline layer. Femtoseconds pulsewidth lasers with either UV or green wavelength are suitable for this application. A process flow is described in FIG. 21. Several variations of this process flow are possible.

Various embodiments and methods of this disclosure include at least the following aspects: the process to obtain silicon ablation of crystalline and amorphous silicon with reduced damage; the process to obtain oxide ablation for both doped and undoped oxides with no or reduced damage to silicon; the process to obtain fully isolated metal patterns on a dielectric surface for solar cell metallization; the process to selectively dope the emitter and base contact regions; the use of pulsed laser processing on very thin wafers, including planar and 3-D silicon substrate; the use of pulsed laser processing on substrates obtained using epitaxial deposition on a reusable template made using template pre-structuring techniques; the use of various pulsed laser processes in making front contacted homo-junction solar cells; the use of various pulsed laser processes in making all-back contacted homo-junction solar cells; and the use of various pulsed laser processes in making hetero-junction solar cells.

Although the front contact solar cells are described with p-type base and back-contact back-junction solar cells are described with n-type base, the laser processes described here are equally suited to the substrate with opposite doping, i.e., n-type for front contact solar cell with $P^+$ emitter, and p-type base for back-contact back-junction solar cells with p-type base and $n^+$ emitter.

The following description, tables, and figures disclose the application of flat top laser beams to laser processing methods for interdigitated back-contact cells (IBC). The description following is directed towards methods for the formation of back contact solar cells utilizing flat top laser beams as compared to traditional Gaussian laser beams. Further, the implementation of flat top laser beams to the laser processing methods described throughout this application provides substantial reduction in damage to silicon, improvement in solar cell fabrication throughput, and a bigger alignment window for defining patterns (e.g. patterns of emitter and base regions) that are inset inside another pattern.

Figure 22B:
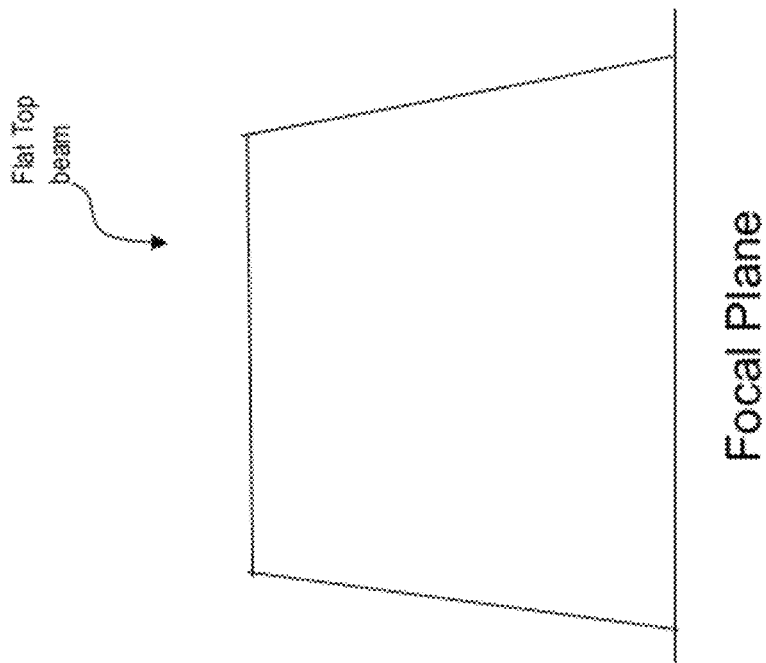
FIGS. 22A and 22B are schematics showing the profile of a Gaussian beam and a flat top beam, respectively.
Figure 22A:
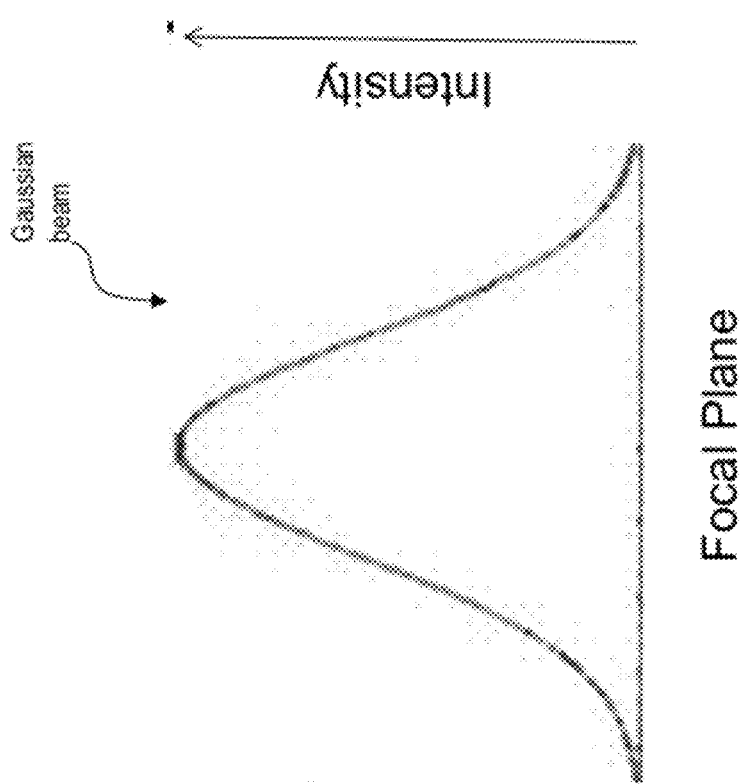

FIGS. 22A and 22B are schematics showing the profile of a Gaussian beam, FIG. 22A, and a flat top beam, FIG. 22B. The beam intensity of the Gaussian beam has a smooth decrease from a maximum at the beam center to the outside of the beam. In contrast, the intensity is "flat" or uniform for the flat top beam through most of its profile (center to outside).

Figure 23:
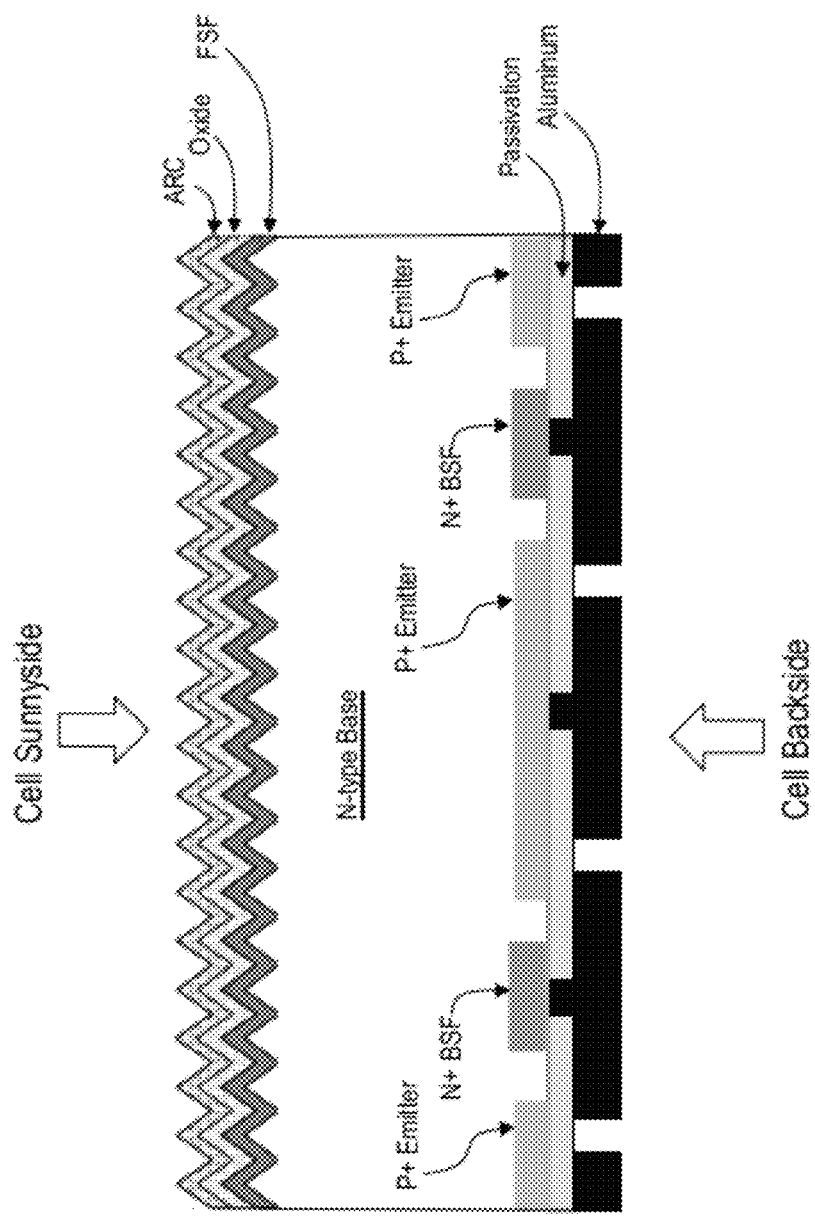

As disclosed herein, high-efficiency back-contacted, back-junction cells with interdigitated back contact (IBC) metallization benefits from the use of at least one or several steps of pulsed laser processing. Laser processing may be utilized in several processing throughout the formation of the back contact cell, including: defining emitter and base regions (or base-to-emitter isolation), defining back-surface field (BSF) regions, doping to form back surface fields, opening contacts in the dielectric to base and emitter, and metal patterning. Some of these steps require laser processing of wide areas that are typically produced by overlapping Gaussian laser beam spots. Overlapping severely reduces cell processing speed and may cause silicon damage, resulting in degradation of cell performance and yield. By replacing smaller diameter Gaussian spots with a relatively wide flat top laser beam, substantial improvement in throughput is obtained. And because the overlapping of spots is dramatically reduced, the semiconductor (e.g., crystalline silicon) substrate damage is reduced significantly. FIGS. 23-25 illustrate embodiments of back contact solar cells that may be formed according to the disclosed flat top laser beam processing methods.

FIG. 23 is a cross-sectional diagram of a back-contact/back-junction cell with interdigitated back-contact (IBC) metallization formed from an n-type substrate, such as that disclosed herein. As shown in FIG. 23, alternating emitter and base regions are separated by relatively lightly n-doped substrate regions (the n-type base). The rear/backside surface is covered by a surface passivation layer that provides good surface passivation with low back surface recombination velocity, made of, for example: thermal silicon dioxide, deposited silicon dioxide, or silicon oxide/silicon nitride layers which may be deposited using techniques such as PECVD or APCVD (and/or aluminum oxide deposited by atomic layer deposition or ALD). This surface passivation process may then be followed by making openings in this passivation layer which act as 'localized contacts' to the emitter and base regions. Then conductor deposition and patterning (e.g., aluminum as shown in FIG. 23) may be performed to separately connect the emitter and base regions.

Figure 24A:
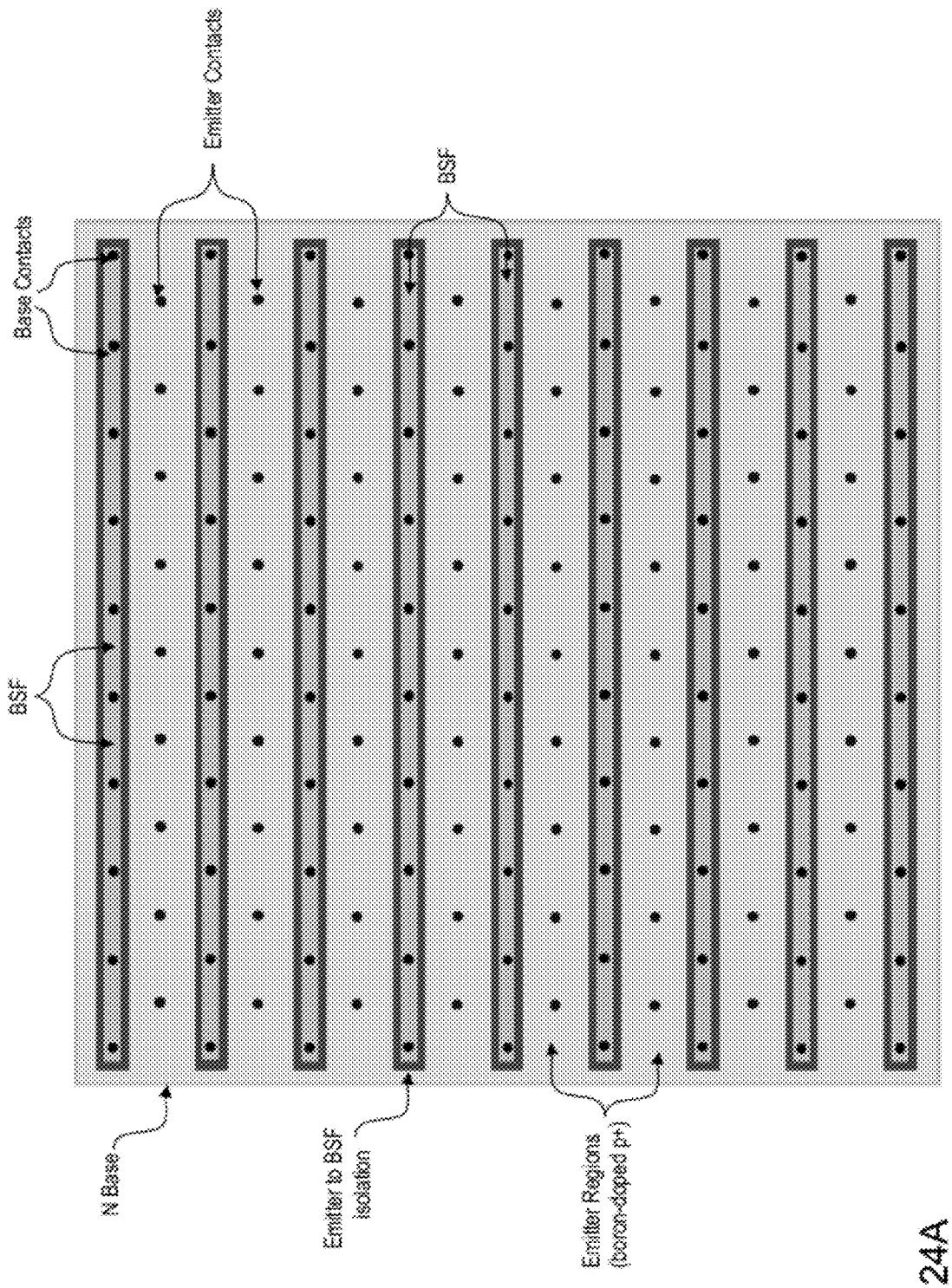
FIGS. 24A-24F are rear/backside views of a back contact solar cell during fabrication.
Figure 25:
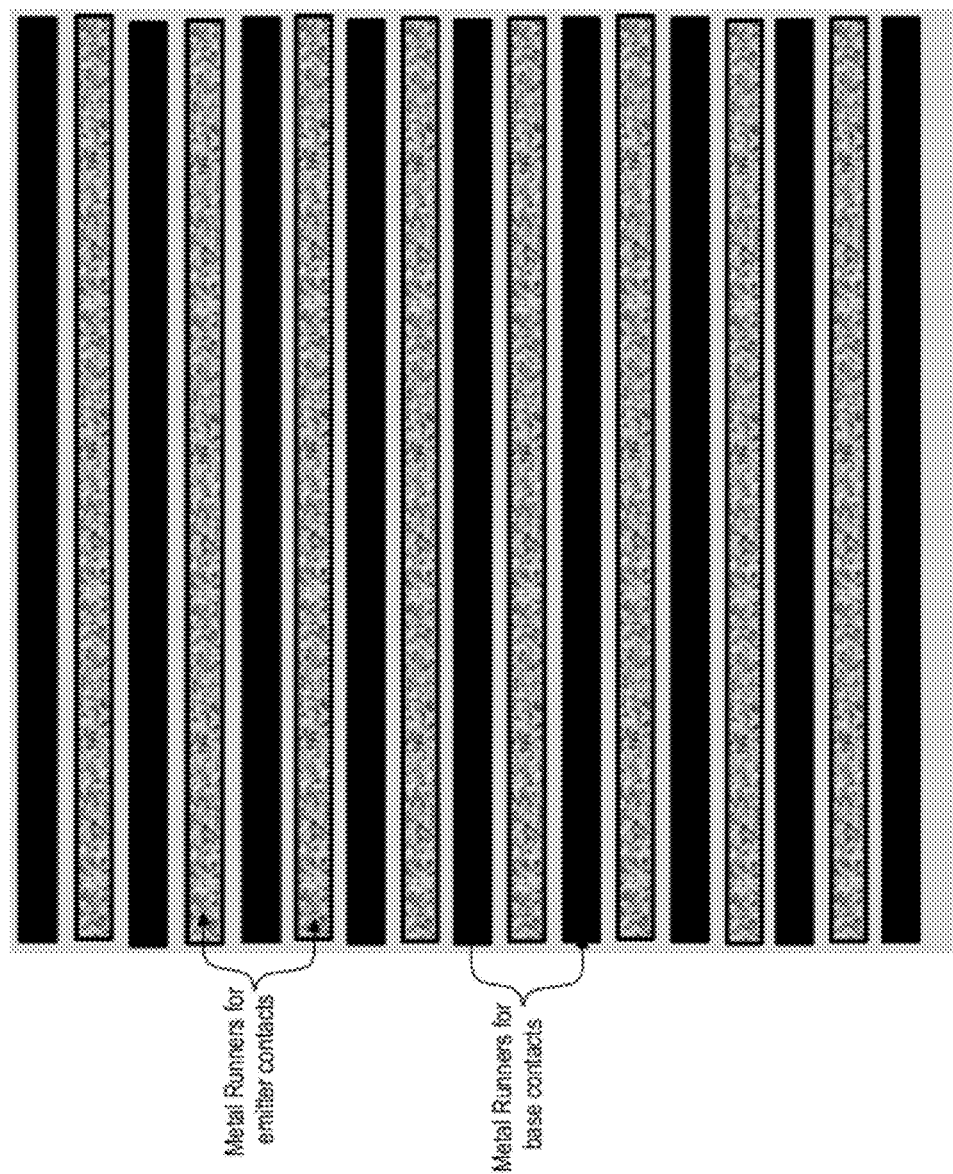

FIG. 24A is a rear/backside view of a back contact solar cell illustrating an interdigitated back contact base and emitter design with the emitter and base regions laid out in alternating parallel rows. This backside may be formed, for example, by starting with a surface that is completely covered by an emitter region, then delineating a base region resulting in the formation of the patterned emitter regions. Then doping base contact regions with phosphorous is carried out and contacts are opened to the base and emitter regions in preparation for metallization.

Figure 24B:
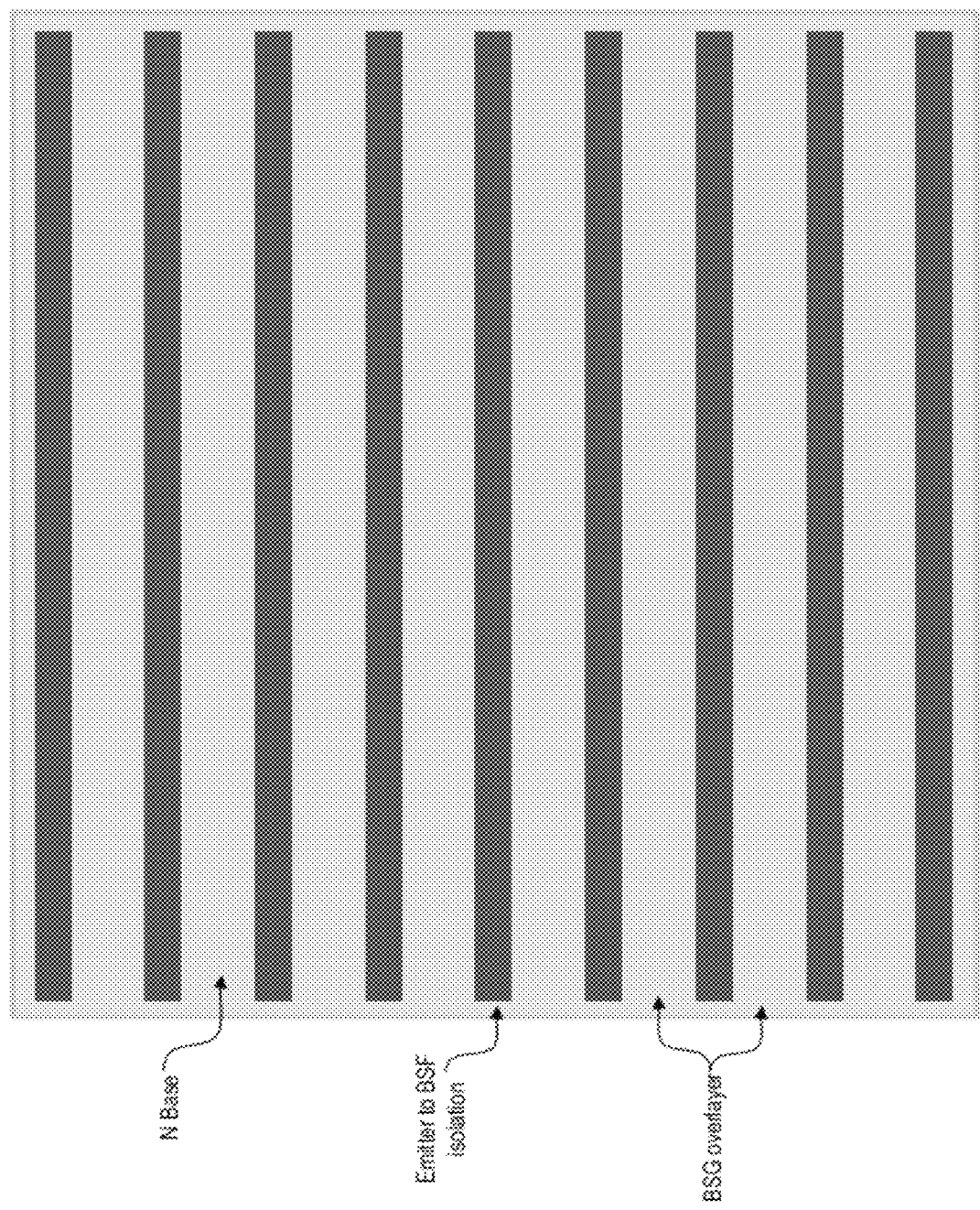

FIGS. 24B-24F are rear/backside views of a back contact solar cell illustrating the back contact cell after key processing steps, wherein any one step or combination of steps may be performed according to a laser process which may or may not utilize a flat top beam. The various laser patterning steps of this particular exemplary method are outlined in FIGS. 24B-24E. Starting with an n-type silicon substrate, a BSG layer is deposited over the whole surface. Next, the emitter to BSF isolation region is defined using laser ablation of the BSG as shown in FIG. 24B. This step, the delineation of base and emitter regions, is referred to herein as the "BSG Opening" step. Alternatively, an in-situ boron doped layer may be deposited during silicon epitaxy and the BSF region defined using laser ablation of silicon.

Figure 24C:
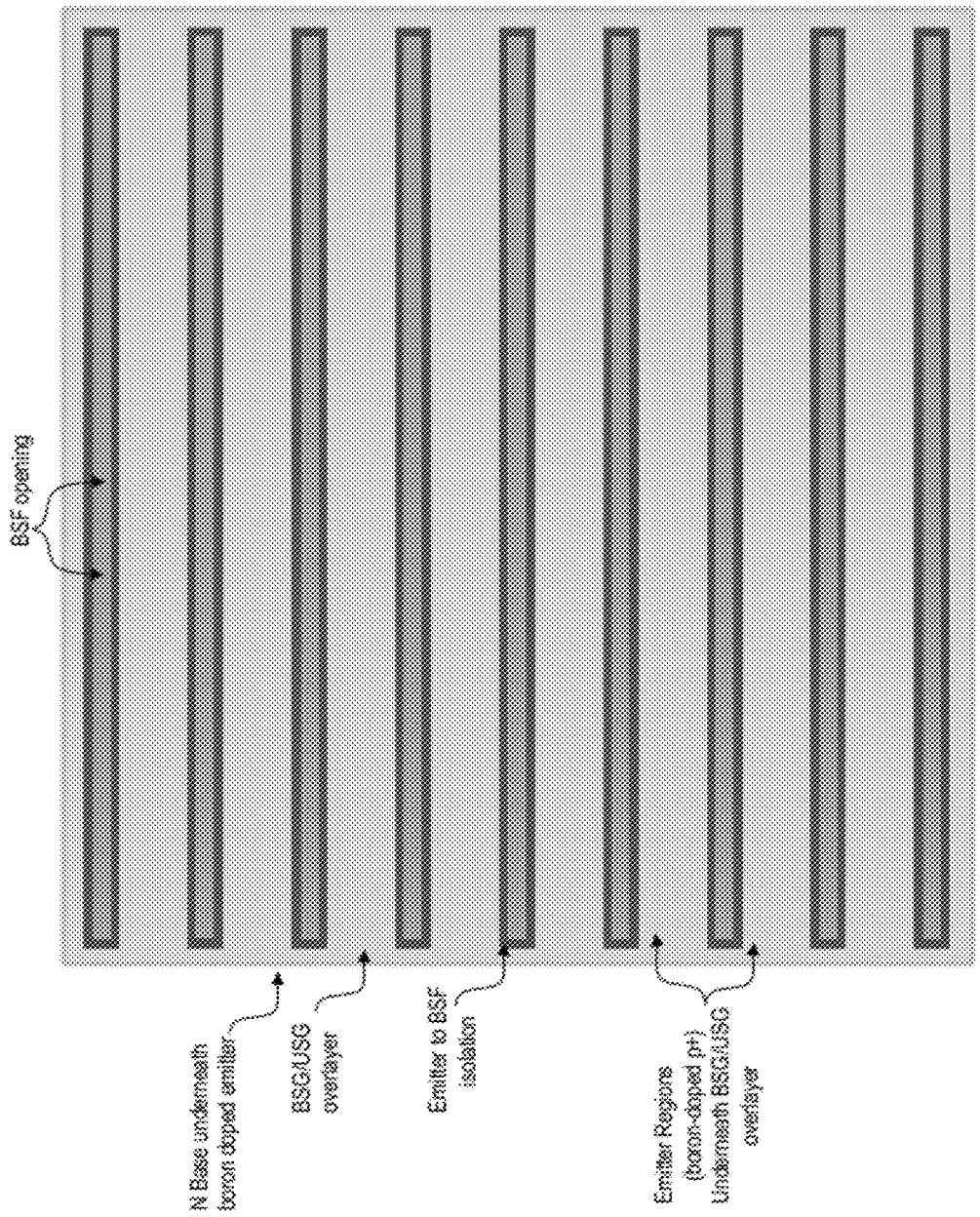
Figure 24D:
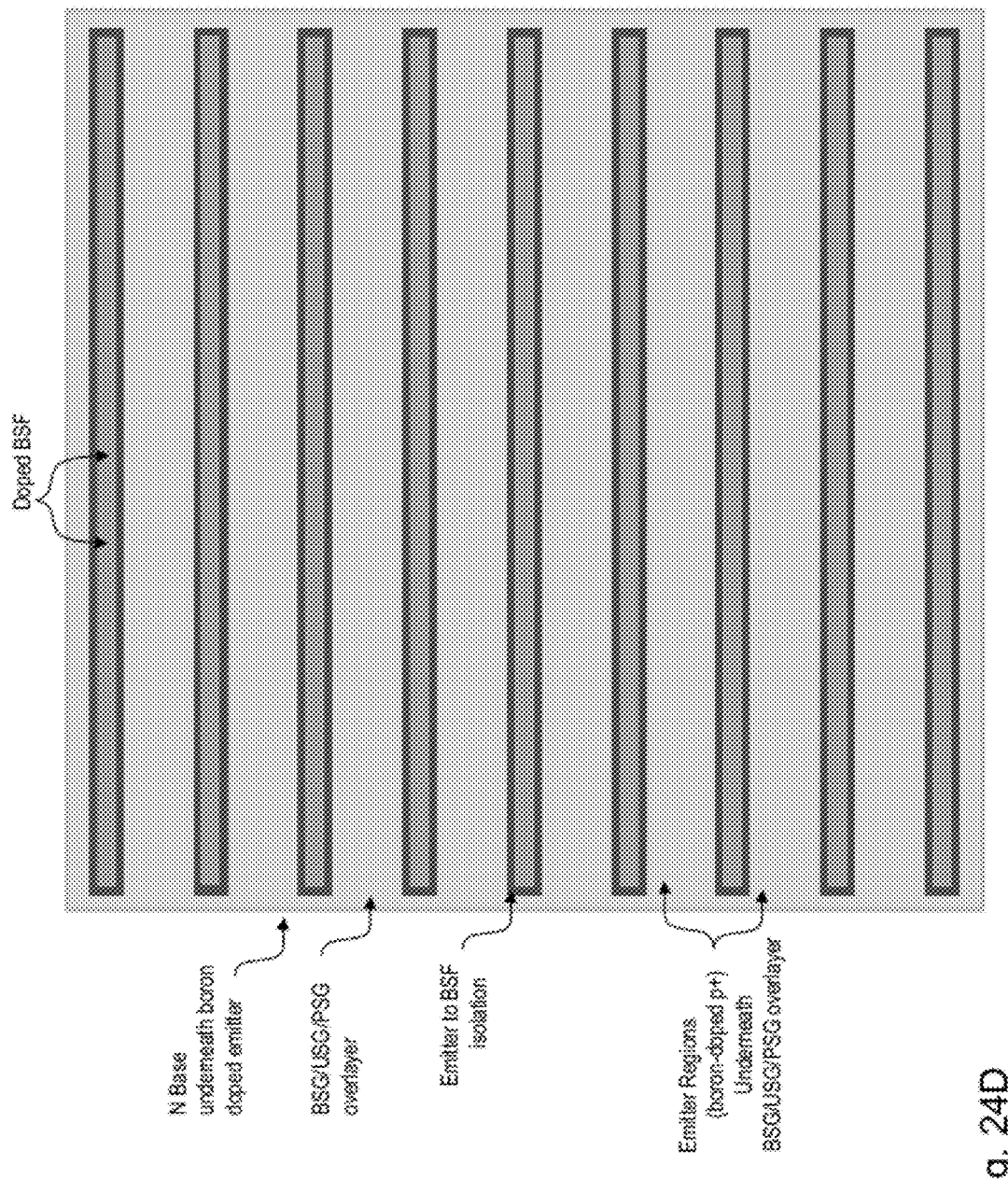

After the emitter to BSF isolation region is defined in the BSG Open step, a USG layer is deposited on the wafer followed by laser ablation of this layer in patterns that are inlaid to the BSG Open region, as shown in FIG. 24C. This patterning step is referred to herein as the BSF Opening step or base opening step. The BSF openings should be isolated from the edges of the BSG Openings to prevent shunt formation as shunts are deleterious to the solar cell efficiency.

Figure 24E:
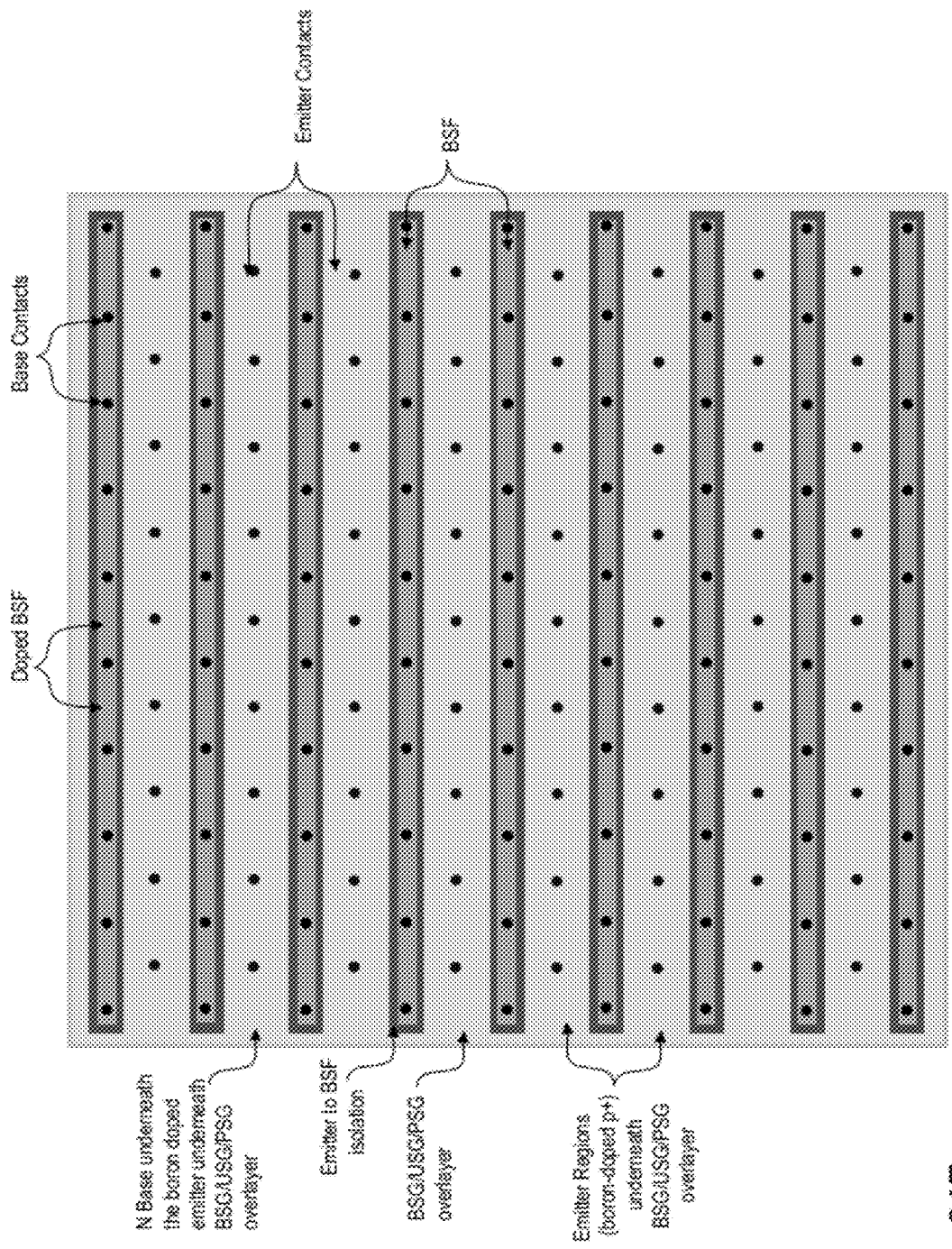
Figure 24F:
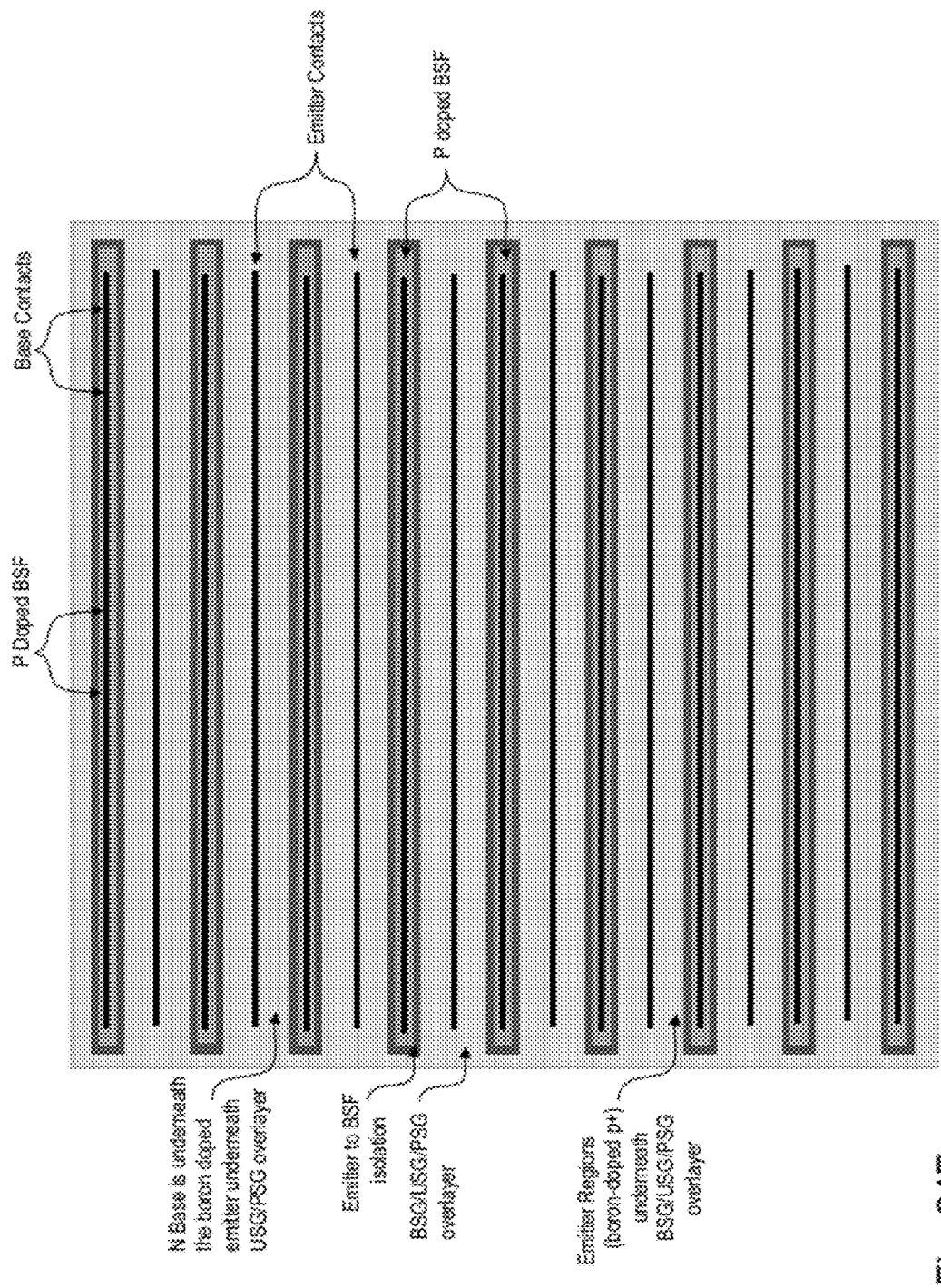

Next, a PSG layer is deposited on the wafer and the silicon exposed to PSG in the BSF opening is doped using selective laser scans of this area. The doped BSF regions (base regions) are outlined in FIG. 24D Next, the contacts to base and emitter are made using laser ablation as shown in FIG. 24E. It should be noted that the contacts may be point contacts as shown in FIG. 24E or line contacts as shown in FIG. 24F. Also, the number of contacts or the number of lines should be optimized for minimum series resistance of the current conduction path for the solar cell—thus the designs and methods of the disclosed subject matter are not limited to the exemplary embodiments shown herein. It is also important that the contact openings are properly aligned inside the particular doped area so that there is no current leakage.

As disclosed previously, a picoseconds pulse length laser may be used for oxide ablation processes of BSG open, BSF opening, and contact opening, although a nanoseconds pulse length laser may also be used. Further, although IR wavelength may be used, green or UV or smaller wavelengths are more suitable because of their reduced penetration into silicon.

For BSF doping particularly, a nanoseconds pulse length laser may be more suitable because of its penetration into silicon. And although IR wavelength may be used, green wavelength, because of its reduced penetration compared to IR, may be more suitable for the depth of doping typically desired.

FIG. 25 is a rear/backside view of the back contact solar cell of FIG. 24A with alternating metal lines contacting the emitter and base regions. Note that the metal lines for the emitter and base regions are separately connected to busbars not shown in FIG. 25 for simplicity of the figure. This metal pattern may be formed by blanket deposition of a metal followed by laser ablation of the metal to isolate base contacts from emitter contacts. Because relatively thick metal lines are required for good current conduction (usually lines 20 µm thick or thicker), a thinner metal stack such as aluminum/nickel-vanadium/Tin may be first deposited and patterned by lasers, followed by the selective deposition of a thicker metal such as copper using electro or electroless plating. Alternatively, a backplane with relatively thick conductors may be applied and attached to the cell with thin conductor lines. A picoseconds pulse length laser with IR wavelength may be most suitable for ablating the metal stack with good selectivity to the underlying oxide layer.

The disclosed flat top laser beam processing steps that may be utilized to make this structure possible include, but are not limited to: delineation of emitter and base regions (BSF and emitter to BSF isolation) by laser ablation of an emitter or deposited boron doping dielectric (such as boro-silicate glass BSG deposited by APCVD); delineation of the BSF region by opening the dielectric covering the opening made in the BSG; N+ doping of the base (e.g., with phosphorus); opening of metallization contacts to base and emitter regions; and metal patterning using metal laser ablation to isolate base and emitter contacts. FIGS. 26A-26C are diagrams illustrating three ways a flat-top beam profile may be created (diagrams reproduced from F. M. Dickey and S. C. Holswade, "Laser Beam Shaping: Theory and Techniques", Mercel Dekker Inc., NY, which is hereby incorporated by reference in its entirety). FIG. 26A illustrates one technique for creating a flat top beam profile, the so—called "aperturing of the beam." Using this method, the Gaussian beam is made flatter by expanding it and an aperture is used to select a reasonable flat portion of the beam and to cut-out the gradually decreasing 'sidewall' areas of the beam. Using this method, however, may cause a significant loss of beam power.

A second example method for creating a flat top beam, as shown FIG. 26B, uses beam integration wherein multiple-aperture optical elements, such as a micro-lens array, break the beam into many smaller beams and recombine them at a fixed plane. This beam integration method may work very well with beams of high $M^2$ value.

A third beam shaping system for creating a flat top beam, as shown FIG. 26C, uses a diffractive grating or a refractive lens to redistribute the energy and map it to the output plane. Any known method, including the three example techniques disclosed in FIGS. 26A-26C, may be used obtain the flat top beam profile for applications described herein. The suitability and choice of a flat top laser beam formation method depends on a variety of factors including the available beam characteristics and the results desired.

Figure 27B:
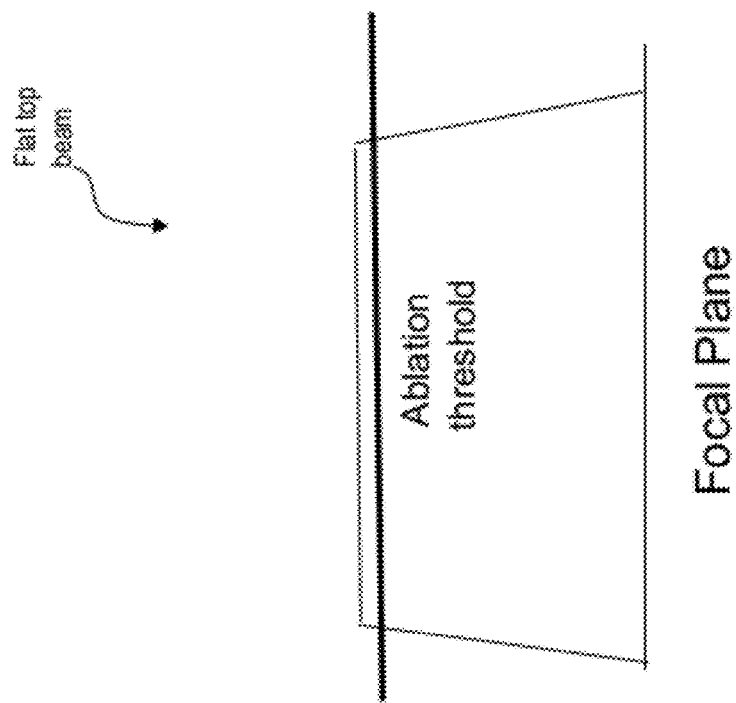
FIGS. 27A and 27B are schematics showing the profile of a Gaussian beam and a flat top beam highlighting the ablation threshold.
Figure 27A:
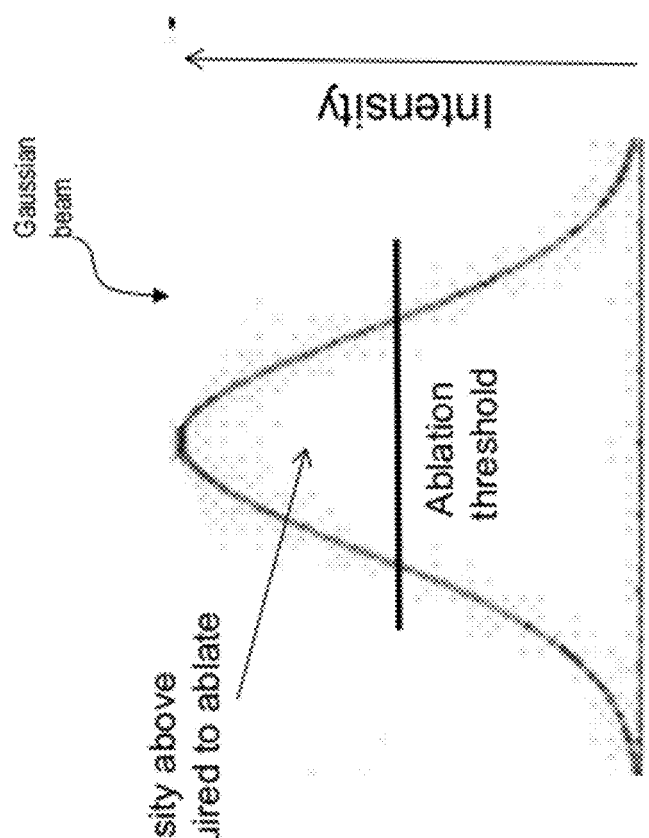

FIGS. 27A and 27B are schematics showing the profile of a Gaussian beam and a flat top beam highlighting the ablation threshold. As shown in FIGS. 27A and 27B, a flat top laser beam, particularly as compared to a Gaussian beam, can substantially reduce the laser damage during ablation and doping processing. For Gaussian beams there is substantial excessive laser intensity above that required for ablation, particularly in the center of the beam, that can cause damage of silicon (as shown in FIG. 27A). The flat top beam can be configured so the peak intensity is only slightly above that required to ablate the material (the ablation threshold as shown in FIG. 27B) and the damage that may be caused by the high intensity of the Gaussian beam is avoided.

Figure 28A:
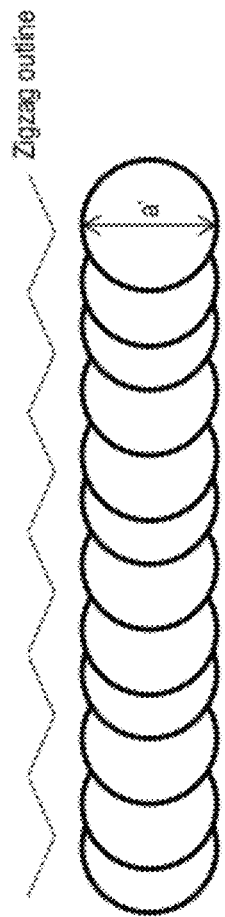
FIGS. 28A and 28B are diagrams showing a Gaussian beam and a flat top beam ablate region profile/footprint, respectively.
Figure 28B:
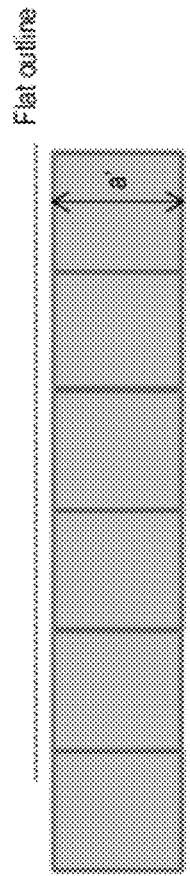
Figure 28C:
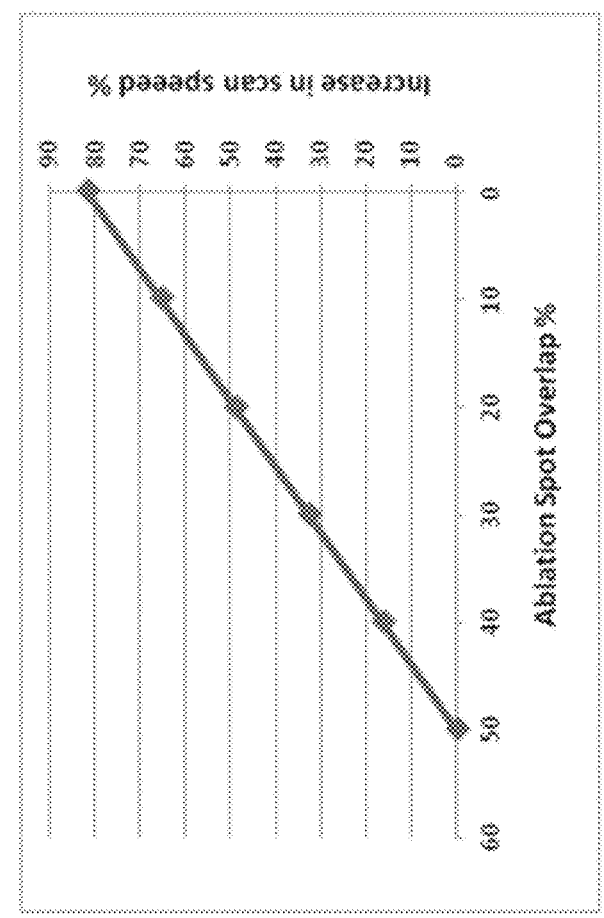
FIG. 28C is a graph of overlap and scan speed.

A flat top beam, whether having a square or rectangular cross section, offers throughput advantages particularly as compared to a Gaussian beam. FIG. 28A is diagram showing a Gaussian beam ablated region profile/footprint. The circular shaped spots of a Gaussian beam are required to overlap substantially to the minimize the zigzag outline of the pattern, typically as much as 50% overlap (FIG. 28A). FIG. 28B is diagram showing a flat top beam ablate region profile/footprint. Since the square or rectangular flat top beam have flat edges, thus creating a flat outline, the overlap can be significantly reduced (FIG. 28B). FIG. 28C is a graph showing the improvement in scan speed as beam overlap is reduced. Note that even for an overlap of 30%, a scan speed increase of 33% may be realized.

Figure 29A:
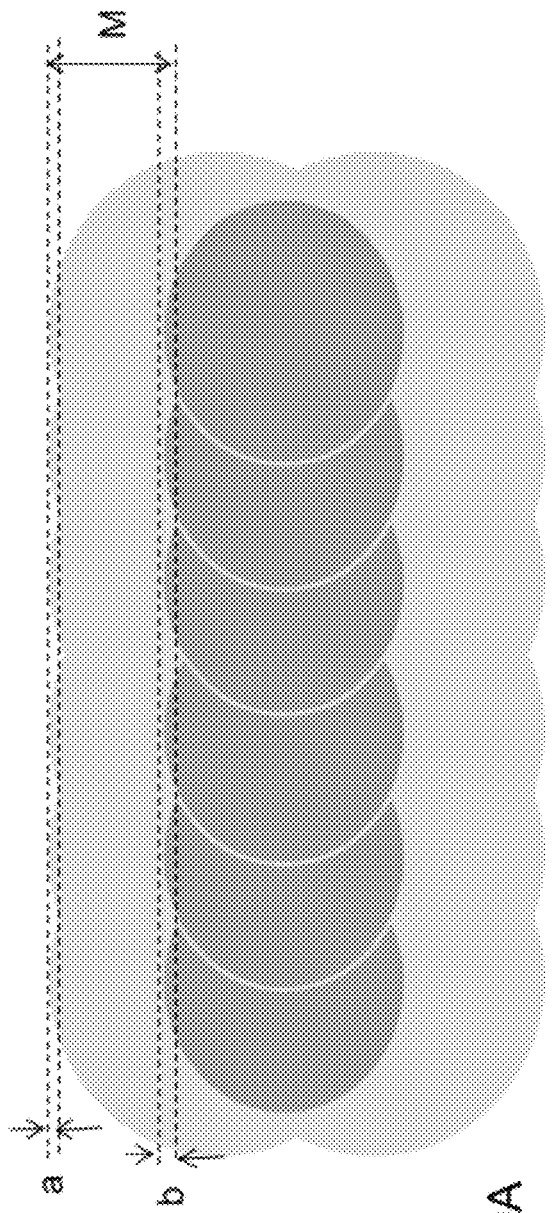
FIGS. 29A and 29B are diagrams illustrating a beam alignment window of a Gassian beam and flat top beam, respectively.
Figure 29B:
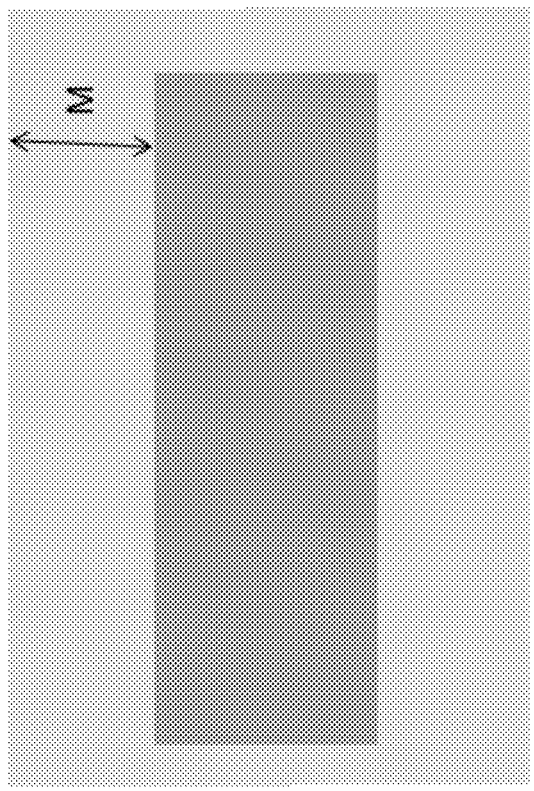

FIG. 29A is a diagram illustrating a beam alignment window of a Gaussian beam and FIG. 29B is a diagram illustrating a beam alignment window of a flat top beam. As can be seen in FIGS. 29A and 29B, yet another advantage of using a flat top beam for making inlaid patterns is the larger alignment window the flap top beam provides. The circular shaped spots obtained from a Gaussian beam create zigzag edges of the ablated regions (FIG. 29A). The alignment margin of M as shown in FIG. 29A is reduced and limited to M-a-b due to the waviness of the zigzag edge profile.

However, the ablation region edges created using a flat top beam are straight allowing the alignment margin to stay at M. For the back contact back junction solar cells described herein, BSF openings are formed inside the BSG Open regions, and contact openings are formed inside the BSF region. Hence, a larger alignment margin is important as it allows for smaller BGS Open, BSF, and contact regions. Thus reducing the electrical shading and improving solar cell performance.

Since the overlap of square or rectangular flat top beam can be reduced in both x and y direction while making a large area ablation or doping, the throughput is significantly enhanced. Also, since the size of the square or rectangular flat top can be increased without causing excessive zigzagging of the perimeter, throughput is further increased. Table 1 shows the reduction in the number of scans needed to open a 150 um wide line, such as used for delineating the base area by ablating the BSG film.

Table 1 below shows the throughput of Gaussian vs. Flat Top laser beams for creating a 90 µm wide base opening. The results of Table 1 are shown graphically in FIG. 29E.

TABLE 1

| PROCESS | Width of line (um) | Spot Size (um) | Overlap % | Pitch of scans (um) | Number of scans per line |
|---|---|---|---|---|---|
| BSG Ablation with Gaussian | 150 | 30 | 50 | 15 | 9 |
| BSG Ablation with Flat Top | 150 | 30 | 20 | 24 | 6 |
| BSG Ablation with Flat Top | 150 | 60 | 20 | 48 | 3 |

FIG. 29E shows the throughput advantage of flat top beams (the 60 µm flat top beam region profile is depicted in FIG. 29D) as compared to the Gaussian beam (the 30 µm flat top beam region profile is depicted in FIG. 29C), for a high productivity laser system that can process four wafers at a time. To further reduce cost, for example, two lasers may be utilized with each laser beam further split into two. However, many variations of this flat top laser beam hardware and fabrication scheme are possible.

Also, because overlap is significantly reduced in both x and y directions when using a flat top beam, the laser induced damage of silicon is greatly reduced as compared to the Gaussian beam.

Similar throughput advantages may also result when utilizing a flat top beam for opening the oxide region for BSF, doping the BSF region using the overlying PSG, forming base and metal contact openings if they are line contacts, and the metal ablation isolation lines—all with the concurrent advantage of reduced silicon damage. Additionally, utilizing a flat top beam provides the advantage of increased alignment window for BSF opening inside the BSG opening and contact opening inside the BSF. Flat top laser processing methods may also increase throughput for forming a back surface field. For example, the back surface field may be formed by doping the base region, opened as described, with an n-type dopant such as phosphorous. For this process the base is covered with a phosphorus-doped silicon oxide (PSG) layer and the doping may be performed by irradiating this region with a laser beam. While uniformly doping this region using Gaussian laser beams requires overlapping, overlapping is minimized or may be completely reduced using a flat top beam. And as with the base and emitter region delineation and back surface field delineation described herein, utilizing a flat top laser beam provides a substantial throughput and reduced damage advantage as required overlapping is decreased. It should be noted that for forming a back surface field, the beam need to be flat top beam only in one direction—normal to the scan, whereas it may be Gaussian in the direction of the scan. This type of beam is called a hybrid flat top beam.

Importantly, for forming isolated base or emitter contacts, although overlap is not an issue, the silicon damage is still reduced using a flat top beam because of the absence, unlike Gaussian, of a high intensity peak in the center of the beam (as shown in FIGS. 27A and 27B).

Another aspect of this disclosure relates to the use of laser annealing to improve the conversion efficiency performance of crystalline semiconductor solar cells in general, and crystalline silicon solar cells in particular, by improving the passivation properties of dielectric-coated surfaces, and more specifically silicon nitride (SiN)-coated surfaces. The improved front surface passivation properties are manifested as reduced Front-Surface Recombination Velocity (or reduced FSRV) and increased effective minority carrier lifetime. This technique is especially advantageous for high-efficiency back-junction, back-contacted cells with interdigitated metallization (IBC) where annealing of SiN-coated front surface may also be used to concurrently result in the annealing of emitter and base metal contacts on the solar cell back surface, thereby, lowering the specific contact resistivity and improving the solar cell fill factor (FF). The laser annealing methods of this disclosure are applicable to crystalline semiconductor solar cells using semiconductor absorber layers over a wide range of thicknesses, i.e., thick wafer-based solar cells such as crystalline silicon wafer solar cells with wafer thicknesses of 10's to 100's of microns. Moreover and more specifically, the non-contact laser annealing process and methods of this disclosure are applicable to extremely thin (e.g., crystalline semiconductor layers from a few microns to ~50 microns thick) crystalline silicon solar cells where unsupported cell mechanical handling can result in cell breakage. It is also an in-line replacement for the batch furnace annealing processes. The laser annealing process and methods can be used as the last step in the cell manufacturing process flow or immediately after deposition of the front-surface passivation and anti-reflection coating (ARC) layer. The processes and methods of this disclosure enable formation of high-quality surface passivation and ARC layers using low-temperature, low-thermal budget deposition processes for passivation & ARC layers such as silicon nitride deposited by low-temperature PECVD.

The passivation of the surface of phosphorous-rich $N^+$ emitter with silicon nitride for standard front contact solar cells with p-type silicon bulk (or p-type base), is well known and widely utilized in the solar industry. While the SiN film acts as an antireflection coating to reduce the optical reflection losses and to increase sunlight trapping, it also serves a very important task of passivating the surface of the phosphorous-rich $N^+$ emitter by the well-known hydrogenation process. The hydrogen released from the hydrogen-containing SiN layer satisfies the open bond on the silicon surface (or silicon dangling bonds causing surface states and traps), thereby reducing the surface recombination velocity or rate of minority carriers by these dangling bond sites. For cells made from multi-crystalline or polycrystalline silicon, this hydrogen provided by the SiN layer further reacts with the impurities and defects in the bulk of the silicon wafer as well as removes the grain boundary trap sites, thereby reducing the overall minority carrier recombination and increasing the effective minority carrier lifetime in the bulk of the material.

The release of hydrogen and hence the surface and bulk passivation of silicon is typically obtained during the so-called "metal firing" process in the standard front-junction/front-contact solar cell manufacturing process flow, currently widely used in the solar cell manufacturing industry. The same screen-printed metal firing process consists of multiple-step heating of the solar cell using a carefully designed temperature and time sequence with a final dwell at about 850-900° C. before a desired cooling sequence. This firing cycle is optimized after careful experimentation. Since hydrogen is a small atom it can diffuse out of the wafer if the wafer temperature is too high or the annealing times are too long. On the other hand, the hydrogen passivation may be unsatisfactory if the temperature is too low or annealing times are too short. Hence, the hydrogen-passivation phenomenon has been a subject of intense investigation and research in the solar cell industry and is considered not just science but also an art by many (since there are still many areas yet to be fully understood). It is clear that a process that can provide a high degree of control is thus desired.

For the standard mainstream front-contact solar cell with p-type silicon bulk (or p-type boron-doped base) and $n^+$ phosphorus-doped emitter, the front contact surface is contacted by silver while the back surface is contacted by aluminum—which may be screen printed as a blanket layer or make selective contacts through openings made in the backside dielectric surface. To obtain low resistance contacts, the intermixing of silver with silicon in the front and aluminum in the back is promoted during the metal firing process that has been described above. Based on the description of the metal firing process above, the practice of obtaining low resistance contacts and hence high FF in the solar cell is complicated. Again, a process that can provide a high degree of control is desired.

Additionally, the all back-contact, back-junction solar cells that use the same metal, aluminum, in contact with both $n^+$ and $p^+$ contacts on the back side cannot be heated too high as the doping of $n^+$ contact by aluminum, a p-type dopant, will increase the contact resistance, thereby lowering the fill factor of the cell. Moreover, overheating of aluminum much above 450° C. can result in degradation of optical reflectance of aluminum (and thus increased optical losses of the infrared photons in the cell). A controlled low-temperature heating, preferably in the range of 200-450° C., of the contacts where aluminum makes intimate contact with silicon by reducing and absorbing the oxide at the silicon surface, is highly desirable.

We disclose here a process where the front surface or sunnyside of the solar cell is substantially uniformly or in selected areas irradiated with the laser beam, selectively heating the semiconductor (e.g., silicon) such that hydrogen atoms are released from SiN thereby effectively passivating the silicon surface, reducing the surface state density, reducing the front-surface recombination velocity (FSRV), and increasing the effective minority carrier lifetime of the solar cell. The processes and methods of this disclosure may also reduce the bulk trap density and enhance the bulk minority carrier lifetime. One embodiment of the disclosed method is based on using a pulsed laser source with a wavelength smaller than that of the semiconductor (e.g., silicon) bandgap. In this embodiment (for instance, using a pulsed green or UV laser source for crystalline silicon surface annealing), the front-surface is selectively heated using pulsed laser source irradiation, while the backside of the cell remains substantially cooler than the frontside of the cell. Another embodiment of the disclosed method is based on using a pulsed laser source with a wavelength near to or larger than that of the semiconductor bandgap. In this embodiment (for instance, using a pulsed IR laser source for crystalline silicon surface annealing) while the front-surface is heated using pulsed laser source irradiation, the backside of the cell is also heated and annealed. Using this alternative embodiment, at the same time the laser beam penetrates to the back of the solar cell heating the Al/silicon contacts to decrease the contact resistance and to improve the overall cell fill factor and efficiency. The laser annealing process and methods of this disclosure may be performed at the end of the solar cell fabrication process flow or immediately after formation of the passivation/ARC layer and before the cells are tested and sorted for module packaging. Alternatively, the laser annealing process and methods of this disclosure may be performed after assembling and packaging the cells in a PV module and through the front glass cover of the module assembly. In this case wavelengths need to be used that can go through the glass, such as infrared.

It is important that the laser anneal process should be optimized (including the laser source wavelength, pulse width, power, etc.) such that the passivation layer (e.g., the PECVD SiN layer) is not degraded during this process so that the sunlight can pass through this antireflection coating without significant optical absorption losses. Also, the surface texture should not be affected so that the light trapping is not reduced. It is clear that the type of the pulsed laser source and the laser process parameters should be carefully chosen to meet all these requirements.

The laser pulse length should be long enough so that there is no non-linear optical interaction with the passivation/ARC layer (e.g., SiN layer) so that the passivation/ARC layer) is unaffected. Although, lasers with pulse length from 1 nanosecond to microseconds or continuous wave can be used for this application, the choice depends on the depth to which the heat penetration is desired. Using shorter pulse length the heat is limited to shallow depths. Wavelength also should be chosen based upon the depth of semiconductor (e.g., crystalline silicon) that is required to be heated. For applications to single crystal solar cells where only front surface passivation is required to be improved, green wavelength may be more suitable. For applications where improved bulk silicon passivation is required and/or back contact annealing is desired, IR wavelength may be more suited. It should be clear that based on the desired application a range of laser pulse length and wavelengths can be used.

Processes for back contacted cells with interdigitated metallization, called NBLAC cells, have been described in related applications (see, e.g., U.S. patent application Ser. No. 13/057,104).

Figure 30:
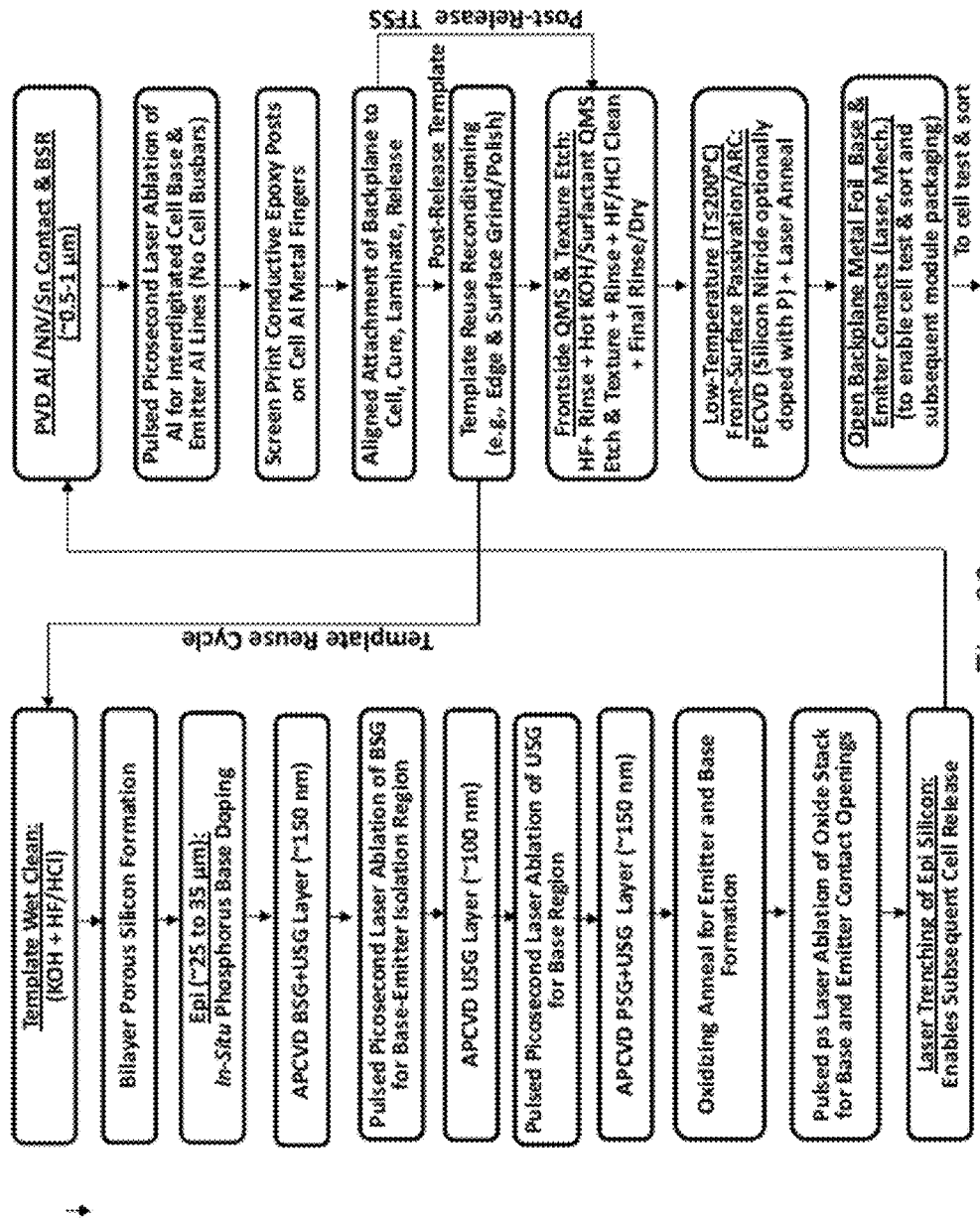
Figure 31:
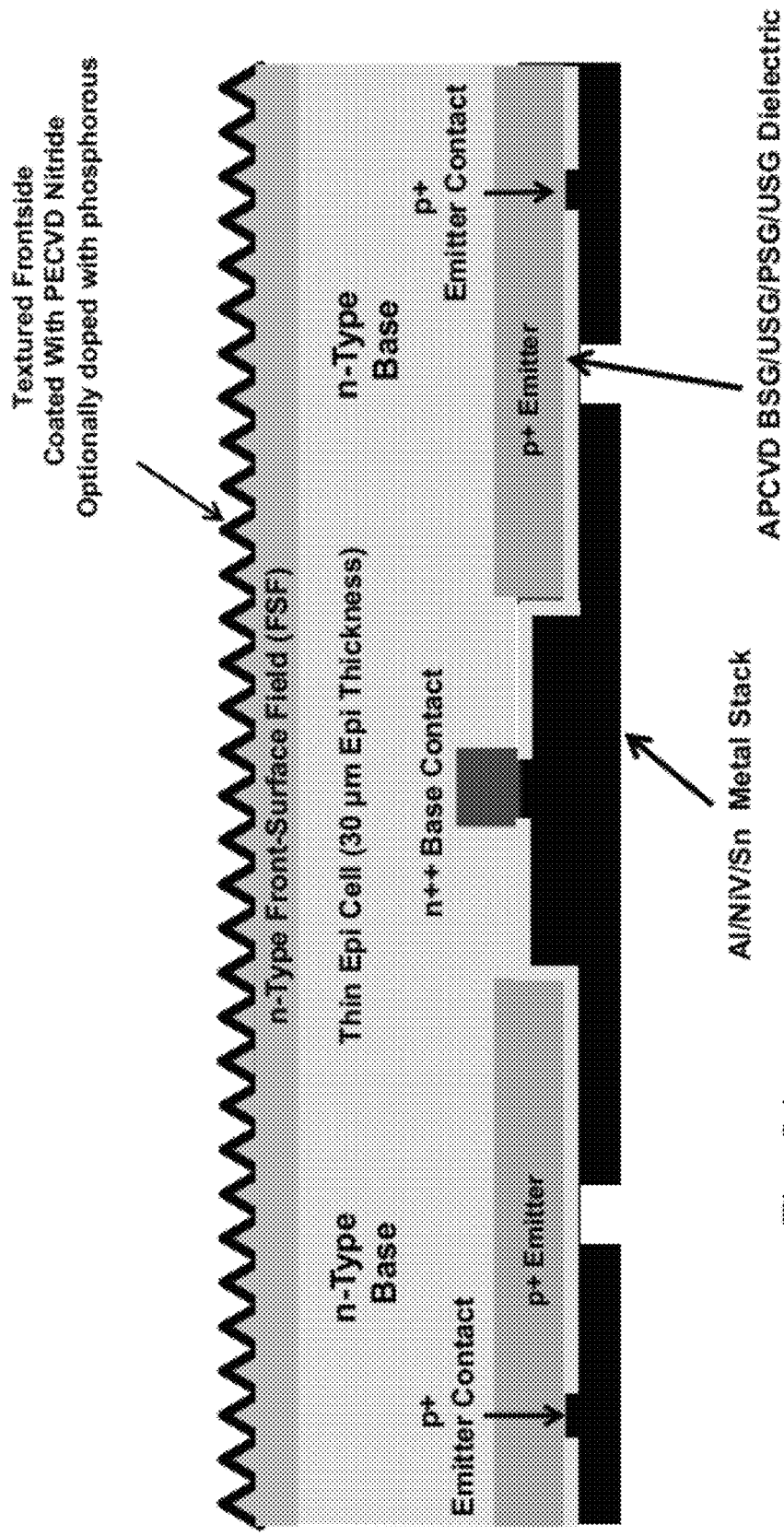
FIG. 31 shows a schematic cross section of an NBLAC cell.

FIG. 30 outlines one of the embodiments of the NBLAC process flow, while FIG. 31 is the schematic of the cross section of the cell (the backplane is not shown for clarity). The low-temperature front-surface passivation/ARC: PECVD (silicon nitride)+laser anneal process step in FIG. 30 involves the deposition of SiN at lower temperatures than is used in the industry (<350 C). The surface is then subjected to pulsed laser irradiation causing preferential silicon frontside annealing that results in improved passivation of the silicon surface with hydrogen from the SiN. In particular, the laser annealing processes and methods of this invention enable formation of high-quality passivation and ARC layers (like single layer SiN and bilayer SiN with amorphous silicon) deposited at low temperature as low as 90° C., and more typically in the deposition temperature range of 90° C. to 250° C.

In some embodiments, the SiN being annealed may contain a desired amount of phosphorus dopant. In this case, the annealing step also causes silicon doping with phosphorus. This process is discussed in connection with FIG. 36 below.

Besides SiN, silicon oxynitride ($Si_xO_yN_z$), or silicon carbide ($Si_xC_y$) single layers or a bilayer stack with SiN on amorphous silicon ($\alpha$-Si), a bilayer stack with SiN on silicon oxide ($SiO_2$), or a bilayer stack with SiN on silicon oxynitride, can also be used for silicon surface passivation. For example, it is known that an amorphous silicon layer can passivate the silicon surface quite well. However, for the current industrial process, significant surface cleaning of silicon and process optimization of the $\alpha$-Si deposition process is required. Laser annealing of $\alpha$-Si films covered with hydrogenated SiN can activate the hydrogen in SiN and lead to dramatic enhancement of passivation, as measured by substantially increased effective minority carrier lifetime and substantially reduced front-surface recombination velocity.

The PVD Al/NiV/Sn contact & backside reinforcement BSR step and the pulsed picosecond laser ablation of Al for interdigitated cell base & emitter Al lines step in FIG. 30 form the metal contacts to the base and emitter on the back surface of the solar cell. These contacts are shown in the cross section in FIG. 31. It should clear that the laser beam that penetrates to the back of the silicon film will concurrently anneal the back contacts, resulting in reduced contact resistance and increased fill factor of the solar cell.

Figure 32:
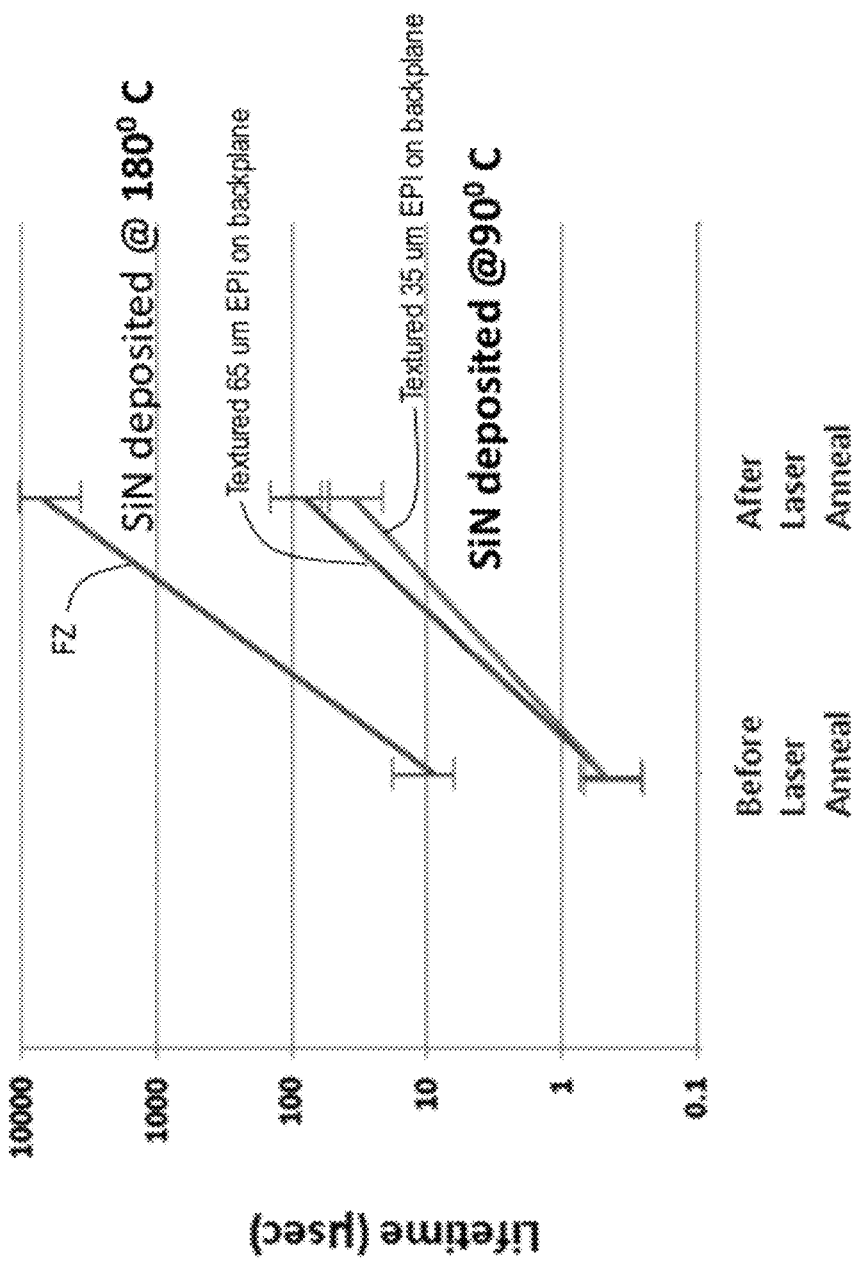
FIG. 32 shows a graph of minority carrier lifetime with and without laser annealing.

Results obtained using laser annealing are shown in FIG. 32. It is seen that up to 100 times effective lifetime improvement is obtained on low-temperature-deposited passivation layer of SiN without resorting to high temperature metal firing. In the NBLAC process the thin epitaxial silicon is supported on a backplane. In case this backplane cannot withstand a high temperature, the SiN deposition temperature is reduced to facilitate thin epitaxial/backplane assembly processing and process integration accommodating the heat sensitive backplane assembly. For such heat sensitive backplanes the laser annealing is highly suitable since with a suitable selection of laser pulse length and wavelength, the heat can be limited to the front side of the silicon while keeping the backside of the silicon within the acceptable value for the backplane.

The non-contact laser annealing process is highly suitable for NBLAC cells that use epitaxial films having thickness approximately in the range of a few to 50 microns, which are fragile to handle.

For enhanced throughput and improved process control, the laser source used for these applications may have top-hat profile (with relatively uniform beam power over at least 100 micron or more) in order to reduce the overall surface irradiation scan time. This also eliminates the chance of damage in beam overlapping areas.

This laser annealing process is an attractive alternative to furnace annealing as it can be an in-line cost effective process.

According to another aspect of the present disclosure, the selective laser ablation and patterning of electrically insulating layers, such as thermally grown or chemical-vapor-deposited silicon oxide on silicon is used in crystalline silicon solar cell process flows for obtaining relatively high cell efficiency values. In such applications it is advantageous that no or at most negligible damage is introduced in the underlying silicon substrate, since any substantial ablation-induced damage can lead to increased minority carrier recombination loss, resulting in further loss of cell conversion efficiency. We present here a novel scheme that ensures that the solar cell semiconductor (e.g., silicon) surface will not be damaged during the pattern-selective ablation of the dielectric (e.g., silicon oxide) overlayers. This disclosure involves introducing a thin intermediate layer of silicon that stops the laser beam from reaching the silicon substrate. This thin intermediate silicon layer may be placed closer to the underlying silicon surface, separated only with a thin buffer layer of silicon oxide. The layer of oxide above this intermediate silicon layer is ablated by the laser beam interacting and separating the silicon oxide-intermediate silicon layer interface. A very thin (for example, 3 nm to 100 nm or in some embodiments 3 to 30 nm) layer of silicon oxide under this intermediate silicon layer prevents any significant damage-causing effect of laser action at this interface from reaching the silicon substrate. The intermediate silicon layer is subsequently oxidized (using either a thermal oxidation process or an oxidizing anneal process), thereby eliminating any unwanted interaction in subsequent laser processing. This scheme is particularly suited for application in an all-back-contact back-junction solar cell design where laser ablation of dielectric layers such as silicon oxide is utilized several times, such as the NBLAC solar cell.

In one embodiment of a process flow, the oxide ablation process is used three times to form oxide patterns, namely BSG (or BSG/USG stack) ablation to delineate emitter and base regions, USG (or PSG/USG stack) ablation to define the base regions, and finally ablation of PSG (phosphosilicate glass—oxide) to open contacts to base and the ablation of BSG/USG/PSG ablation to open contacts to the emitter regions. The technique described herein can be advantageously used in the first step of ablation of the BSG layer to define the patterned emitter and base regions (for solar cells using n-type base). If desired, this technique can be further used during the ablation of USG for defining the openings for $N^+$ base regions. (These polarities would be reversed for solar cells using p-type base.)

Figures 33A, 33B:
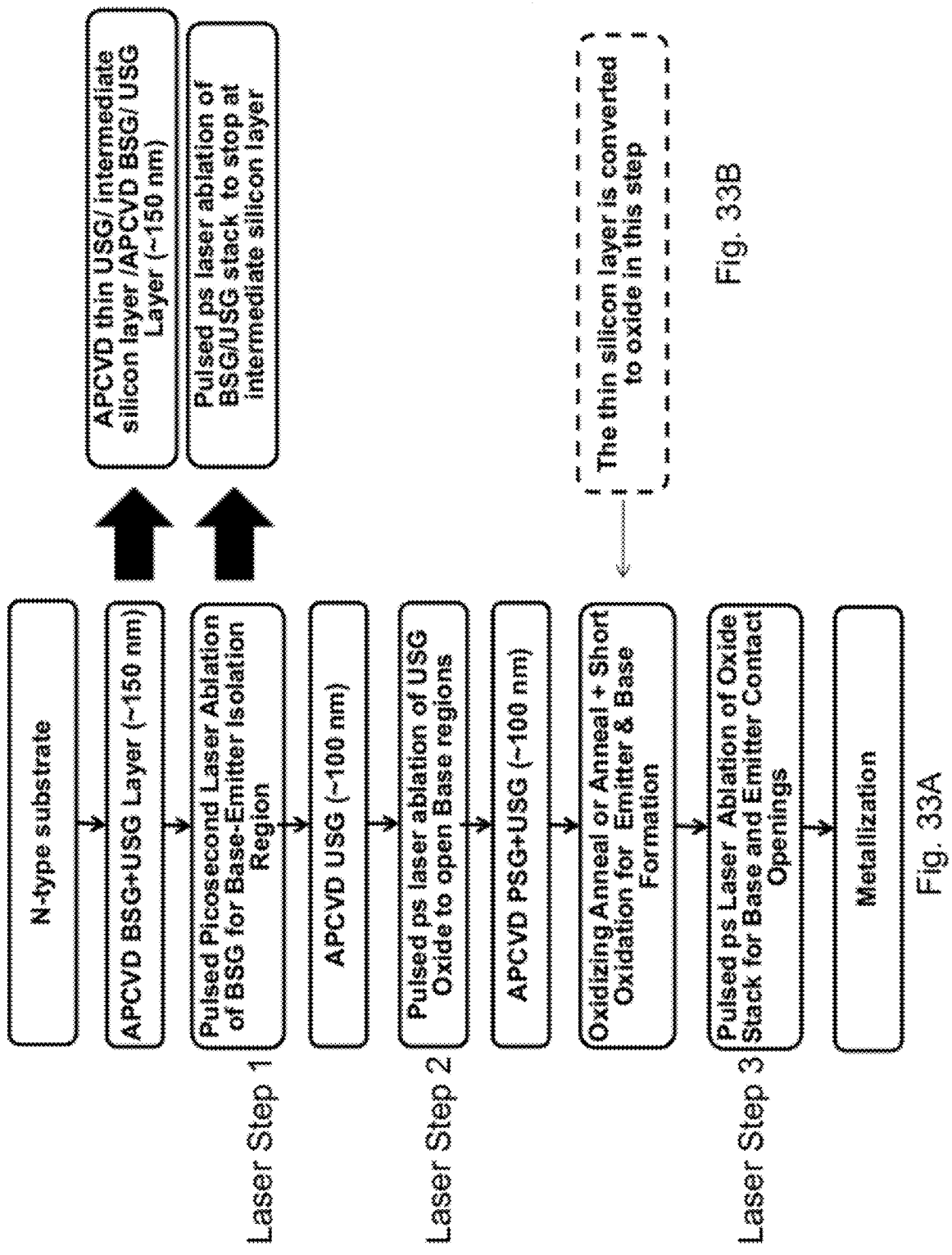
FIGS. 33A and 33B show process flows for all back contact solar cells with oxide ablation.

FIG. 33A shows a process flow for an all back contact solar cell that involves oxide ablation at three different steps. FIG. 33B shows the slight modification to the BSG/USG (USG is undoped silicate glass or undoped silicon oxide) deposition step where a very thin $\alpha$-Si layer is deposited on top of a thin USG layer (in some embodiments in situ within the same APCVD BSG deposition equipment) before the deposition of the remaining BSG/USG stack. During the laser ablation process, the laser beam separates the BSG/α-Si interface, thereby removing the BSG/USG stack. This thin layer of silicon is oxidized during the subsequent steps as described in FIG. 33B.

Figures 33C, 33D:
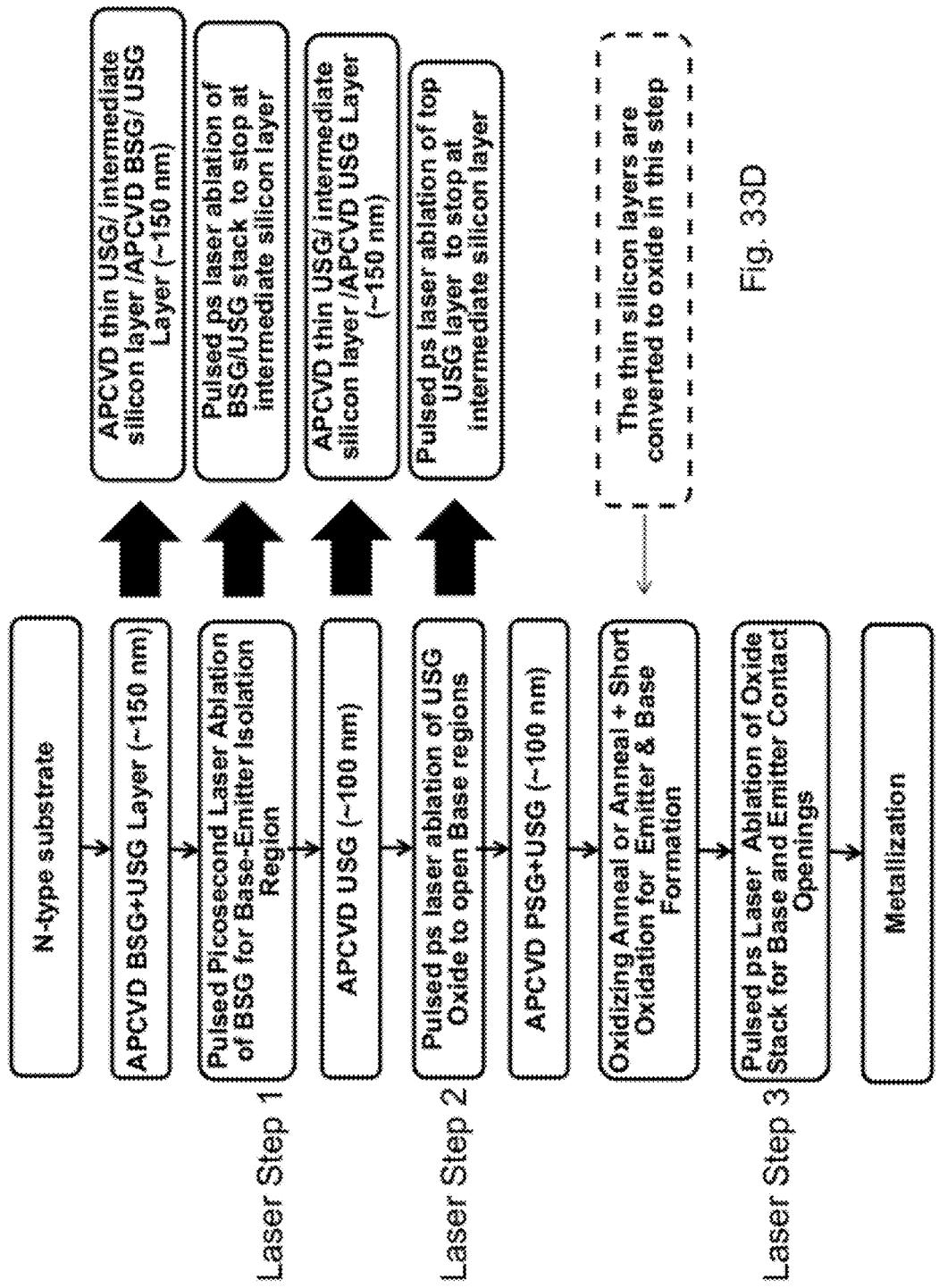
FIGS. 33C and 33D show process flows for all back contact solar cells with oxide ablation.

FIGS. 33C and 33D show a further modification to the process flow of FIGS. 33A and 33B, where the USG deposition step is modified to include the deposition of the very thin α-Si layer on top of a very thin USG layer before the deposition of the thicker USG layer. During the laser ablation the laser beam separates the top USG/α-Si layer, thereby removing the top USG layer. As before, this thin layer of silicon is oxidized along with the previously deposited α-Si as described above during the subsequent step as shown in FIG. 33D.

FIG. 34 shows schematically a standard oxide ablation process using a laser beam with pulse width in the range of a few picoseconds. It can be seen that the interface being acted upon by the laser is the surface of the silicon substrate that may be damaged if the correct pulse energy is not used. FIG. 35 shows the scheme where a very thin amorphous silicon layer is deposited after the deposition of a very thin USG layer. As shown in FIG. 35B, the interface for laser action is the BSG/amorphous silicon interface. This interface acts as an ablation stopping layer and shields the crystalline silicon surface from laser irradiation thereby preventing or suppressing any possible crystalline silicon surface damage, resulting in higher cell efficiency.

The complete stack USG/α-Si/BSG/USG may be deposited in situ using APCVD for solar cell fabrication. The APCVD equipment may be high-productivity in-line APCVD equipment with multiple sequential in-line deposition zones to enable deposition of the entire stack in a single piece of APCVD equipment. Using APCVD equipment, the thin undoped silicon layer may be deposited in one of the APCVD deposition zones (the second zone after deposition of the initial USG layer) using e.g. silane and argon (or silane and nitrogen) at a temperature of less than approximately 500° C. Alternatively, it can be deposited using a PECVD technique. A wide range of thicknesses of thin USG and thin α-Si can be used based upon the particular process flow. Typically, the USG in contact with the crystalline silicon surface may be in the range of 3 nm to 100 nm, while the amorphous silicon layer may be in the range of 3 nm to 30 nm. However, as mentioned above, thicknesses outside of these ranges will also work if the rest of the process flow is changed to accommodate the thickness of these films.

The same scheme can also be used, if so desired, to open oxide layer for base regions that will be subjected to phosphorous doping to form N$^+$ layer. In that case the process flow is modified to ensure oxidation of this α-Si layer.

According to another aspect of the present disclosure laser doping is used to form the front surface field (FSF). The use of surface fields away from the p/n junction to reduce minority carrier recombination losses and to increase electrical current collection in the solar cell is well known. While doping a substrate with polarity opposite to the substrate is used to create the electrical p/n junction, the remaining surface of silicon can be doped with the same polarity of dopant as the substrate but to a higher concentration. This creates a built-in electric field due to the doping concentration gradient that 'repels' the minority carriers away from the base contact (or from the surface states) so that they can be gainfully collected at the emitter contact. This field is advantageously used on the front surface of the back junction, back contact solar cells where the p/n junction is on the back of the wafer. This front surface field increases the current collection at the emitter contacts on the back surface of the solar cell. This is achieved by suppressing the loss of minority carriers at the front surface recombination sites (e.g., surface states at the front-surface passivation layer/silicon interface).

The front surface field (FSF) is generated on a textured crystalline (mono-crystalline in some embodiments) semiconductor (silicon in some embodiments) front surface of back-junction, back-contact solar cells using unique pulsed laser doping techniques that involve using passivation layers such as silicon nitride containing the desired polarity of dopant (e.g., phosphorus FSF for n-type base and boron FSF for p-type base). In this case the front side of the silicon needs to be heated to a temperature high enough for dopant diffusion in the semiconductor layer and dopant activation. Again, with the proper choice of laser parameters such as the pulse length and wavelength the front surface of the semiconductor is selectively heated to the desired temperature without appreciable heating of the solar cell bulk or backside (or with at least reduced heating). See FIG. 36. This enables the use of heat sensitive backplane for supporting thin silicon films.

Alternatively, this disclosure involves depositing a thin (e.g., 2 nm to 20 nm) amorphous silicon layer (or alternatively a sub-stoichiometric silicon-rich silicon oxide layer or a sub-stoichiometric silicon-rich silicon nitride layer) containing the desired dopant underneath the main passivation and ARC layer such as PECVD silicon nitride, and subsequently laser doping the solar cell frontside to selectively cause the silicon surface to be doped. Again, the temperature of the laser doping needs to be high enough to cause diffusion of dopant in silicon and electrical activation of the dopant. The amorphous silicon epitaxially crystallizes on the single crystal silicon upon cooling. This also results in the quality of the frontside surface passivation to be substantially improved (both through effective heating and activation of the passivation layer and a substantial reduction of the surface state density and a substantial reduction of the frontside surface recombination velocity, as well as through formation of a thin FSF layer). See FIG. 37. Also, as mentioned above, with proper selection of laser parameters the heat penetration to the backside may be prevented so that the heat sensitive backplane can be used for supporting the thin silicon film.

The techniques of this disclosure can also be used to form emitter and BSF in front contact cells. The BSF is used on the back surface of the front-contact solar cells that increases the current collection by repelling the minority carriers to the front of the cell (or alternatively to the collecting emitter contacts on the backside of a back-contact solar cell) where they are collected by the emitter contacts.

In some embodiments, heating of the opposite side of the solar cell is limited to a temperature of less than 500° C., and in some embodiments to a temperature of less than 150° C.

For these pulsed laser doping applications, laser pulse length should be long enough so that there is no non-linear optical interaction with SiN so that SiN ARC and passivation properties are not degraded. Lasers with pulse length >1 nanosecond to microseconds or even CW (continuous wave) may be suitable for this application. Some embodiments of this disclosure use pulsed laser source with pulse length in the range of over 10 nanoseconds to several microseconds; some embodiments use a range of about 100 nanoseconds to 5 microseconds. The wavelength should be chosen based upon the depth of silicon that is required to be doped. In case the silicon film is supported on a heat sensitive backplane, there is the additional requirement that the heat be limited to the front side of the solar cell. To limit the heated zone to stay close to the surface being irradiated with the laser and still dope it sufficiently, a green wavelength may be more suitable, although NIR (near infrared) wavelength will also work for these applications. It should be clear that based on the desired application a range of laser pulse lengths and wavelengths are suitable and may be utilized as various embodiments of this disclosure.

Besides SiN doped with phosphorous, a stack of SiN on amorphous silicon (α-Si), or alternatively a stack of SiN on either Si-rich $SiO_x$ or Si-rich $SiN_x$, can also be used for silicon surface passivation. In this case the amorphous silicon layer (or the Si-rich $SiO_x$ or $SiN_x$ layer) is doped in situ during the layer deposition (e.g., by PECVD) with the desired amount of phosphorous. Laser annealing of phosphorous-doped, α-Si (or Si-rich $SiO_x$ or $SiN_x$) films covered with hydrogenated SiN causes doping of silicon with phosphorus, concurrently with improving the passivation of silicon surface with the hydrogen in PECVD SiN. The process sequence is schematically shown in FIG. 37, which depicts FSF formation using a phosphorus-doped α-Si underlayer. Alternatively, a doped Si-rich $SiO_x$ or $SiN_x$ underlayer may be used.

The laser doping technique can be used to form FSF using phosphorous doped glass (for n-type base), and boron doped glass (for p-type base) for thin crystalline semiconductor films supported on heat sensitive backplanes where the heat is to be restricted to the front surface using the proper choice of laser wavelength and pulselength.

This process using pulsed laser doping is useful in applications where the entire solar cell substrate and/or the opposite surface of the solar cell (i.e., the solar cell backside in the case of frontside passivation improvement and FSF formation) cannot be subjected to conventional high temperature doping process, since the thin back-contact cells with backplane may not withstand high temperature after attachment of the thin cell to the backplane.

This technique also provides FSF for epitaxial films where in-situ growth of FSF during epitaxial deposition is not useful as the doped surface will be lost during texturing. This is the case for NBLAC cells.

The technique is described for application to NBLAC cells that have n-type base substrate. For p-type base substrate amorphous silicon films containing boron can be used to form the FSF.

The technique can also be used to form emitter using phosphorous containing oxide films (PSG) or boron containing oxide (BSG) for p-type and n-type substrates, respectively.

The non-contact pulsed laser doping process is highly suitable for back-contact solar cells that use epitaxial films of thickness below approximately 80 microns that are fragile to handle. The laser doping process is also an attractive alternative to furnace doping as it can be an in-line cost effective process.

According to another aspect of this disclosure, laser annealing is used to dope a silicon substrate with aluminum in selected areas, thereby providing acceptor-rich $p^+$ doped regions for crystalline silicon solar cells. This technique is especially advantageous for IBC cells, where emitter contacts can be selectively doped with aluminum by selectively laser annealing the emitter contacts in contact with the deposited aluminum layer. The same scheme can be applied to achieve selective emitters in rear junction front contacted cells using n-type silicon as the base. Other applications of this technique include providing back-surface field for front contacted solar cells using p-type substrates (or p-type base).

This disclosure includes a laser process that can provide highly doped selective emitter contacts in these and other back-contacted cells with interdigitated metallization.

The doping of silicon with aluminum to obtain acceptor rich ($p^+$ or $p^{++}$) regions is well known in the solar cell manufacturing technology. For standard front contacted cells using p-type silicon, the back surface of the cell is screen printed with an aluminum paste. Upon firing anneal to a suitably high temperature, aluminum dissolves the silicon layer in contact. Upon cooling, an aluminum-rich silicon layer is precipitated that is highly p-type ($p^+$) since aluminum acts as an acceptor or p-type dopant in silicon. This highly p-type doped $p^{++}$ surface layer acts as a back surface field to deflect minority carriers away from the back surface to the front where they are collected by the emitter contact. This increases the current output ($J_{SC}$) and efficiency of the solar cell. Also, the Al/Si contact resistance is reduced, thereby improving the fill factor, again resulting in further increase in the solar cell conversion efficiency.

Figures 38A, 38B:
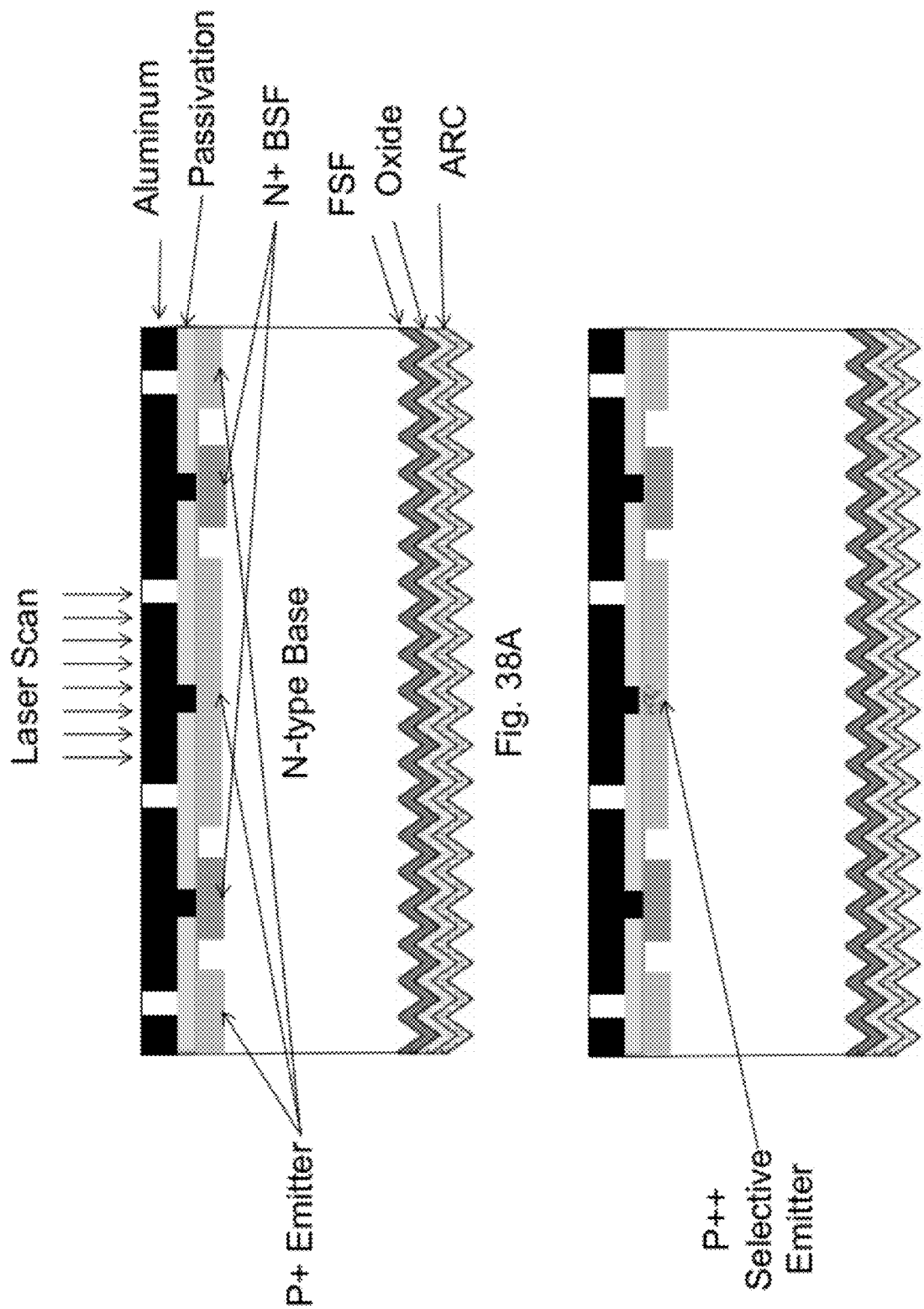
FIGS. 38A and 38B show a schematic of selectively laser scanning of metal on emitter regions and formation of selective emitter thereby, respectively.

FIGS. 38A and 38B show schematically the disclosed laser scanning scheme. In FIG. 38A is shown a laser beam of appropriate size and intensity that is used to scan the emitter regions only, thereby heating the aluminum that is in contact with the emitter via the contacts opened in the dielectric, and FIG. 38B shows the selective emitter formation after laser scanning If the metal and silicon in contact with the metal are heated to a temperature above 577° C., the eutectic temperature for Al—Si, aluminum dissolves silicon, and on cooling below this temperature, an Al-rich silicon layer precipitates out. This layer deposits on the silicon substrates epitaxially so that there no crystal defects. This is the same mechanism that is providing the Al-BSF in the standard Al paste printed cells.

Figure 39:
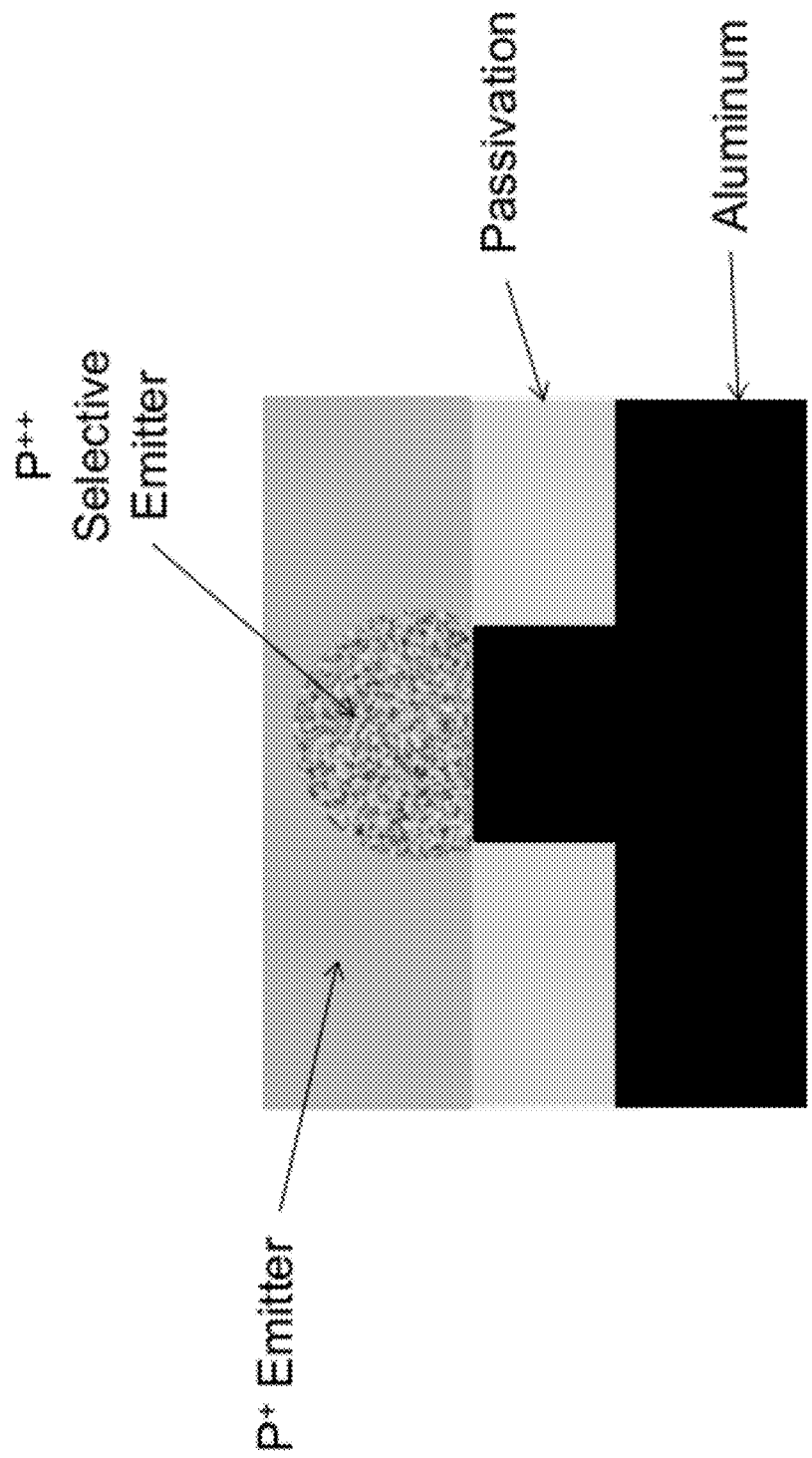
FIG. 39 shows a $P^{++}$ selective emitter.

FIG. 39 shows a $P^{++}$ selective emitter with aluminum-saturated silicon formed by selectively laser scanning on the emitter regions only.

Figure 40:
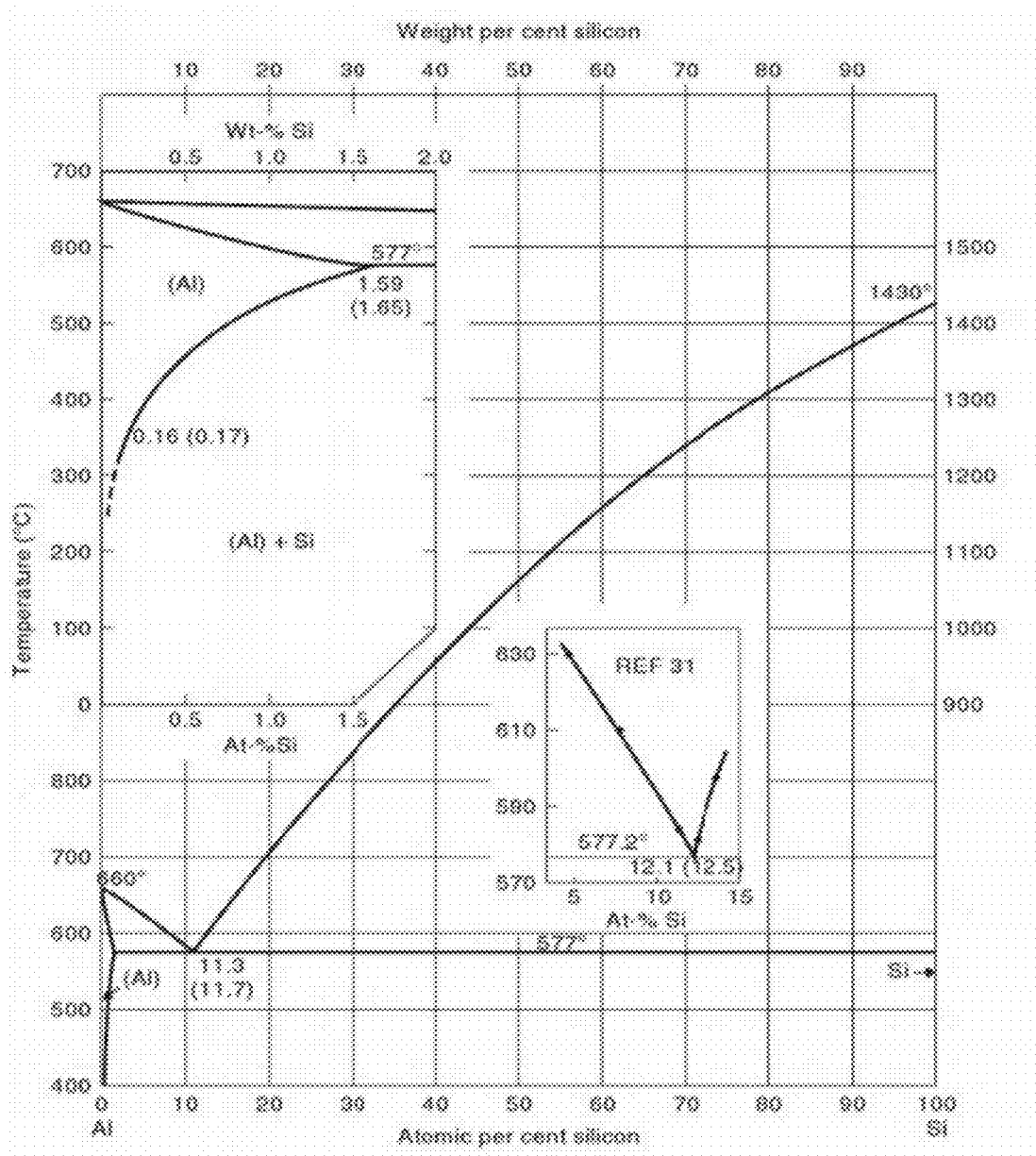
FIG. 40 shows an aluminum-silicon phase diagram.

The mechanism of formation of the Al-rich silicon layer can be understood with the help of the Al—Si phase diagram shown in FIG. 40. The eutectic at 577 C° is aluminum with 12.6% silicon dissolved in it. At higher temperatures, increasingly more silicon is dissolved. Upon cooling, the silicon that is epitaxially deposited is saturated with Al, up to 1.6%. This Al-saturated silicon is highly $P^{++}$ doped, and provides low-resistance contacts to the emitter while suppressing minority carrier absorption in this region (providing selective BSF in the contact regions).

Figure 41:
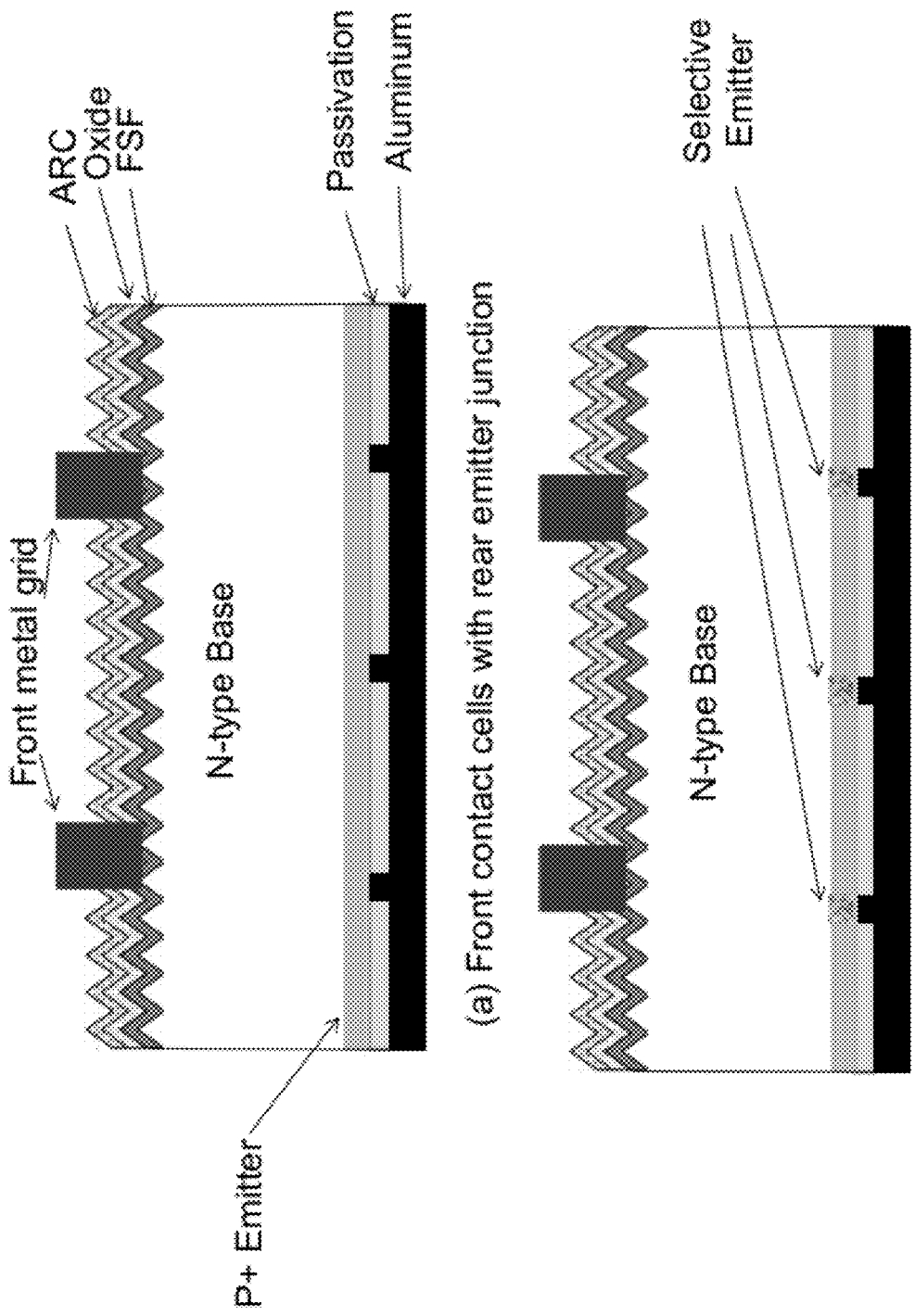
FIG. 41 shows selective emitters in front contacted cells.

It is clear to see that the same scheme can be used to obtain selective emitters in front contacted cells that use n-type silicon substrate and have $p^+$ rear emitters. The scheme can be understood by following the diagrams in FIG. 41.

As is well known, significant efficiency improvement is obtained for the standard front contacted cells using p-type silicon base when the full surface aluminum contact of the base on the back side is replaced with localized contacts. The efficiency is further increased when the localized contacts are provided with BSF regions. The scheme of laser scanning described can be used to provide the Al BSF, as shown in FIG. 42. This mechanism has been described above.

Those with ordinary skill in the art will recognize that the disclosed embodiments have relevance to a wide variety of areas in addition to those specific examples described above.

The foregoing description of the exemplary embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

It is intended that all such additional systems, methods, features, and advantages that are included within this description be within the scope of the claims.

What is claimed is:

1. A method of ablating an electrically insulating layer on a semiconductor substrate, said method comprising:
providing a semiconductor substrate having n-type doping;
depositing a first relatively thin layer of undoped glass or undoped oxide on a surface of said semiconductor substrate;
depositing a first relatively thin semiconductor layer comprising a substance chosen from the group consisting of amorphous semiconductor, nanocrystalline semiconductor, microcrystalline semiconductor, and polycrystalline semiconductor on said relatively thin layer of undoped glass or undoped oxide;
depositing a layer of borosilicate glass or a borosilicate/undoped glass stack on said relatively thin semiconductor layer;
selectively ablating said layer of borosilicate glass or borosilicate/undoped glass stack with a pulsed laser, said relatively thin semiconductor layer substantially protecting said semiconductor substrate from said pulsed laser;
depositing a second relatively thin layer of undoped glass or undoped oxide on said surface of said semiconductor substrate;
depositing a second relatively thin semiconductor layer comprising a substance chosen from the group consisting of amorphous semiconductor, nanocrystalline semiconductor, microcrystalline semiconductor, and polycrystalline semiconductor on said relatively thin layer of undoped glass or undoped oxide;
depositing a layer of undoped glass or undoped oxide on said second relatively thin semiconductor layer; and
selectively ablating said layer of undoped glass or undoped oxide with a pulsed laser, said second relatively thin semiconductor layer substantially protecting said semiconductor substrate from said pulsed laser.

2. The method of claim 1, further comprising a subsequent thermal oxidation process to oxidize said relatively thin semiconductor layer.

3. The method of claim 1, wherein said semiconductor comprises silicon.

4. The method of claim 1, wherein said first relatively thin layer of undoped glass or undoped oxide has a thickness approximately in the range of 3 to 100 nanometers.

5. The method of claim 1, wherein said first relatively thin semiconductor layer has a thickness approximately in the range of 3 to 30 nanometers.

6. The method of claim 1, further comprising a subsequent thermal oxidation process to oxidize said relatively thin semiconductor layer.

7. The method of claim 1, wherein said semiconductor substrate comprises silicon.

8. The method of claim 1, wherein said relatively thin layer of undoped glass or undoped oxide has a thickness approximately in the range of 3 to 100 nanometers.

9. The method of claim 1, wherein said relatively thin semiconductor layer has a thickness approximately in the range of 3 to 30 nanometers.

10. The method of claim 1, wherein said laser has a pulse length of approximately 200 picoseconds or less and a wavelength of approximately 1064 nanometers or less.

11. The method of claim 1, wherein said ablations are used to make openings to delineate base and emitter regions of an all back contact, back junction solar cell.

12. The method of claim 1, further comprising process flow steps for making a thin monocrystalline semiconductor solar cell.

13. The method of claim 12, wherein said thin monocrystalline semiconductor solar cell comprises a thin monocrystalline silicon layer in the thickness range of 10 to 100 microns.

14. The method of claim 12, wherein said thin monocrystalline semiconductor solar cell comprises a back-contact/back-junction solar cell.

15. The method of claim 1, wherein said crystalline semiconductor based photovoltaic solar cell comprises an epitaxial silicon thin film substrate.

16. The method of claim 15, wherein said epitaxial thin film substrate has a thickness in the range of approximately 10 to 100 microns.

17. The method of claim 15, wherein said epitaxial thin film comprises a substantially planar epitaxial film formed via an epitaxial silicon liftoff process.

18. The method of claim 15, wherein a front surface of said epitaxial thin film comprises three-dimensional pyramids or prisms formed via a textured template liftoff process.

19. The method of claim 1, further comprising process flow steps for making a crystalline semiconductor based photovoltaic solar cell comprising an all-back-contact back-junction solar cell.

20. The method of claim 19, wherein said crystalline semiconductor based photovoltaic solar cell comprises an epitaxial silicon thin film substrate.

21. The method of claim 20, wherein said epitaxial thin film substrate has a thickness in the range of approximately 10 to 100 microns.

22. The method of claim 20, wherein said epitaxial thin film comprises a substantially planar epitaxial film formed via an epitaxial silicon liftoff process.

23. The method of claim 20, wherein a front surface of said epitaxial thin film comprises three-dimensional pyramids or prisms formed via a textured template liftoff process.

* * * * *